(12) United States Patent
Koyama et al.

(10) Patent No.: US 9,368,519 B2
(45) Date of Patent: Jun. 14, 2016

(54) SEMICONDUCTOR DEVICE AND ELECTRONIC APPLIANCE

(71) Applicant: Semiconductor Energy Laboratory Co., Ltd., Atsugi-shi, Kanagawa-ken (JP)

(72) Inventors: Jun Koyama, Kanagawa (JP); Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/522,817

(22) Filed: Oct. 24, 2014

(65) Prior Publication Data

US 2015/0041807 A1 Feb. 12, 2015

Related U.S. Application Data

(63) Continuation of application No. 14/147,647, filed on Jan. 6, 2014, now Pat. No. 8,872,572, which is a continuation of application No. 13/921,401, filed on Jun. 19, 2013, now Pat. No. 8,624,656, which is a continuation of application No. 12/879,610, filed on Sep. 10, 2010, now Pat. No. 8,471,620.

(30) Foreign Application Priority Data

Sep. 16, 2009 (JP) .................................. 2009-214848

(51) Int. Cl.
*H03L 5/00* (2006.01)
*H01L 27/12* (2006.01)
(Continued)

(52) U.S. Cl.
CPC ............ *H01L 27/124* (2013.01); *H03K 17/687* (2013.01); *H03K 19/0013* (2013.01); *H03K 19/018571* (2013.01)

(58) Field of Classification Search
None
See application file for complete search history.

(56) References Cited

U.S. PATENT DOCUMENTS 5,568,084 A 10/1996 McClure et al.
5,581,209 A 12/1996 McClure
(Continued)

FOREIGN PATENT DOCUMENTS

CN 001674084 A 9/2005
CN 001705042 A 12/2005
(Continued)

OTHER PUBLICATIONS

Chinese Office Action (Application No. 201010286279.6) Dated Dec. 23, 2013.
(Continued)

*Primary Examiner* — Lincoln Donovan
*Assistant Examiner* — Khareem E Almo
(74) *Attorney, Agent, or Firm* — Fish & Richardson P.C.

(57) ABSTRACT

The amplitude voltage of a signal input to a level shifter can be increased and then output by the level shifter circuit. Specifically, the amplitude voltage of the signal input to the level shifter can be increased to be output. This decreases the amplitude voltage of a circuit (a shift register circuit, a decoder circuit, or the like) which outputs the signal input to the level shifter. Consequently, power consumption of the circuit can be reduced. Alternatively, a voltage applied to a transistor included in the circuit can be reduced. This can suppress degradation of the transistor or damage to the transistor.

56 Claims, 23 Drawing Sheets

(51) Int. Cl.
*H03K 19/00* (2006.01)
*H03K 19/0185* (2006.01)
*H03K 17/687* (2006.01)

(56) References Cited

U.S. PATENT DOCUMENTS

| | | | |
|---|---|---|---|
| 5,640,122 A | 6/1997 | McClure | |
| 5,654,663 A | 8/1997 | McClure et al. | |
| 5,793,247 A | 8/1998 | McClure | |
| 5,949,271 A | 9/1999 | Fujikura | |
| 6,046,621 A | 4/2000 | Crowley | |
| 6,268,755 B1 * | 7/2001 | Summerlin et al. | 327/333 |
| 6,845,140 B2 | 1/2005 | Moon et al. | |
| 6,975,142 B2 | 12/2005 | Azami et al. | |
| 7,030,678 B1 | 4/2006 | Burinskiy et al. | |
| 7,224,200 B2 | 5/2007 | Kida et al. | |
| 7,324,123 B2 | 1/2008 | Yamazaki et al. | |
| 7,372,445 B2 | 5/2008 | Takahashi et al. | |
| 7,439,790 B2 | 10/2008 | Chen | |
| 7,443,202 B2 | 10/2008 | Kimura et al. | |
| 7,477,226 B2 | 1/2009 | Kim et al. | |
| 7,511,709 B2 | 3/2009 | Koyama et al. | |
| 7,586,478 B2 | 9/2009 | Azami et al. | |
| 7,674,650 B2 | 3/2010 | Akimoto et al. | |
| 7,696,974 B2 | 4/2010 | Moon et al. | |
| 7,859,510 B2 | 12/2010 | Umezaki | |
| 7,978,274 B2 | 7/2011 | Umezaki et al. | |
| 8,054,279 B2 | 11/2011 | Umezaki et al. | |
| 8,456,396 B2 | 6/2013 | Umezaki | |
| 8,462,100 B2 | 6/2013 | Umezaki | |
| 8,520,159 B2 | 8/2013 | Umezaki et al. | |
| 8,643,586 B2 | 2/2014 | Umezaki | |
| 8,743,044 B2 | 6/2014 | Umezaki et al. | |
| 8,902,145 B2 | 12/2014 | Umezaki et al. | |
| 8,908,115 B2 | 12/2014 | Umezaki et al. | |
| 9,184,183 B2 | 11/2015 | Umezaki | |
| 2004/0164978 A1 | 8/2004 | Shin et al. | |
| 2005/0264514 A1 | 12/2005 | Kim et al. | |
| 2005/0270080 A1 | 12/2005 | Kida et al. | |
| 2006/0244391 A1 | 11/2006 | Shishido et al. | |
| 2006/0244699 A1 | 11/2006 | Yamazaki | |
| 2007/0063759 A1 | 3/2007 | Kida et al. | |
| 2007/0296660 A1 | 12/2007 | Kimura et al. | |
| 2008/0007316 A1 | 1/2008 | Chen | |
| 2008/0011861 A1 | 1/2008 | Ikeda et al. | |
| 2008/0062112 A1 | 3/2008 | Umezaki | |
| 2008/0079001 A1 | 4/2008 | Umezaki et al. | |
| 2009/0002590 A1 | 1/2009 | Kimura | |
| 2009/0027083 A1 | 1/2009 | Kimura et al. | |
| 2009/0322716 A1 | 12/2009 | Azami et al. | |
| 2010/0134708 A1 | 6/2010 | Kimura et al. | |
| 2010/0163874 A1 | 7/2010 | Koyama et al. | |
| 2012/0049184 A1 | 3/2012 | Umezaki et al. | |
| 2014/0145187 A1 | 5/2014 | Umezaki | |
| 2015/0077676 A1 | 3/2015 | Umezaki et al. | |
| 2015/0137118 A1 | 5/2015 | Umezaki et al. | |

FOREIGN PATENT DOCUMENTS

| | | |
|---|---|---|
| CN | 101135791 A | 3/2008 |
| CN | 101154342 A | 4/2008 |
| CN | 101154343 A | 4/2008 |
| EP | 0717334 A | 6/1996 |
| EP | 0718744 A | 6/1996 |
| EP | 0731403 A | 9/1996 |
| EP | 0747800 A | 12/1996 |
| EP | 1895545 A | 3/2008 |
| EP | 1906414 A | 4/2008 |
| JP | 2003-347926 A | 12/2003 |
| JP | 2004-078172 A | 3/2004 |
| JP | 2008-083692 A | 4/2008 |
| JP | 2008-089915 A | 4/2008 |
| JP | 2008-107807 A | 5/2008 |
| KR | 2008-0029807 A | 4/2008 |
| TW | 200408859 | 6/2004 |
| TW | 200805888 | 1/2008 |

OTHER PUBLICATIONS

Taiwanese Office Action (Application No. 099131258) Dated Jun. 10, 2015.

Chinese Office Action (Application No. 201410460981.8) Dated Dec. 31, 2015.

* cited by examiner

1st operation

2nd operation

3rd operation

4th operation

SEMICONDUCTOR DEVICE AND ELECTRONIC APPLIANCE

CROSS-REFERENCE TO RELATED APPLICATIONS

This application is a continuation of U.S. application Ser. No. 14/147,647, filed Jan. 6, 2014, now allowed, which is a continuation of U.S. application Ser. No. 13/921,401, filed Jun. 19, 2013, now U.S. Pat. No. 8,624,656, which is a continuation of U.S. application Ser. No. 12/879,610, filed Sep. 10, 2010, now U.S. Pat. No. 8,471,620, which claims the benefit of a foreign priority application filed in Japan as Serial No. 2009-214848 on Sep. 16, 2009, all of which are incorporated by reference.

BACKGROUND OF THE INVENTION

1. Field of the Invention

The present invention relates to a semiconductor device and a driving method thereof. In particular, the present invention relates to a semiconductor device, a display device, a liquid crystal display device, or a light-emitting device which includes a driver circuit formed over a substrate over which a pixel portion is formed; or the driving method thereof. Alternatively, the present invention relates to an electronic appliance including the semiconductor device, the display device, the liquid crystal display device, or the light-emitting device.

2. Description of the Related Art

In recent years, large display devices such as liquid crystal televisions have been actively developed. In particular, a technique to form, using a transistor including a non-single-crystal semiconductor, a driver circuit such as a gate driver circuit over a substrate over which a pixel portion is formed has actively developed because the technique greatly contributes to the reduction in manufacturing cost and the improvement in reliability (see Patent Document 1 for example).

REFERENCE

[Patent Document 1] Japanese Published Patent Application No. 2004-78172

SUMMARY OF THE INVENTION

However, the amplitude voltage of a clock signal input to a shift register operates at the same amplitude as a gate signal (also referred to as a scan signal or a selection signal) output to, in the case of a scan line driver circuit, a scan line. The amplitude voltage of a clock signal needs to be low for the low power consumption of a driver circuit.

In view of the above problem, an object of one embodiment of the present invention is to reduce the drive voltage of a driver circuit and achieve the low power consumption of the driver circuit.

One embodiment of the present invention is a semiconductor device including a first transistor, a second transistor, a third transistor, a fourth transistor, a fifth transistor, and a sixth transistor. A first terminal of the first transistor is electrically connected to a first wiring. A second terminal of the first transistor is electrically connected to a second wiring. A first terminal of the second transistor is electrically connected to a third wiring. A second terminal of the second transistor is electrically connected to the second wiring. A first terminal of the third transistor is electrically connected to the first wiring. A second terminal of the third transistor is electrically connected to a gate of the first transistor. A gate of the third transistor is electrically connected to a fourth wiring. A first terminal of the fourth transistor is electrically connected to the third wiring. A second terminal of the fourth transistor is electrically connected to the gate of the first transistor. A gate of the fourth transistor is electrically connected to a gate of the second transistor. A first terminal of the fifth transistor is electrically connected to a fifth wiring. A second terminal of the fifth transistor is electrically connected to the gate of the second transistor. A gate of the fifth transistor is electrically connected to a sixth wiring. A first terminal of the sixth transistor is electrically connected to the third wiring. A second terminal of the sixth transistor is electrically connected to the gate of the second transistor. A gate of the sixth transistor is electrically connected to the fourth wiring.

One embodiment of the present invention can be a semiconductor device in which a first signal is input to the fourth wiring, a second signal is output from the second wiring, and the amplitude voltage of the second signal is higher than that of the first signal.

One embodiment of the present invention can be a semiconductor device in which the first signal is a digital signal, the second signal is a digital signal, the second signal is high when the first signal is high, and the second signal is low when the first signal is low.

One embodiment of the present invention can be a semiconductor device in which the fourth wiring is electrically connected to a shift register circuit.

Note that size, the thickness of layers, or regions in the drawings are sometimes exaggerated for simplicity. Therefore, the present invention is not limited to such scales.

Note that the drawings are schematic views showing ideal examples, and the present invention is not limited to shape or value shown in the drawings. For example, the drawings can include the following: variations in shape due to a manufacturing technique or dimensional deviation; or variations in signal, voltage, or current due to noise or difference in timing.

Technical terms are often used in order to describe a specific embodiment or the like. Note that one embodiment of the present invention is not construed as being limited by the technical terms.

Note that terms which are not defined (including terms used for science and technology, such as technical terms or academic parlance) can be used as the terms which have meaning equal to general meaning that an ordinary person skilled in the art understands. It is preferable that terms defined by dictionaries or the like be construed as consistent meaning with the background of related art.

One embodiment of the present invention can reduce the drive voltage of a driver circuit and achieve low power consumption.

DETAILED DESCRIPTION OF THE INVENTION

Figure 1:
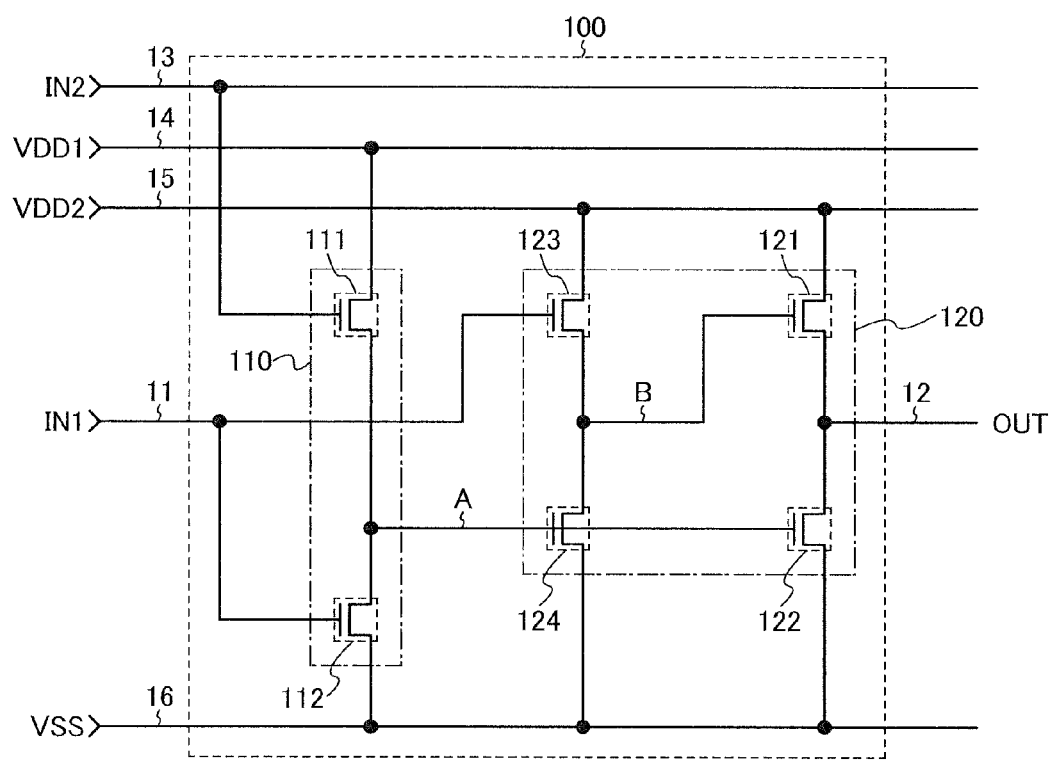
FIG. 1 shows an example of the circuit diagram of a semiconductor device in Embodiment 1.

Hereinafter, embodiments will be described with reference to drawings. However, the embodiments can be implemented with various modes. It will be readily appreciated by those skilled in the art that modes and details can be changed in various ways without departing from the spirit and scope of the present invention. Therefore, this invention is not interpreted as being limited to the description of the embodiments below. Note that in structures of the invention described below, the same portions or portions having similar functions are denoted by the same reference numerals, and description thereof is not repeated.

Note that what is described (or part thereof) in one embodiment can be applied to, combined with, or exchanged with another content in the same embodiment and/or what is described (or part thereof) in another embodiment or other embodiments.

Note that terms such as "first", "second", "third", and the like are used for distinguishing various elements, members, regions, layers, and areas from others. Therefore, the terms such as "first", "second", "third", and the like do not limit the number of the elements, members, regions, layers, areas, or the like. Further, for example, "first" can be replaced with "second", "third", or the like.

Embodiment 1

In this embodiment, an example of a semiconductor device and an example of the driving method of the semiconductor device will be described. In particular, an example of a level shifter circuit and an example of the driving method of the level shifter circuit will be described.

First, an example of a semiconductor device in this embodiment will be described.

FIG. 1 shows an example of a semiconductor device. A circuit 100 includes a circuit 110 and a circuit 120. The circuit 110 is connected to a wiring 11, a wiring 13, a wiring 14, a wiring 16, and a circuit 120. The circuit 120 is connected to the wiring 11, a wiring 12, a wiring 15, the wiring 16, and the circuit 110. However, one example of this embodiment is not limited to this. For example, the circuit 100, the circuit 110, and the circuit 120 can be connected to various wirings according to its configuration.

The circuit 110 includes a transistor 111 and a transistor 112. The circuit 120 includes a transistor 121, a transistor 122, a transistor 123, and a transistor 124. A first terminal of the transistor 121 is connected to the wiring 15. A second terminal of the transistor 121 is connected to the wiring 12. A first terminal of the transistor 122 is connected to the wiring 16. A second terminal of the transistor 122 is connected to the wiring 12. A first terminal of the transistor 123 is connected to the wiring 15. A second terminal of the transistor 123 is connected to a gate of the transistor 121. A gate of the transistor 123 is connected to the wiring 11. A first terminal of the transistor 124 is connected to the wiring 16. A second terminal of the transistor 124 is connected to the gate of the transistor 121. A gate of the transistor 124 is connected to a gate of the transistor 122. A first terminal of the transistor 111 is connected to the wiring 14. A second terminal of the transistor 111 is connected to the gate of the transistor 122. A gate of the transistor 111 is connected to the wiring 13. A first terminal of the transistor 112 is connected to the wiring 16. A second terminal of the transistor 112 is connected to the gate of the transistor 122. A gate of the transistor 112 is connected to the wiring 11.

Note that the connecting point of the second terminal of the transistor 111, the second terminal of the transistor 112, the gate of the transistor 122, and the gate of the transistor 124 is referred to as a node A. The connecting point of the gate of the transistor 121, the second terminal of the transistor 123, and the second terminal of the transistor 124 is referred to as a node B.

Note that the transistor 111, the transistor 112, and the transistors 121 to 124 are re-channel transistors. N-channel transistors are turned on when a potential difference between the gate and the source gets higher than the threshold voltage. Thus, the semiconductor device in this embodiment can be formed using a transistor including an amorphous semiconductor, a microcrystalline semiconductor, an oxide semiconductor, an organic semiconductor, or the like. Preferably, the semiconductor device in this embodiment is formed using a transistor including an oxide semiconductor, in particular. This is because the mobility of the transistor can be increased by using an oxide semiconductor for a semiconductor layer. Thus, the semiconductor device in this embodiment can be easily applied to a high-resolution display device or a large display device. However, one example of this embodiment is not limited to this. For example, all of the transistor 111, the transistor 112, and the transistors 121 to 124 can be p-channel transistors. P-channel transistors are turned on when a potential difference between the gate and the source gets lower than the threshold voltage.

Note that a thin film transistor is an element having at least three terminals: a gate, a drain, and a source. In addition, a thin film transistor has a channel region between the drain (drain region or drain electrode) and the source (source region or source electrode) and can conduct current through the drain, the channel region, and the source. Here, the source and the drain of the transistor change depending on the structure, the operating condition, and the like of the transistor, and thus it is difficult to define which is a source or a drain. Therefore, a portion functioning as a source or a drain is not called a source or a drain in some cases. In that case, one of a source and a drain might be referred to as a first terminal, a first electrode, or a first region, and the other one of the source and the drain might be referred to as a second terminal, a second electrode, or a second region, for example.

Note that an explicit description "X and Y are connected" indicates the case where X and Y are electrically connected, the case where X and Y are connected in terms of the function, the case where X and Y are directly connected, or the like. Here, each of X and Y denotes an object (e.g., a device, an element, a circuit, a wiring, an electrode, a terminal, a conductive film, a layer, or the like). Therefore, such a description is not limited to a predetermined connection relation, e.g. connection relation shown in a drawing or text, and includes connection relation other than connection relation shown in a drawing or text.

A voltage VDD1 is input to the wiring 14. The voltage VDD1 has a constant value and has a higher value than the ground voltage. Therefore, the wiring 14 serves as a power supply line or a positive power supply line. A voltage VDD2 is input to the wiring 15. The voltage VDD2 has a constant value and has a higher value than the voltage VDD1. Therefore, the wiring 15 serves as a power supply line or a positive power supply line. A voltage VSS is input to the wiring 16. The voltage VSS has a constant value and has a lower value than the voltage VDD1. Therefore, the wiring 16 serves as a power supply line or a negative power supply line. However, one example of this embodiment is not limited to this. For example, a signal can be input to the wiring 14, the wiring 15 and/or the wiring 16. In such a case, the wiring 14, the wiring 15 and/or the wiring 16 can serve as a signal line. For another example, the voltage VSS can be approximately the same as the ground voltage. Therefore, the wiring 16 can serve as a ground line or a ground.

A signal IN1 is input to the wiring 11. The signal IN1 is a digital signal. In addition, the potential of the signal IN1 at a high level is approximately VDD1, and the potential of the signal IN1 at a low level is approximately VSS. Therefore, the wiring 11 serves as a signal line. A signal IN2 is input to the wiring 13. The signal IN2 is a digital signal. In addition, the potential of the signal IN2 at a high level is approximately VDD1, and the potential of the signal IN2 at a low level is approximately VSS. Therefore, the wiring 13 serves as a signal line. However, one example of this embodiment is not limited to this. For example, a voltage (e.g., the voltage VDD1 or the voltage VDD2) can be input to the wiring 13. Thus, the signal IN2 can be omitted, thereby reducing the number of signals and wirings and reducing power consumption.

A signal OUT is output from the wiring 12. The signal OUT is a digital signal and is the output signal of the circuit 100. In addition, the potential of the signal OUT at a high level is approximately VDD2, and the potential of the signal OUT at a low level is approximately VSS, that is, the amplitude voltage of the signal OUT is higher than that of the signal IN1. Therefore, the wiring 12 serves as a signal line.

Next, an example of the operation of the semiconductor device in this embodiment will be described.

Figure 2:
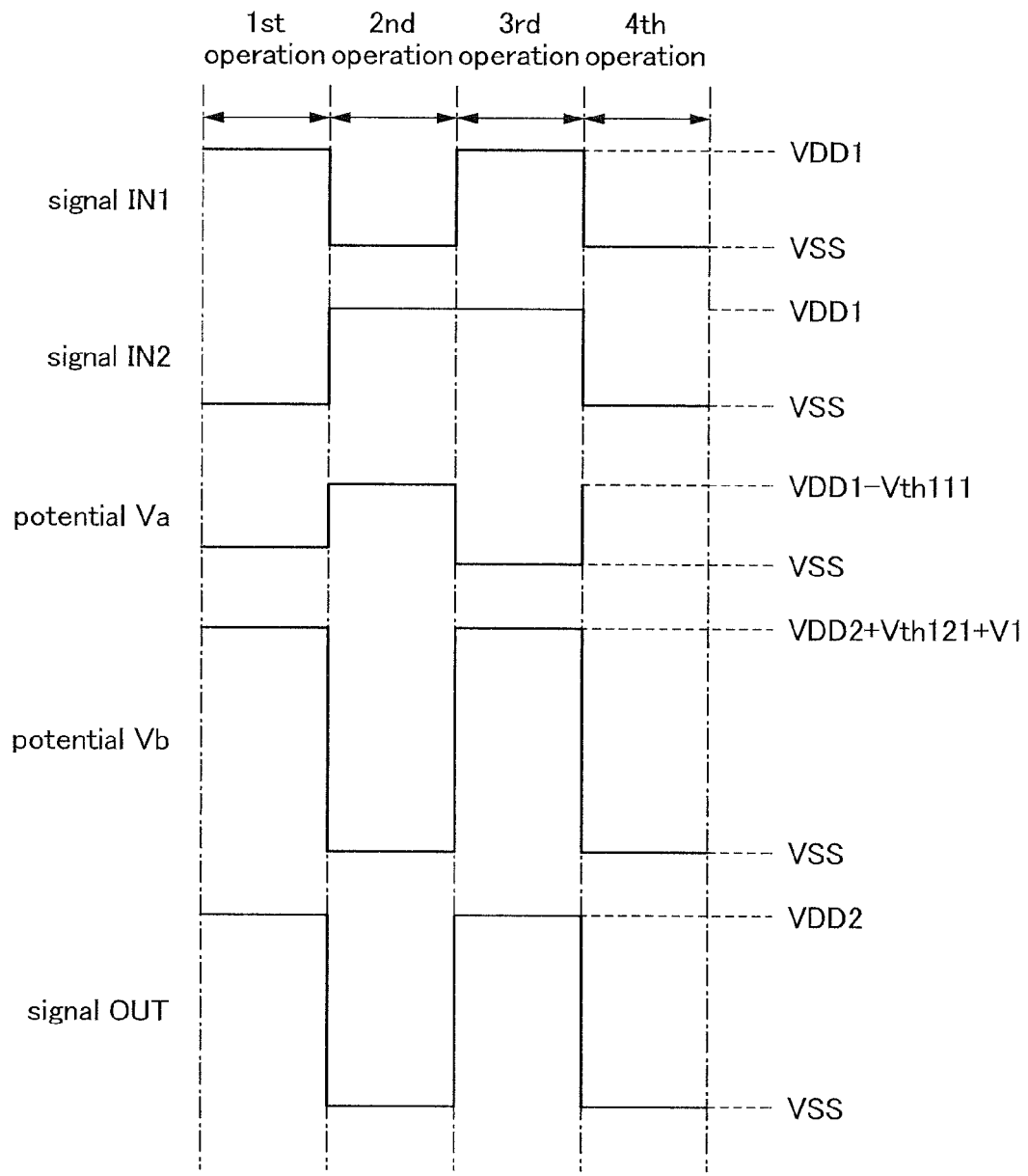
FIG. 2 is an example of the diagram showing the operation of the semiconductor device in Embodiment 1.

FIG. 2 is a diagram showing the operation of the semiconductor device in this embodiment. The semiconductor device in this embodiment can perform the first to fourth operations by combining the signal IN1 and the signal IN2 at a high level or low level. The first to fourth operations will be described. However, one example of this embodiment is not limited to this. For example, the semiconductor device in this embodiment can perform more operations by changing the potential of the wiring 14, the wiring 15 and/or the wiring 16.

Figure 3A:
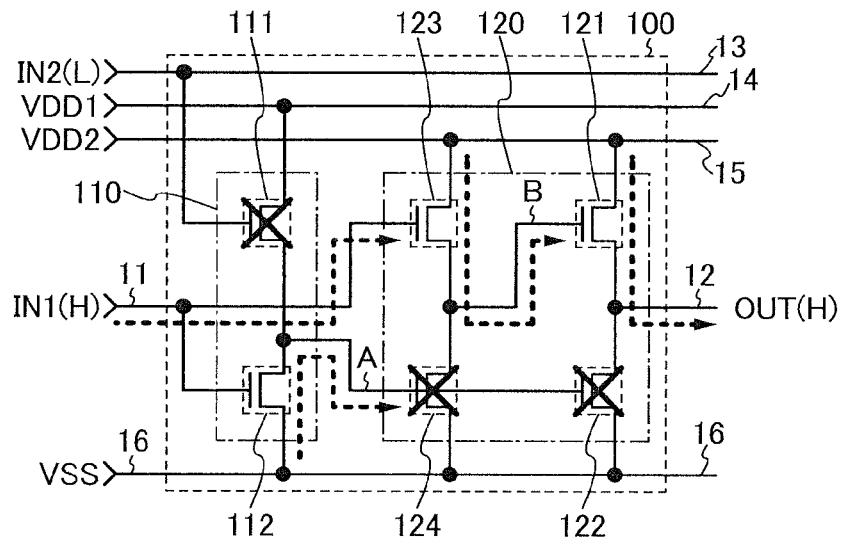
FIGS. 3A and 3B are each an example of the schematic view for describing the operation of the semiconductor device in Embodiment 1.

First, the first operation will be described (see FIG. 3A). In the first operation, the signal IN1 goes high and the signal IN2 goes low. Consequently, the transistor 111 is turned off and the transistor 112 is turned on, so that electrical continuity between the node A and the wiring 16 is established. Then, the potential of the wiring 16 (the voltage VSS) is supplied to the node A, and thus the potential of the node A (referred to as a potential Va) becomes approximately VSS. Consequently, the transistor 124 is turned off. At that time, the transistor 123 is turned on, so that electrical continuity between the node B and the wiring 15 is established. Then, the potential of the wiring 15 (e.g., the voltage VDD2) is supplied to the node B, and thus the potential of the node B (referred to as Vb) starts to increase. After that, the potential of the node B becomes VSS+Vth121 (Vth121: the threshold voltage of the transistor 121), and thus the transistor 121 is turned on. At that time, the transistor 122 is turned off, so that electrical continuity between the wiring 12 and the wiring 15 is established. Then, the potential of the wiring 15 (e.g., the voltage VDD2) is supplied to the wiring 12, and thus the potential of the wiring 12 (the signal OUT) starts to increase. After that, the potential of the node B and the potential of the wiring 12 keep further increasing. Then, the potential of the node B becomes a value obtained by subtracting the threshold voltage of the transistor 123 (Vth123) from the potential of the gate of the transistor 123 (the voltage VDD1). Then, the transistor 123 is turned off, so that electrical continuity between the wiring 15 and the node B is broken. Consequently, the node B becomes floating. At that time, the potential of the wiring 12 keeps increasing. Consequently, the potential of the node B further increases from VDD1−Vth123 because of parasitic capacitance which occurs between the gate and second terminal of the transistor 121. Then, the potential of the node B becomes VDD2+ Vth121+V1 (V1: a positive number). This is so-called a bootstrap operation. Consequently, the potential of the wiring 12 can increase to VDD2. Thus, the signal OUT goes high.

Figure 3B:
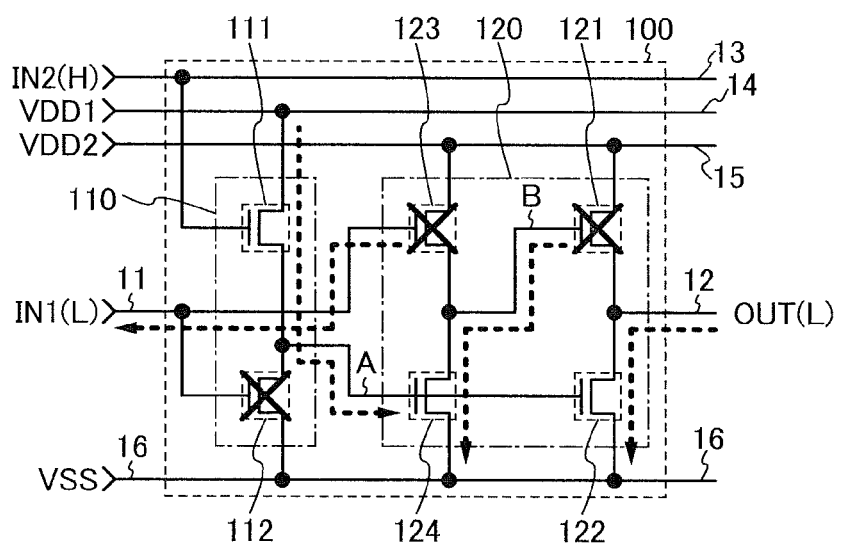

Second, the second operation will be described (see FIG. 3B). In the second operation, the signal IN1 goes low and the signal IN2 goes high. Consequently, the transistor 111 is turned on and the transistor 112 is turned off, so that electrical continuity between the node A and the wiring 14 is established. Then, the potential of the wiring 14 (the voltage VDD1) is supplied to the node A, and thus the potential of the node A increases. After that, the potential of the node A becomes a value (referred to as VDD1−Vth 111) obtained by subtracting the threshold voltage of the transistor 111 (Vth 111) from the potential of the gate of the transistor 111 (the signal IN2 at a high level). Then, the transistor 111 is turned off, so that electrical continuity between the wiring 14 and the node A is broken. Thus, the node A becomes floating, and thus the potential of the node A is kept approximately VDD1− Vth111. Consequently, the transistor 124 is turned on. At that time, the transistor 123 is turned off, so that electrical continuity between the node B and the wiring 16 is established.

Then, the potential of the wiring 16 (the voltage VSS) is supplied to the node B, and thus the potential of the node B becomes approximately VSS. Consequently, the transistor 121 is turned off. At that time, the transistor 122 is turned on, so that electrical continuity between the wiring 12 and the wiring 16 is established. Then, the potential of the wiring 16 (the voltage VSS) is supplied to the wiring 12, and thus the potential of the wiring 12 (the signal OUT) becomes approximately VSS. Thus, the signal OUT goes low.

Figure 4A:
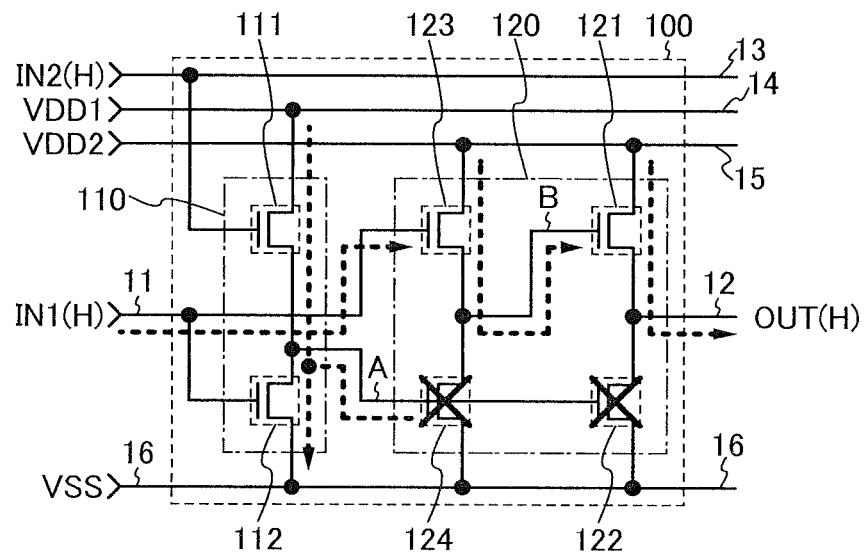
FIGS. 4A and 4B are each an example of the schematic view for describing the operation of the semiconductor device in Embodiment 1.

Next, the third operation will be described (see FIG. 4A). In the third operation, the signal IN1 goes high and the signal IN2 goes high. Consequently, the transistor 111 is turned on and the transistor 112 is turned on, so that electrical continuity between the node A and the wiring 14, and electrical continuity between the node A and the wiring 16 are established. Then, the potential of the wiring 14 (the voltage VDD1) and the potential of the wiring 16 (the voltage VSS) are supplied to the node A, and thus the potential of the node A becomes a value intermediate between VSS and VDD1. This potential of the node A is determined by the current capability of the transistor 111 and the current capability of the transistor 112. Here the current capability of the transistor 112 is higher than that of the transistor 111. Therefore, preferably, the potential of the node A is a value nearer to VSS than VDD1. More preferably, the potential of the node A is a value lower than VSS+Vth124 (Vth124: the threshold voltage of the transistor 124) or lower than VSS+Vth122 (Vth122: the threshold voltage of the transistor 122). Consequently, the transistor 124 is turned off. At that time, the transistor 123 is turned on, so that electrical continuity between the node B and the wiring 15 is established. Then, the potential of the wiring 15 (e.g., the voltage VDD2) is supplied to the node B, and thus the potential of the node B (which potential is referred to as Vb) starts to increase. After that, the potential of the node B becomes VSS+Vth121 (Vth121: the threshold voltage of the transistor 121), and thus the transistor 121 is turned on. At that time, the transistor 122 is turned off, so that electrical continuity between the wiring 12 and the wiring 15 is established. Then, the potential of the wiring 15 (e.g., the voltage VDD2) is supplied to the wiring 12, and thus the potential of the wiring 12 (the signal OUT) starts to increase. After that, the potential of the node B and the potential of the wiring 12 keep further increasing. Then, the potential of the node B becomes a value obtained by subtracting the threshold voltage of the transistor 123 (Vth 123) from the potential of the gate of the transistor 123 (the voltage VDD1). Then, the transistor 123 is turned off, so that electrical continuity between the wiring 15 and the node B is broken. Consequently, the node B becomes floating. At that time, the potential of the wiring 12 keeps increasing. Consequently, the potential of the node B further increases from VDD1−Vth123 because of parasitic capacitance which occurs between the gate and second terminal of the transistor 121. Then, the potential of the node B becomes VDD2+Vth121+V1 (V1: a positive number). This is so-called a bootstrap operation. Consequently, the potential of the wiring 12 can increase to VDD2. Thus, the signal OUT goes high.

Figure 4B:
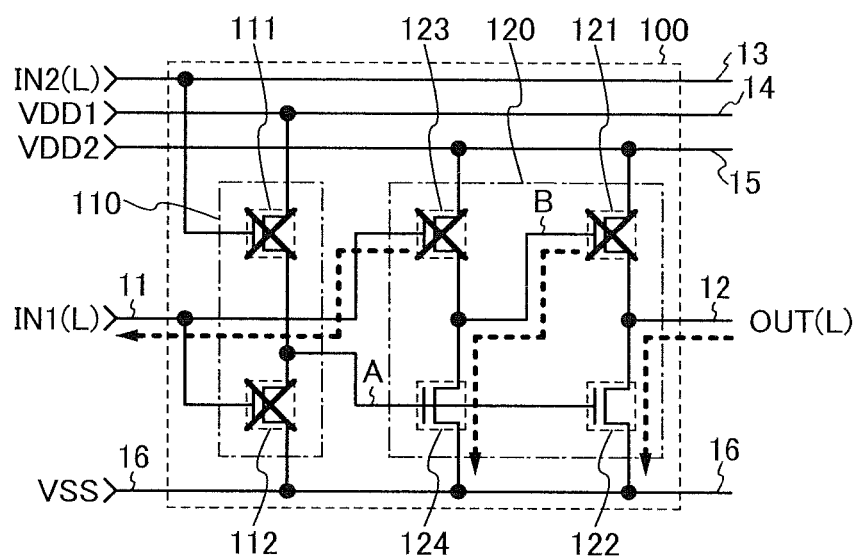

Next, the fourth operation will be described (see FIG. 4B). In the fourth operation, the signal IN1 goes low and the signal IN2 goes low. Consequently, the transistor 111 is turned off and the transistor 112 is turned off, so that the node A becomes floating. Then, the potential of the node A remains at the same state as in the operation prior to the fourth operation. For example, suppose that the semiconductor device performs the first operation or the third operation prior to the fourth operation. In this case, the potential of the node A becomes approximately VSS. Then, suppose that the semiconductor device performs the second operation prior to the fourth operation. In this case, the potential of the node A becomes approximately VDD1−Vth111. Here, the semiconductor device performs the second operation prior to the fourth operation. Consequently, the potential of the node A is thus maintained at approximately VDD1−Vth111. Consequently, the transistor 124 is turned on. At that time, the transistor 123 is turned off, so that electrical continuity between the node B and the wiring 16 is established. Then, the potential of the wiring 16 (the voltage VSS) is supplied to the node B, and thus the potential of the node B becomes approximately VSS. Consequently, the transistor 121 is turned off. At that time, the transistor 122 is turned on, so that electrical continuity between the wiring 12 and the wiring 16 is established. Then, the potential of the wiring 16 (the voltage VSS) is supplied to the wiring 12, and thus the potential of the wiring 12 (the signal OUT) becomes approximately VSS. Thus, the signal OUT goes low.

As described above, in the semiconductor device in this embodiment, the amplitude voltage of the signal IN1 can be increased to be output. Specifically, the amplitude voltage of the signal IN1 can be increased to be output. This decreases the amplitude voltage of a circuit (a shift register circuit, a decoder circuit, or the like) which outputs the signal IN1 to the semiconductor device in this embodiment. Consequently, the power consumption of the circuit can be reduced. Alternatively, a voltage applied to a transistor in the circuit can be reduced. This suppresses degradation of the transistor or damage to the transistor.

Alternatively, the timing of inverting the signal OUT can be approximately the same as the timing of inverting the signal IN1. Thus, the wiring 12 does not need to have an inverter circuit or the like. This achieves the reduction in power consumption, the reduction in circuit size, or the reduction in layout area.

Alternatively, in the first operation, when the signal IN1 is high, the signal IN2 goes low, thereby preventing flow-through current which occurs between the wiring 14 and the wiring 16. This reduces the power consumption.

Note that although the first to fourth operations have been described, the semiconductor device in this embodiment does not need to perform all the operations. The semiconductor device in this embodiment can select only a necessary operation from these operations and perform the selected operation.

Next, a structure of the semiconductor device in this embodiment, which structure is different from that in FIG. 1 will be described.

Figure 5A:
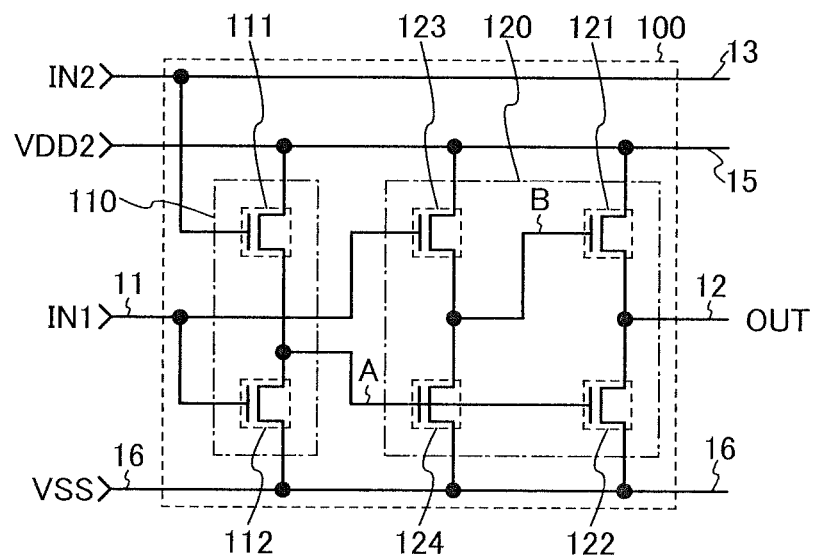
FIGS. 5A and 5B are each an example of the circuit diagram of the semiconductor device in Embodiment 1.
Figure 5B:
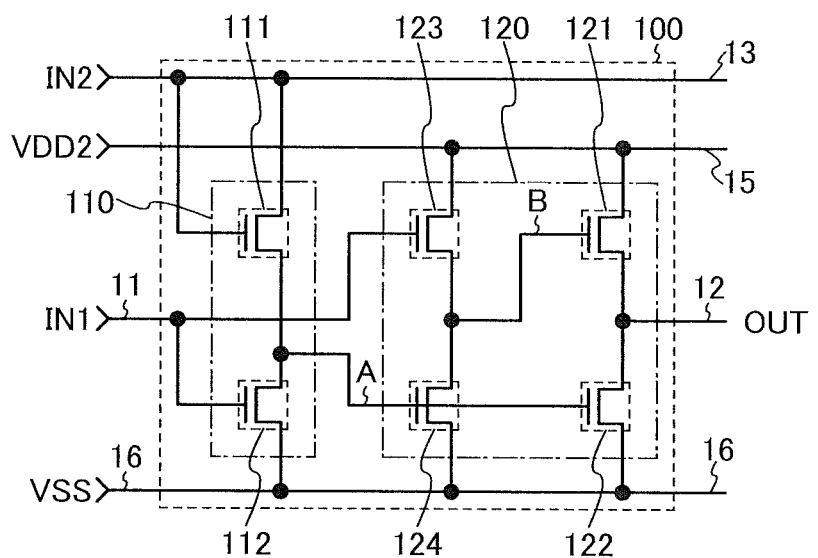

In the semiconductor device in FIG. 1, the first terminal of the transistor 111 can be connected to a wiring other than the wiring 14 as shown in FIGS. 5A and 5B. FIG. 5A shows an example of the semiconductor device in which the first terminal of the transistor 111 is connected to the wiring 15. In this structure, the voltage VDD1 can be omitted. Alternatively, a potential difference applied between the source and drain of the transistor 111 (Vds) can be increased; thus, the rise time of the potential of the node A can be shortened. FIG. 5B shows an example of the semiconductor device in which the first terminal of the transistor 111 is connected to the wiring 13. In this structure, the voltage VDD1 can be omitted. Alternatively, the transistor 111 can be reverse-biased, so that degradation of the transistor 111 can be suppressed. However, one example of this embodiment is not limited to this. For example, the first terminal of the transistor 111 can be connected to a wiring to which an inverted signal of the signal IN1 is input.

Figure 6A:
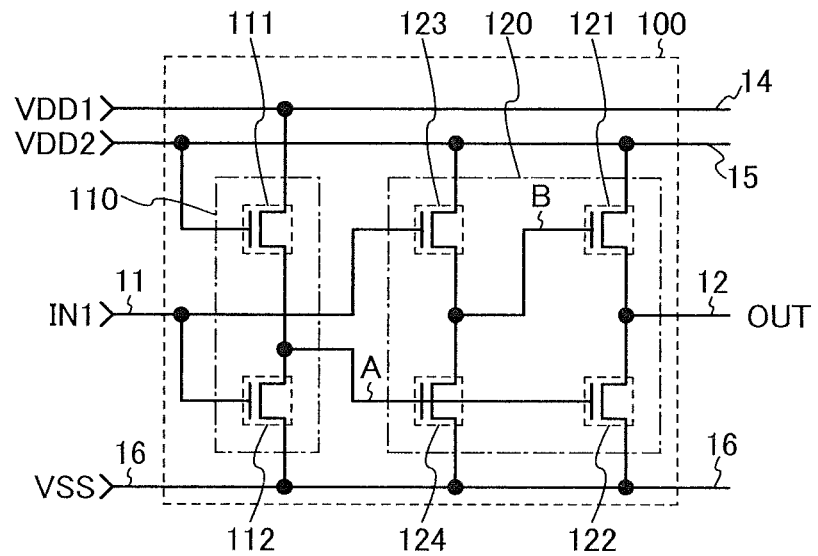
FIGS. 6A and 6B are each an example of the circuit diagram of the semiconductor device in Embodiment 1.
Figure 6B:
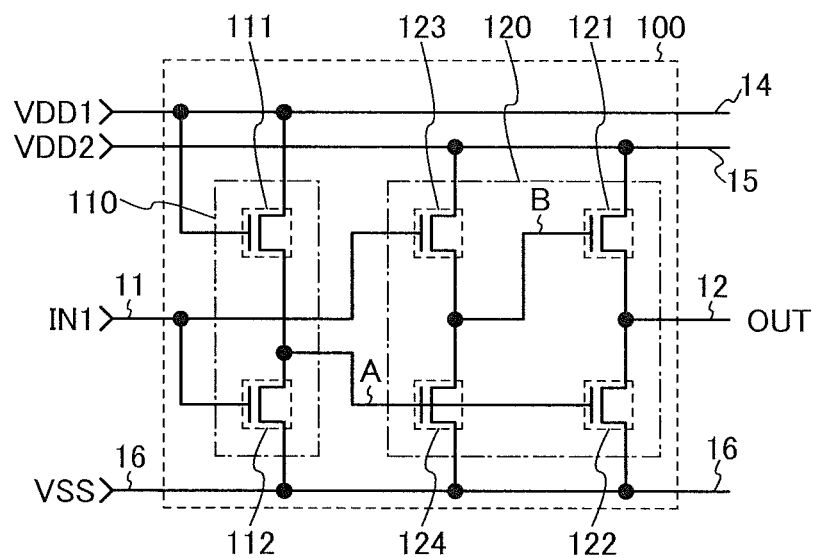

In the semiconductor devices in FIG. 1 and FIGS. 5A and 5B, the gate of the transistor 111 can be connected to a wiring other than the wiring 13 as shown in FIGS. 6A and 6B. FIG. 6A shows an example of the semiconductor device in which the gate of the transistor 111 is connected to the wiring 15. In this structure, the signal IN2 can be omitted. This reduces the power consumption. FIG. 6B shows an example of the semiconductor device in which the gate of the transistor 111 is connected to the wiring 14. In this structure, the signal IN2 can be omitted. This reduces the power consumption. However, one example of this embodiment is not limited to this. For example, the gate of the transistor 111 can be connected to a wiring to which an inverted signal of the signal IN1 is input.

Figure 7A:
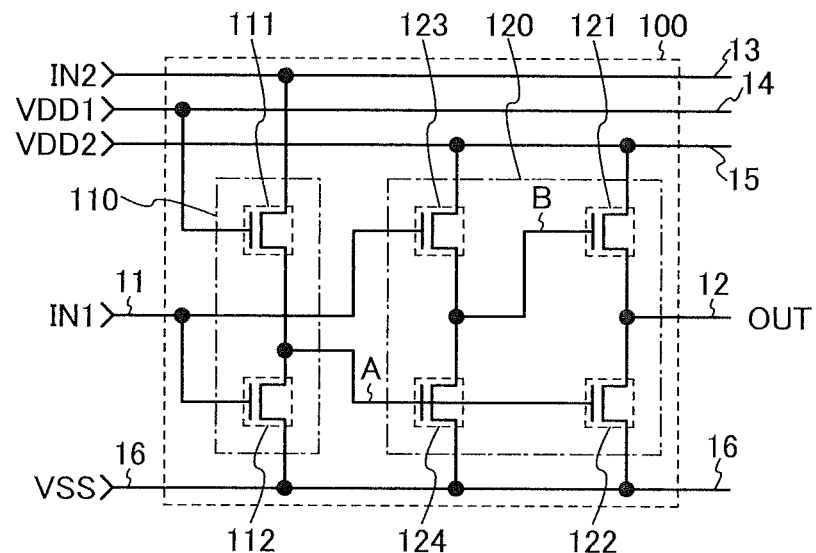
FIGS. 7A and 7B are each an example of the circuit diagram of the semiconductor device in Embodiment 1.

In the semiconductor devices in FIG. 1, FIGS. 5A and 5B, and FIGS. 6A and 6B, the first terminal of the transistor 111 can be connected to a wiring other than the wiring 14, and the gate of the transistor 111 can be connected to a wiring other than the wiring 13 as shown in FIG. 7A. FIG. 7A shows an example of the semiconductor device in which the first terminal of the transistor 111 is connected to the wiring 13, and the gate of the transistor 111 is connected to the wiring 14. In this structure, the potential of the node A can be increased in the second operation, and the potential of the node A can be decreased in the fourth operation. Thus, the transistor 122 and the transistor 124 are turned on in the second operation, and the transistor 122 and the transistor 124 are turned off in the fourth operation. Thus, the time over which the transistor 122 and the transistor 124 are on can be shortened. This suppresses degradation of the transistor 122 and the transistor 124.

Figure 7B:
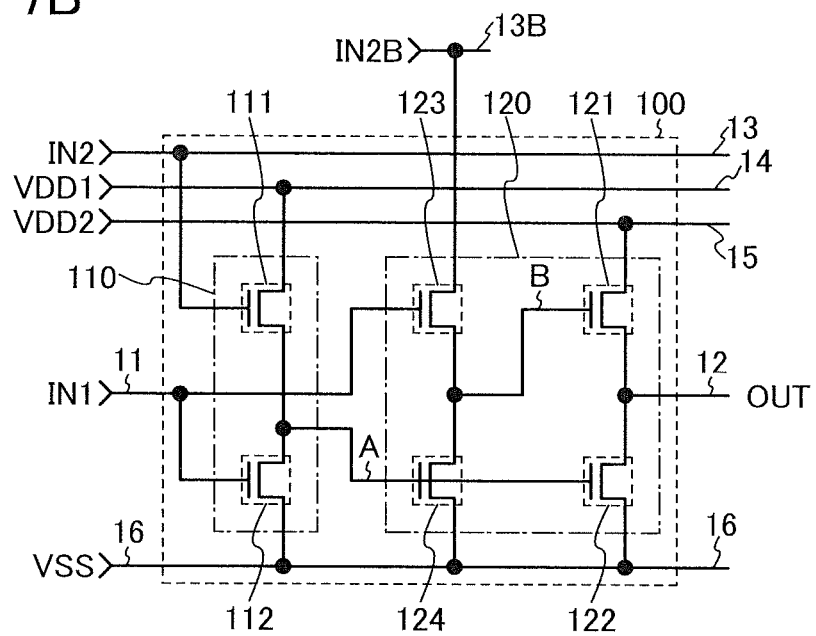
Figure 8A:
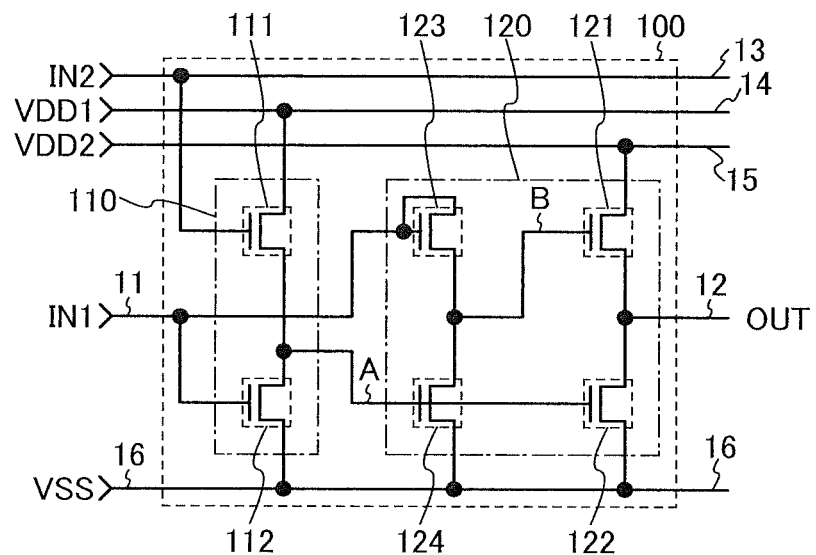
FIGS. 8A and 8B are each an example of the circuit diagram of the semiconductor device in Embodiment 1.

In the semiconductor devices in FIG. 1, FIGS. 5A and 5B, FIGS. 6A and 6B, and FIG. 7A, the first terminal of the transistor 123 can be connected to a wiring other than the wiring 15 as shown in FIG. 7B and FIG. 8A. FIG. 7B shows an example of the semiconductor device in which the first terminal of the transistor 123 is connected to a wiring 13B. A signal IN2B is input to the wiring 13B. The signal IN2B is an inverted signal of the signal IN2. Thus, the transistor 123 can be reverse-biased, so that degradation of the transistor can be suppressed. FIG. 8A shows an example of the semiconductor device in which the first terminal of the transistor 123 is connected to the wiring 11. In this structure, a potential difference applied between the source and drain of the transistor 123 (Vds) can be decreased in the second operation and the fourth operation. Thus, degradation of the transistor 123 can be suppressed. Alternatively, the off state current of the transistor 123 can be reduced, thereby reducing the power consumption. However, one example of this embodiment is not limited to this. For example, the first terminal of the transistor 123 can be connected to the wiring 14.

Figure 8B:
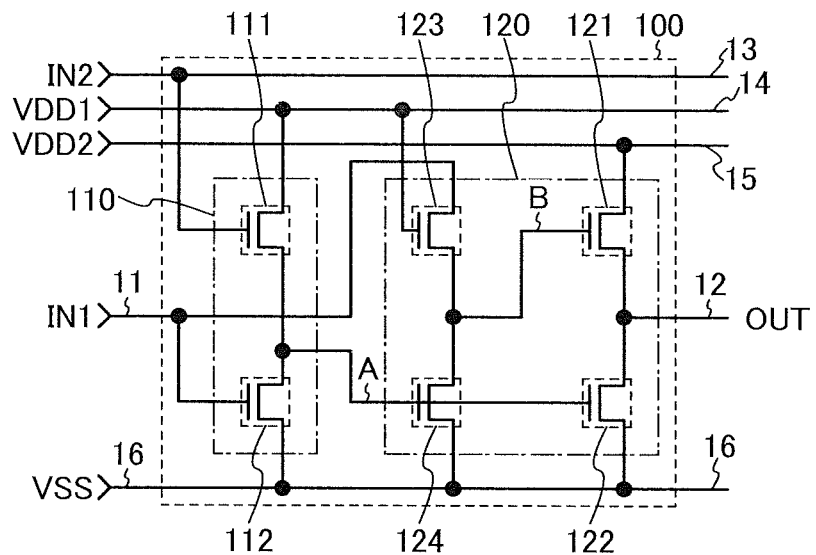

Note that when the first terminal of the transistor 123 is connected to the wiring 11, the gate of the transistor 123 can be connected to a wiring other than the wiring 11 as shown in FIG. 8B. FIG. 8B shows an example of the semiconductor device in which the gate of the transistor 123 is connected to the wiring 14. However, one example of this embodiment is not limited to this. The gate of the transistor 123 can be connected to the wiring 15, a wiring to which an inverted signal of the signal IN2 is input, or a wiring to which a signal which is not in phase with the signal IN2.

Figure 9A:
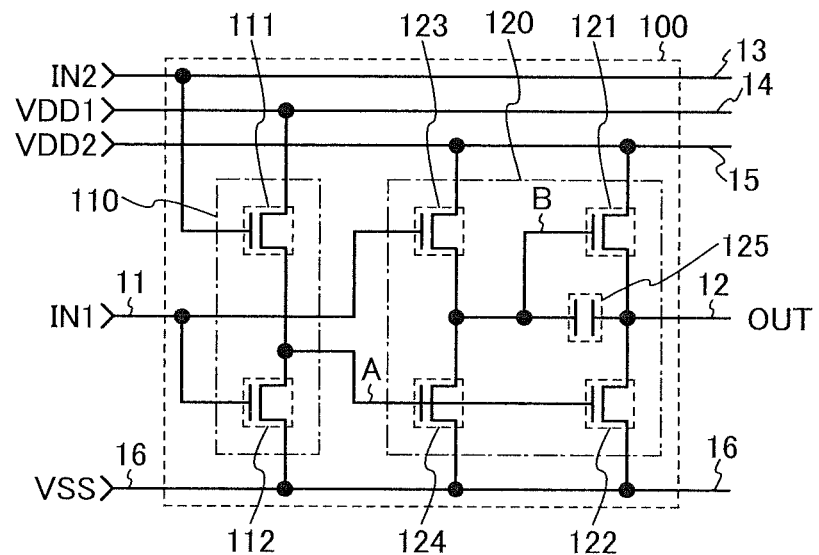
FIGS. 9A and 9B are each an example of the circuit diagram of the semiconductor device in Embodiment 1.

In the semiconductor device in FIG. 1, FIGS. 5A and 5B, FIGS. 6A and 6B, FIGS. 7A and 7B, and FIGS. 8A and 8B, a capacitor 125 can be provided between the gate and second terminal of the transistor 121 as shown in FIG. 9A. Thus, the potential of the node B can be further increased in the first operation and the second operation. Therefore, a potential difference between the gate and source of the transistor 121 (Vgs) can be increased, so that the rise time of the signal OUT can be shortened.

Figure 9B:
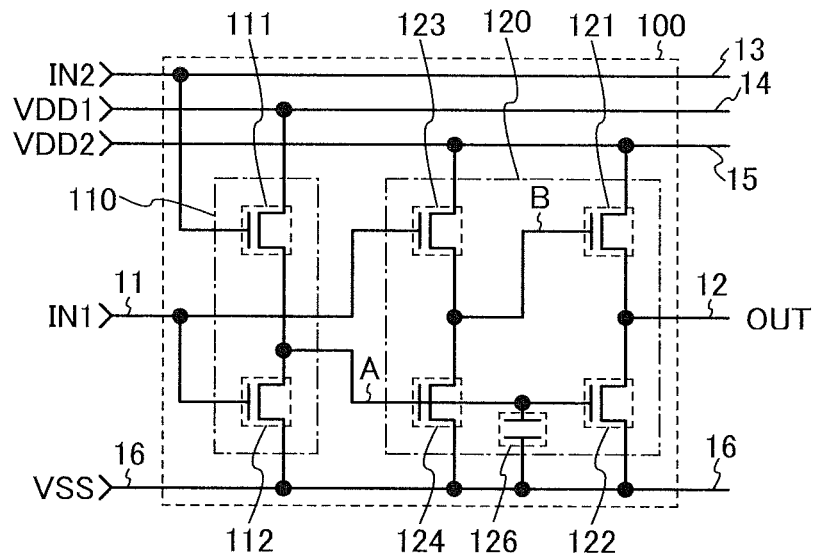

In the semiconductor device in FIG. 1, FIGS. 5A and 5B, FIGS. 6A and 6B, FIGS. 7A and 7B, FIGS. 8A and 8B, and FIG. 9A, a capacitor 126 can be provided between the node A and the wiring 16 as shown in FIG. 9B. Thus, fluctuations of the potential of the node A, noise at the node A, or the like can be suppressed, so that the potential of the node A can be easily maintained. However, one example of this embodiment is not limited to this. For example, the capacitor 126 can be connected between the node A and a wiring other than the wiring 16 (e.g., the wiring 13, the wiring 14, the wiring 15, or the like). In particular, by connecting the capacitor 126 between the node A and the wiring 13, the potential of the node A can be changed in synchronism with the signal IN2. Thus, the time over which the transistor 122 and the transistor 124 are on can be shortened.

Figure 10A:
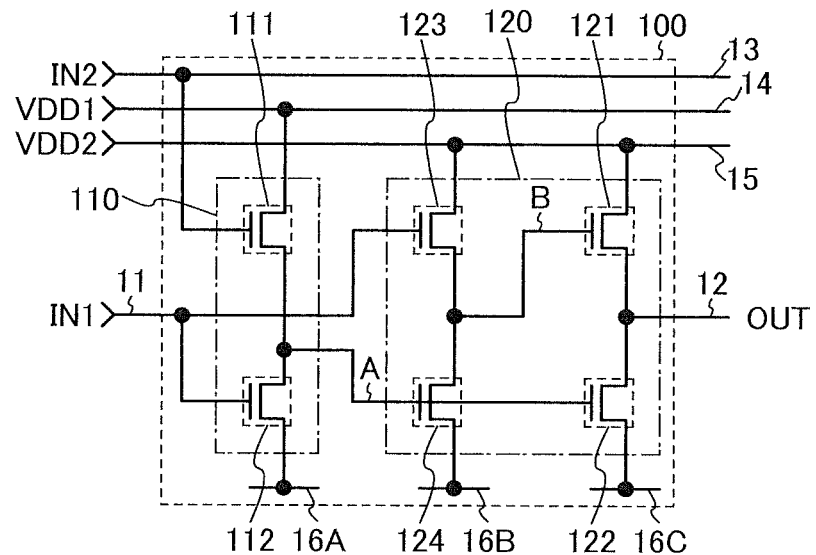
FIGS. 10A and 10B are each an example of the circuit diagram of the semiconductor device in Embodiment 1.

In the semiconductor devices in FIG. 1, FIGS. 5A and 5B, FIGS. 6A and 6B, FIGS. 7A and 7B, FIGS. 8A and 8B, and FIGS. 9A and 9B, the transistors can be connected to different wirings as shown in FIG. 10A. FIG. 10A shows an example of the semiconductor device in which the first terminal of the transistor 112, the second terminal of the transistor 124, and the second terminal of the transistor 122 are connected to different wirings. The wiring 16 is divided into a plurality of wirings: wirings 16A to 16C. The first terminal of the transistor 112, the second terminal of the transistor 124, and the second terminal of the transistor 122 are connected to the wiring 16A, the wiring 16B, and the wiring 16C, respectively. However, one example of this embodiment is not limited to this. For example, also the first terminal of the transistor 121 and the first terminal of the transistor 123 can be connected to different wirings. In this case, the wiring 15 can be divided into two wirings.

Figure 10B:
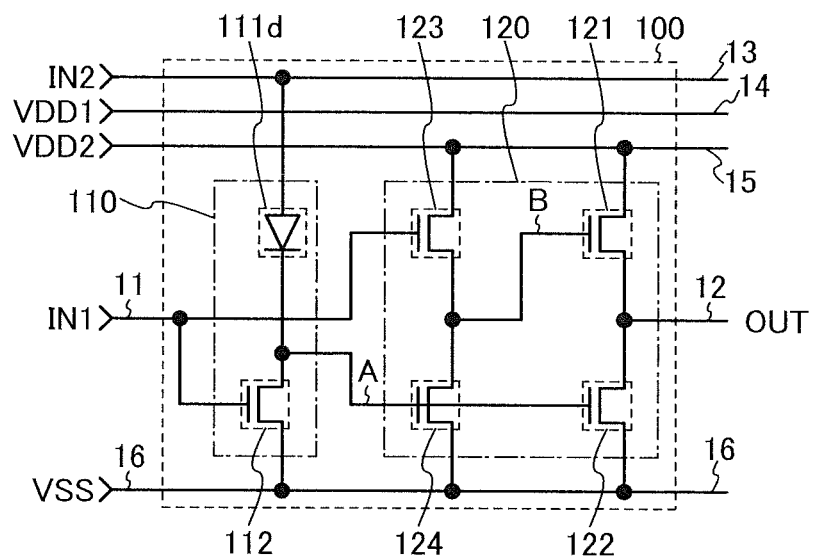

In the semiconductor devices in FIG. 1, FIGS. 5A and 5B, FIGS. 6A and 6B, FIGS. 7A and 7B, FIGS. 8A and 8B, FIGS. 9A and 9B, and FIG. 10A, a transistor can be replaced with a resistor, a diode, a capacitor, or the like as shown in FIG. 10B. FIG. 10B shows an example of the semiconductor device in which the transistor 111 is replaced with a diode 111d. One electrode (e.g. the anode) of the diode 111d is connected to the wiring 13, and the other electrode (e.g. the cathode) is connected to the node A. However, one example of this embodiment is not limited to this. For example, the transistor 111 can be replaced with a resistor. The resistor can be connected between the node A and any one of the wirings 13 to 15. For another example, one electrode (e.g. the anode) of the transistor 123 can be connected to the wiring 11, and the other electrode (e.g. the cathode) can be replaced with a diode connected to the node B. For another example, the diode can be a diode-connected transistor.

Next, an example of the function of each circuit and an example of the function of each transistor will be described.

The circuit 100 has a function of increasing the amplitude voltage of the signal IN1. Alternatively, the circuit 100 has a function of increasing the potential of the signal IN1 at a high level. Alternatively, the circuit 100 has a function of inverting the signal OUT when the signal IN1 is inverted. Alternatively, the circuit 100 has a function of setting the signal OUT high when the signal IN1 goes high. Alternatively, the circuit 100 has a function of setting the signal OUT low when the signal IN1 goes low. Thus, the circuit 100 serves as a level shifter circuit.

Note that by setting the voltage VDD2 smaller than the voltage VDD1, the potential of the signal OUT at a high level can be made lower than the potential of the signal IN1 or IN2 at a high level. In this case, the circuit 100 has a function of decreasing the amplitude voltage of the signal IN1.

The circuit 110 has a function of inverting the signal IN1. Alternatively the circuit 110 has a function of decreasing the potential of the node A when the signal IN1 goes high. Alternatively, the circuit 110 has a function of increasing the potential of the node A when the signal IN1 goes low. Alternatively, the circuit 110 has a function of setting the node A floating. Thus, the circuit 110 serves as an inverter circuit.

The circuit 120 has a function of increasing the amplitude voltage of the signal IN1. Alternatively, the circuit 120 has a function of increasing the potential of the signal IN1 at a high level. Alternatively, the circuit 120 has a function of inverting the signal OUT when the signal IN1 is inverted. Alternatively, the circuit 120 has a function of setting the signal OUT high when the signal IN1 goes high. Alternatively, the circuit 120 has a function of setting the signal OUT low when the signal IN1 goes low. Thus, the circuit 120 serves as a level shifter circuit.

The transistor 111 has a function of controlling electrical continuity between the wiring 14 and the node A. Alternatively, the transistor 111 has a function of controlling the timing of supplying the potential of the wiring 14 to the node A. Alternatively, the transistor 111 has a function of controlling the timing of increasing the potential of the node A. Alternatively, the transistor 111 has a function of controlling the timing of setting the node A floating. Thus, the transistor 111 serves as a switch.

The transistor 112 has a function of controlling electrical continuity between the wiring 16 and the node A. Alternatively, the transistor 112 has a function of controlling the timing of supplying the potential of the wiring 16 to the node A. Alternatively, the transistor 112 has a function of controlling the timing of decreasing the potential of the node A. Thus, the transistor 112 serves as a switch.

The transistor 121 has a function of controlling electrical continuity between the wiring 15 and the wiring 12. Alternatively, the transistor 121 has a function of controlling the timing of supplying the potential of the wiring 15 to the wiring 12. Alternatively, the transistor 121 has a function of controlling the timing of increasing the potential of the wiring 12. Alternatively, the transistor 121 has a function of controlling the timing of performing a bootstrap operation. Alternatively, the transistor 121 has a function of controlling the timing of increasing the potential of the node B. Thus, the transistor 121 serves as a switch.

The transistor 122 has a function of controlling electrical continuity between the wiring 16 and the wiring 12. Alternatively, the transistor 122 has a function of controlling the timing of supplying the potential of the wiring 16 to the wiring 12. Alternatively, the transistor 122 has a function of controlling the timing of decreasing the potential of the wiring 12. Thus, the transistor 122 serves as a switch.

The transistor 123 has a function of controlling electrical continuity between the wiring 15 and the node B. Alternatively, the transistor 123 has a function of controlling the timing of supplying the potential of the wiring 14 to the node B. Alternatively, the transistor 123 has a function of controlling the timing of increasing the potential of the node B. Alternatively, transistor 123 has a function of controlling the timing of setting the node B floating. Thus, the transistor 123 serves as a switch.

The transistor 124 has a function of controlling electrical continuity between the wiring 16 and the node B. Alternatively, the transistor 124 has a function of controlling the timing of supplying the potential of the wiring 16 to the node B. Alternatively, the transistor 124 has a function of controlling the timing of decreasing the potential of the node B. Thus, the transistor 124 serves as a switch.

Next, an example of the channel width of each transistor will be described.

The channel width of the transistor 121 is preferably larger than that of the transistor 111, the transistor 112, and the transistors 122 to 124. In other words, the channel width of the transistor 121 is preferably the largest among the channel widths of the transistors in the circuit 100. This is because the transistor 121 drives the wiring 12 and thus needs a large drive capability. Note that the channel width of the transistor 121 is preferably twice to 10 times as large as that of the transistor 123. More preferably, the channel width of the transistor 121 is three to eight times as large as that of the transistor 123. Much more preferably, the channel width of the transistor 121 is four to six times as large as that of the transistor 123.

The channel width of the transistor 122 is preferably larger than that of the transistor 111, the transistor 112, the transistors 123, and the transistor 124. This is because the transistor 122 drives the wiring 12 and thus needs a large drive capability. Note that the channel width of the transistor 122 is preferably twice to 30 times as large as that of the transistor 124. More preferably, the channel width of the transistor 122 is 4 to 15 times as large as that of the transistor 124. Much more preferably, the channel width of the transistor 121 is 6 to 10 times as large as that of the transistor 124.

Note that the channel width of the transistor 122 can be larger than that of the transistor 121.

The channel width of the transistor 123 is preferably larger than that of the transistor 124. This is in order for the potential of the node B to increase even when the transistor 123 and the transistor 124 are turned on at the same time in the first operation and the third operation because of difference in timing. Note that the channel width of the transistor 123 is preferably 1.5 to 10 times as large as that of the transistor 124. More preferably, the channel width of the transistor 123 is twice to eight times as large as that of the transistor 124. Much more preferably, the channel width of the transistor 123 is 2.5 to 5 times as large as that of the transistor 124.

Note that the current capability of a transistor can be controlled by the channel width of the transistor. Specifically, the larger the channel width of the transistor, the more the current capability of the transistor is improved. However, a factor which controls the current capability of the transistor is not limited to the channel width of the transistor. For example, the current capability can be controlled by the channel length of the transistor or a potential difference between the gate and source of the transistor (Vgs). Specifically, the smaller the channel length of the transistor, the more the current capability of the transistor is improved. In addition, the larger the potential difference between the gate and source of the transistor (Vgs), the more the current capability of the transistor is improved. Additionally, the current capability can be decreased by a multi-gate transistor.

As described above, there is a plurality of methods of controlling the current capability of a transistor. Consequently, in the case where a method of controlling a channel width is shown below as an example of the method of controlling the current capability of the transistor, such a channel width can be referred to as a channel length or a potential difference between the gate and source of a transistor (Vgs).

Embodiment 2

In this embodiment, an example of a semiconductor device and an example of a driving method of the semiconductor device will be described. The semiconductor device in this embodiment includes the semiconductor device in Embodiment 1.

First, an example of the semiconductor device in this embodiment will be described.

Figure 11:
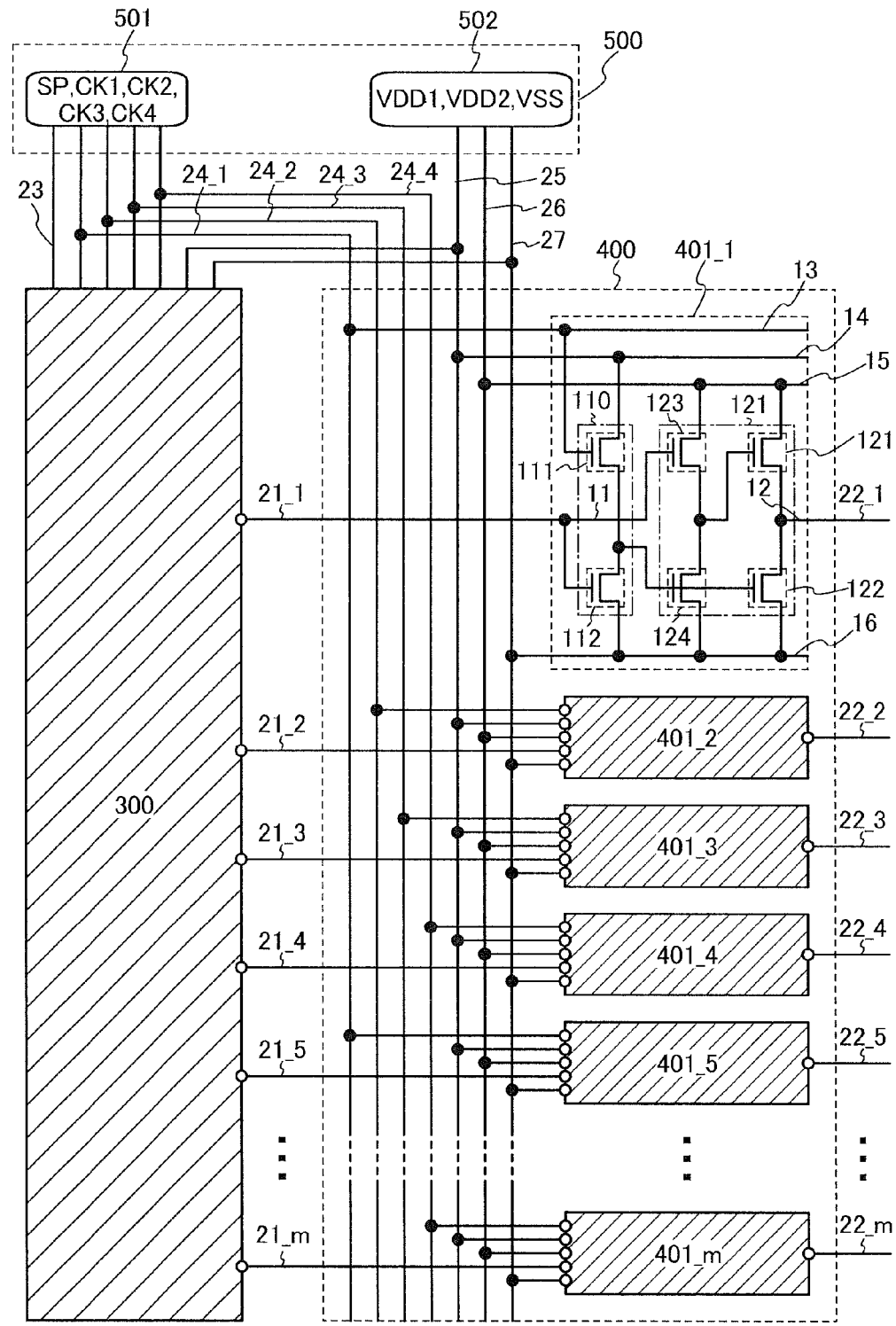
FIG. 11 is an example of the circuit diagram of a semiconductor device in Embodiment 2.

FIG. 11 shows an example of the semiconductor device in this embodiment. A semiconductor device in FIG. 11 includes a circuit 300, a circuit 400, and a circuit 500. The circuit 400 includes circuits 401_1 to 401_m (m is a natural number). In addition, the semiconductor device in Embodiment 1 can be used as each of the circuits 401_1 to 401_m. In FIG. 11, the semiconductor device in FIG. 1 can be used as each of the circuits 401_1 to 401_m. The circuit 500 includes a circuit 501 and a circuit 502.

The circuit 300 is connected to wirings 21_1 to 21_m, a wiring 23, wirings 24_1 to 24_4, a wiring 25, and a wiring 27. The circuit 400 is connected to the wirings 21_1 to 21_m, wirings 22_1 to 22_m, the wirings 24_1 to 24_4, the wiring 25, a wiring 26, and the wiring 27. The circuit 401_i (i is any one of 1 to m) is connected to the wiring 21_i, the wiring 22_i, any one of the wirings 24_1 to 24_4, the wiring 25, the wiring 26, and the wiring 27. Further, in the circuit 401_i, the wiring 11, the wiring 12, the wiring 13, the wiring 14, the wiring 15, and the wiring 16 are connected to the wiring 21_i, the wiring 22_i, any one of the wirings 24_1 to 24_4, the wiring 25, the wiring 26, and the wiring 27, respectively. The circuit 500 is connected to the wiring 23, the wirings 24_1 to 24_4, the wiring 25, the wiring 26, and the wiring 27. The circuit 501 is connected to the wiring 23 and the wirings 24_1 to 24_4. The circuit 502 is connected to the wiring 25, the wiring 26, and the wiring 27.

Note that when it is assumed that the circuit 401_i is connected to the wiring 24_1, the circuit 401_i+1, the circuit 401_i+2, and the circuit 401_i+3 are often connected to the wiring 242, the wiring 24_3, and the wiring 24_4, respectively. Alternatively, the circuit 401_i−3, the circuit 401_i−2, and the circuit 401_i−1 are often connected to the wiring 242, the wiring 24_3, and the wiring 24_4, respectively.

Note that the circuit 401_i is preferably connected to one of the wirings 24_1 to 24_4, whose potential goes low in a period in which the signal SOUTi goes high. Thus, a period in which the transistor 111 and the transistor 112 are turned on at the same time can be omitted. This reduces the power consumption.

The circuit 500 has a function of controlling the timing of supplying a signal, a voltage, or the like to the circuits 300 and 400. Further, the circuit 500 has a function of controlling the timing of when the circuit 300 and the circuit 400 operate. In other words, the circuit 500 serves as a controller.

The circuit 501 has a function of controlling the timing of outputting a signal SP, a signal CK1, a signal CK2, a signal CK3, and a signal CK4 to the wiring 23, the wiring 24_1, the wiring 242, the wiring 24_3, and the wiring 24_4, respectively. In other words, the circuit 501 serves as a signal-generating circuit (also referred to as a timing generator). Therefore, the circuit 501 can include a switch, a diode, a transistor, an oscillator circuit, a clocked generator, a PLL circuit and/or a frequency divider circuit.

Figure 12:
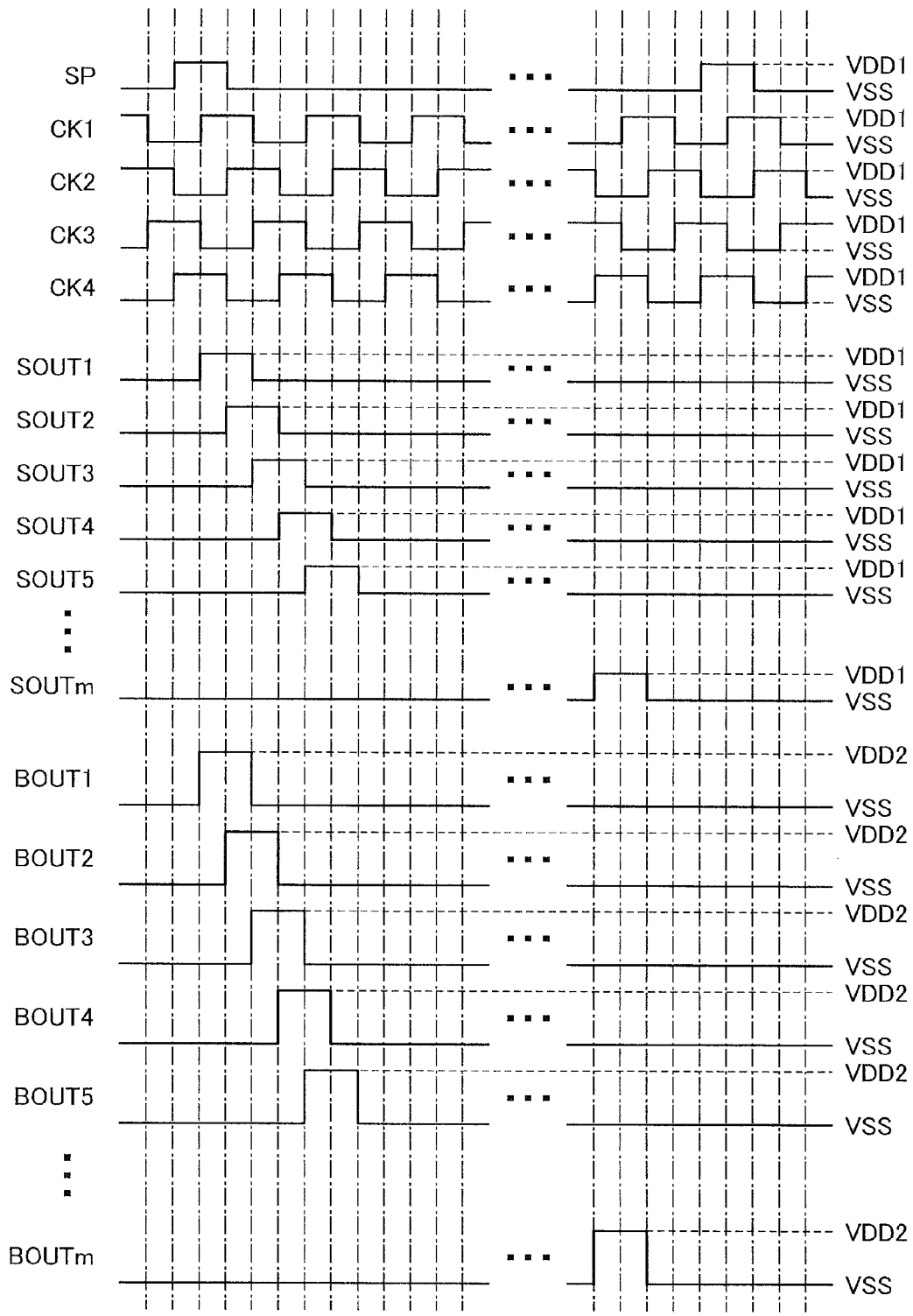
FIG. 12 is an example of the timing chart for describing the operation of the semiconductor device in Embodiment 2.

The signal SP, the signal CK1, the signal CK2, the signal CK3, and the signal CK4 are often digital signals as shown in FIG. 12. The potential of these signals at a high level is approximately VDD1, and the potential of these signals at a low level is approximately VSS. In addition the signal SP serves as a start pulse (also referred to as a horizontal synchronizing signal or a vertical synchronizing signal). Therefore, the wiring 23 serves as a signal line (also referred to as a start signal line). The signals CK1 to CK4 each function as a clock signal. Each of the signals CK1 to CK4 is out of phase with the subsequent clock signal by ¼ cycle (90°). Therefore, the wiring 24_1 to 24_4 serve as clock signal lines (also referred to as signal lines).

Figure 13A:
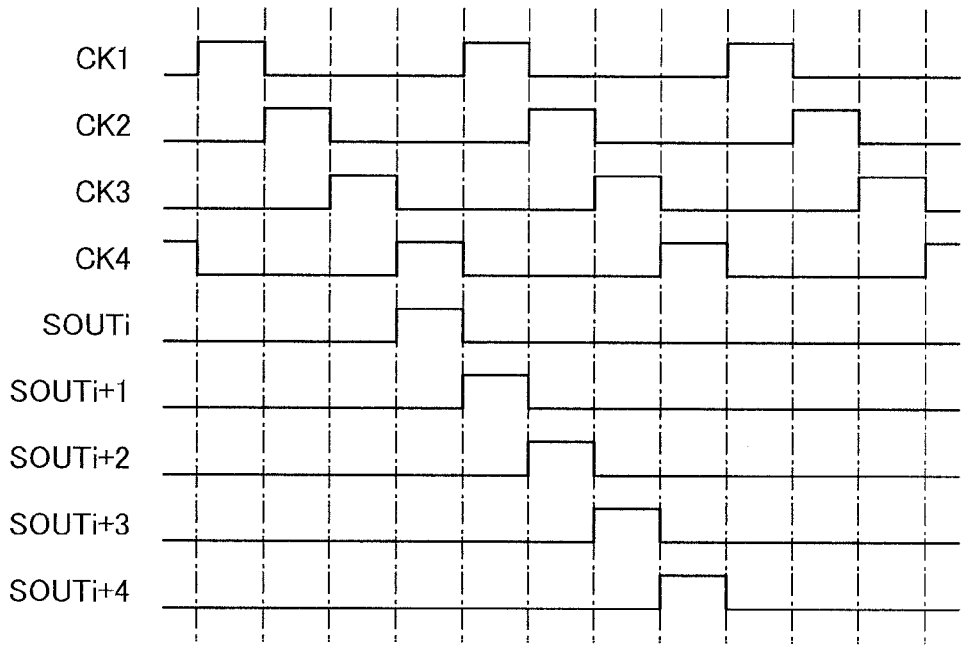
FIGS. 13A to 13C are each an example of the timing chart for describing the operation of the semiconductor device in Embodiment 2.

Note that the signals CK1 to CK4 are balanced signals as shown in FIG. 12. A balanced signal is a signal whose period in which the signal is high and whose period in which the signal is low in one cycle have approximately the same length. However, one example of this embodiment is not limited to this. For example, the signals CK1 to CK4 can be unbalanced signals as shown in FIG. 13A. An unbalanced signal is a signal whose period in which the signal is high and whose period in which the signal is low in one cycle have different lengths. Here, the term "different" is used in consideration of the case except the case where the length of the periods is approximately equal to each other.

Figure 13B:
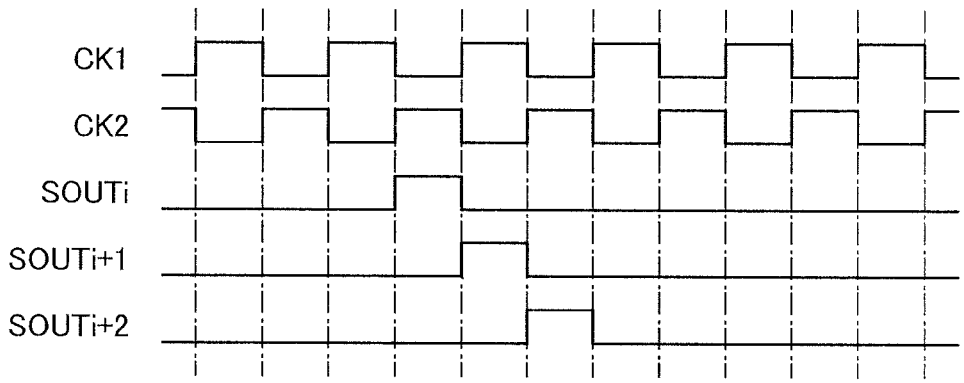
Figure 13C:
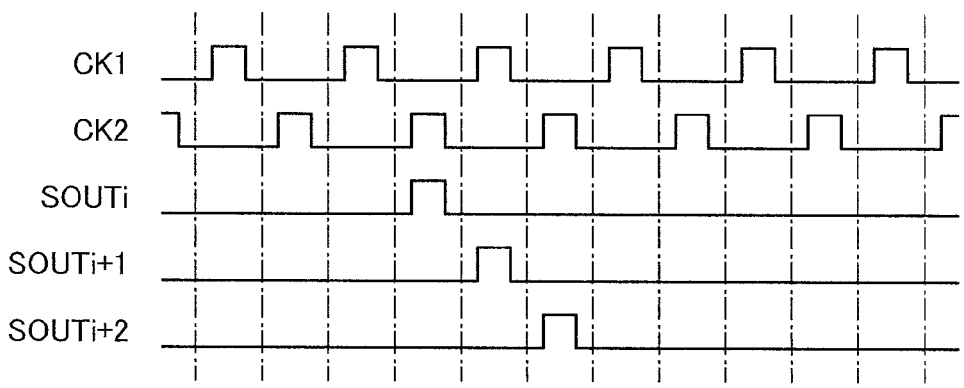

Note that a single-phase clock signal can be used for the semiconductor device in this embodiment as shown in FIGS. 13B and 13C. In this case also, a clock signal can be either a balanced signal as shown in FIG. 13B or an unbalanced signal as shown in FIG. 13C. However, one example of this embodiment is not limited to this. For example, a three-phase clock signal or a five- or more phase clock signal can be used for the semiconductor device in this embodiment.

The circuit 502 has a function of outputting the voltage VDD1, the voltage VDD2, and the voltage VSS to the wiring 25, the wiring 26, and the wiring 27, respectively. In other words, the circuit 502 serves as a power supply circuit (also referred to as a regulator). Therefore, the wiring 25 serves as a power supply line or a positive power supply line. The wiring 27 serves as a power supply line, a negative power supply line, a ground line. Therefore, the circuit 502 can include a switch, a transistor, a capacitor, a coil, a diode, a regulator, a DCDC converter and/or a booster circuit.

Note that the circuit 500, the circuit 501, and the circuit 502 can supply various signals or voltages to the circuit 300 and the circuit 400 according to the configuration of the circuit 300 and the circuit 400.

The circuit 300 has a function of controlling the timing of outputting signals SOUT1 to SOUTm according to a signal and a voltage from the circuit 500 (e.g., the signal SP, the signals CK1 to CK4, the voltage VDD1, and the voltage VSS). The signals SOUT1 to SOUTm are often digital signals, and the potential of the signals SOUT1 to SOUTm at a high level is approximately VDD1, and the potential of the signals SOUT1 to SOUTm at a low level is approximately VSS. In addition, the circuit 300 has a function of setting sequentially the signals SOUT1 to SOUTm high. In other words, the circuit 300 serves as a shift register circuit. However, one example of this embodiment is not limited to this. For example, the circuit 300 can have the function of setting the signals SOUT1 to SOUTm high in a predetermined order. Therefore, the circuit 300 can serve as a decoder circuit.

Note that the signals SOUT1 to SOUTm are input to the circuit 400 via the wirings 21_1 to 21_m, respectively. For example, the signal SOUTi is input to the circuit 401_i via the wiring 21_i. Therefore, the wirings 21_1 to 21_m each serve as a signal line.

Note that in a timing chart in FIG. 12, part of a period in which the signal SOUTi is high and part of a period in which the signal SOUTi−1 is high overlap with each other. Further, part of a period in which the signal SOUTi is high and part of a period in which the signal SOUTi+1 is high overlap with each other. Therefore, a period in which the signals SOUT1 to SOUTm are high can be longer. Thus, the drive frequency of the circuit 300 can be reduced, thereby reducing the power consumption. However, one example of this embodiment is not limited to this. For example, it is possible for periods in which the signals SOUT1 to SOUTm are high not to overlap with each other.

The circuit 400 has a function of controlling the timing of outputting signals BOUT1 to BOUTm according to a signal from the circuit 300 (e.g., the signals SOUT1 to SOUTm), and a signal and voltage from the circuit 500 (e.g., the signals CK1 to CK4, the voltage VDD1, the voltage VDD2, and the voltage VSS). The signals BOUT1 to BOUTm are often digital signals, and the potential of the signals BOUT1 to BOUTm at a high level is approximately VDD2, and the potential of the BOUT1 to BOUTm at a low level is approximately VSS. In addition, the timing of when the signals BOUT1 to BOUTm are inverted is approximately the same as the timing of when the signals SOUT1 to SOUTm are inverted. In other words, the circuit 400 has a function of increasing the amplitude voltage of the signals SOUT1 to SOUTm.

Next, an example of the operation of the semiconductor device in this embodiment will be described.

Figure 14:
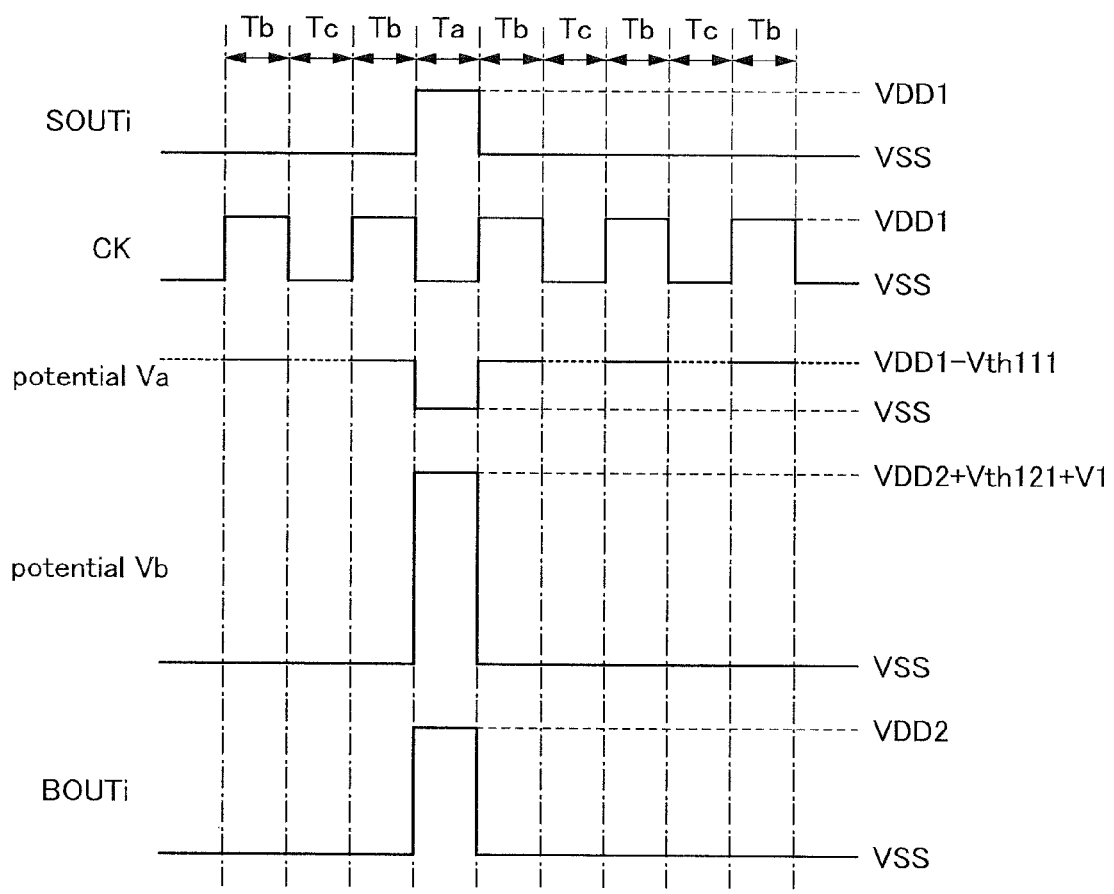
FIG. 14 is an example of the timing chart for describing the operation of the semiconductor device in Embodiment 2.

FIG. 14 is an example of the timing chart of the circuit 401_i. FIG. 14 shows the signal SOUTi, the signal CK, the potential of the node A of the circuit 401_i, the potential of the node B of the circuit 401_i, and the signal BOUTi. The signal CK is any one of the signal CK1 to CK4. The signal CK is a signal of the signal CK1 to CK4, which goes low when the signal SOUTi goes high. In addition, the timing chart in FIG. 14 includes a period Ta, a period Tb, and a period Tc. In the timing chart in FIG. 14, there are, in addition to the period Ta, the period Tb and the period Tc which are provided in order.

Note that the signal SOUTi corresponds to the signal IN1 in FIG. 2. The signal CK corresponds to the signal IN2 in FIG. 2. The signal BOUTi corresponds to the signal OUT in FIG. 2.

First, in the period Ta, the signal SOUTi goes high, and the signal CK goes low. Then, the circuit 400_i performs the first operation. Accordingly, the signal BOUTi goes high. This raises the potential of the signal SOUTi at a high level from VDD1 to VDD2.

Next, in the period Tb, the signal SOUTi goes low, and the signal CK goes high. Then, the circuit 400_i performs the second operation. Consequently, the signal BOUTi goes low.

Next, in the period Tc, the signal SOUTi remains low, and the signal CK goes low. Then, the circuit 400_i performs the fourth operation. Further, since the previous period of the period Tc is the period Tb, the potential Va remains VDD1−Vth111. Consequently, the signal BOUTi remains low.

As described above, the semiconductor device in this embodiment can amplify the amplitude voltage of an output signal of the circuit 300 and then output the signal. This decreases the amplitude voltage of the circuit 300. Therefore, the power consumption of the circuit 300 can be reduced.

Alternatively, the circuits 401_1 to 401_m each often perform any of the first operation, the second operation, and the fourth operation. Therefore, there is no period in which the transistor 111 and the transistor 112 are turned on at the same time, and the power consumption is thus reduced.

Next, an example of the circuit 300 will be described.

Figure 15:
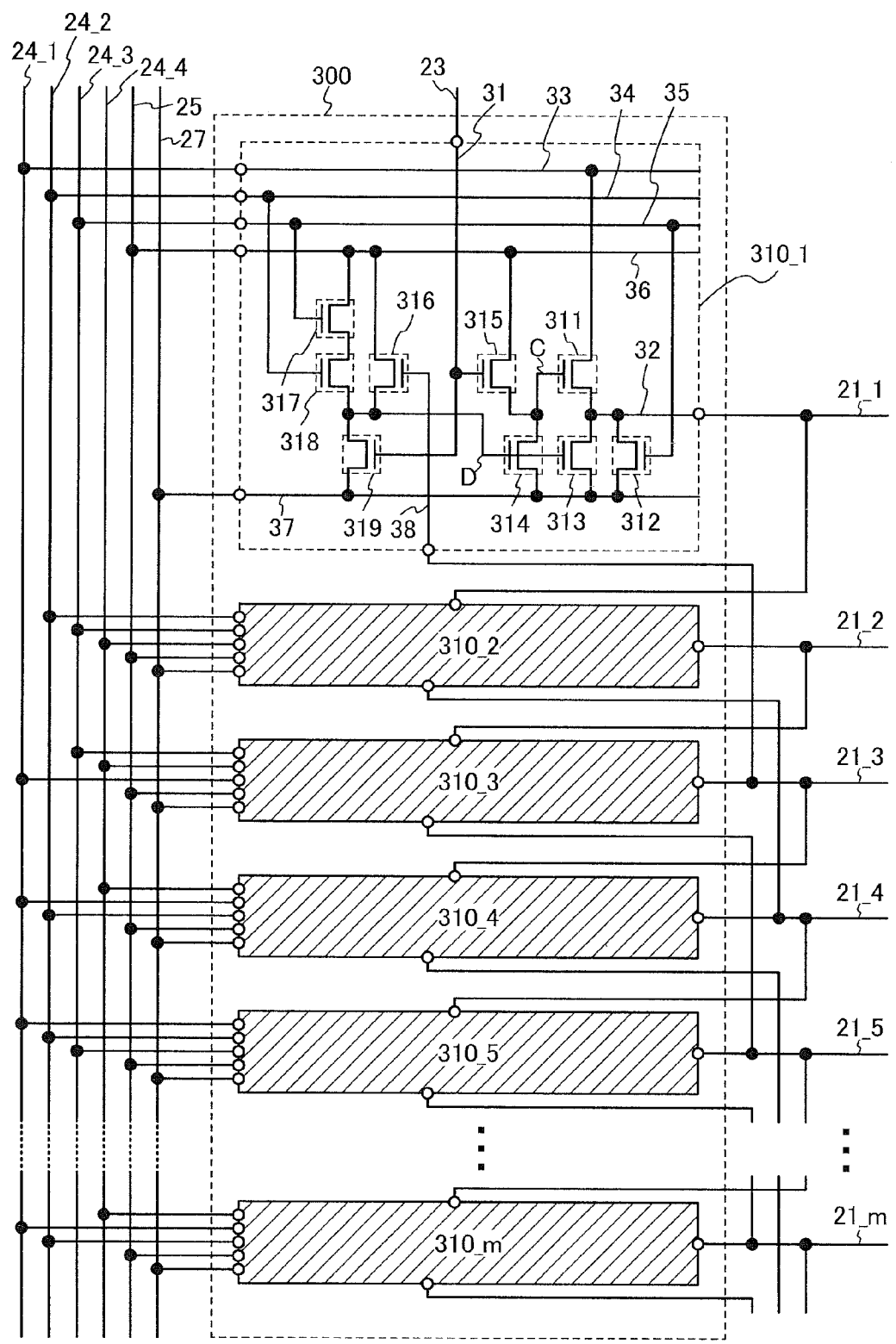
FIG. 15 is an example of the circuit diagram of the semiconductor device in Embodiment 2.

FIG. 15 shows an example of the circuit 300. The circuit 300 includes circuits 310_1 to 310_m. The circuit 310_i is connected to the wiring $21\_i$, the wiring $21\_i-1$, the wiring $21\_{i+}2$, three of the wirings 24_1 to 24_4, the wiring 25, and the wiring 27. However, the circuit 310_1 is often connected to the wiring 23 instead of the wiring $21\_i-1$.

Each of the circuits 310_1 to 310_m includes a transistor 311, a transistor 312, a transistor 313, a transistor 314, a transistor 315, a transistor 316, a transistor 317, a transistor 318, and a transistor 319. A first terminal of the transistor 311 is connected to a wiring 33, and a second terminal of the transistor 311 is connected to a wiring 32. A first terminal of the transistor 312 is connected to a wiring 37, a second terminal of the transistor 312 is connected to the wiring 32, and a gate of the transistor 312 is connected to a wiring 35. A first terminal of the transistor 313 is connected to the wiring 37, and a second terminal of the transistor 313 is connected to the wiring 32. A first terminal of the transistor 314 is connected to the wiring 37, a second terminal of the transistor 314 is connected to a gate of the transistor 311, and a gate of the transistor 314 is connected to a gate of the transistor 313. A first terminal of the transistor 315 is connected to a wiring 36, a second terminal of the transistor 315 is connected to the gate of the transistor 311, and a gate of the transistor 315 is connected to a wiring 31. A first terminal of the transistor 316 is connected to the wiring 36, a second terminal of the transistor 316 is connected to the gate of the transistor 313, and a gate of the transistor 316 is connected to a wiring 38. A first terminal of the transistor 317 is connected to the wiring 36, and a gate of the transistor 317 is connected to the wiring 35. A first terminal of the transistor 318 is connected to the second terminal of the transistor 317, a second terminal of the transistor 318 is connected to the gate of the transistor 313, and a gate of the transistor 318 is connected to a wiring 34. A first terminal of the transistor 319 is connected to the wiring 37, a second terminal of the transistor 319 is connected to the gate of the transistor 313, and a gate of the transistor 319 is connected to the wiring 31.

Note that a connecting point of the gate of the transistor 311, the second terminal of the transistor 314, and the second terminal of the transistor 315 is referred to as a node C. A connecting point of the gate of the transistor 313, the gate of the transistor 314, the second terminal of the transistor 316, the second terminal of the transistor 318, and the second terminal of the transistor 319 is referred to as a node D.

Note that the transistors 311 to 319 are n-channel transistors. Thus, all of the semiconductor devices in this embodiment can be n-channel transistors. However, one example of this embodiment is not limited to this. For example, all of the transistors 311 to 319 can be p-channel transistors.

Note that in the circuit 310_i, the wiring 31 is connected to the wiring $21\_i-1$. The wiring 32 is connected to the wiring 21_i. The wirings 33 to 35 are connected to three wirings selected from the wirings 24_1 to 24_4. For example, when the wiring 33 is connected to the wiring 24_1, the wiring 34 is connected to the wiring 242, and the wiring 35 is connected to the wiring 24_3. The wiring 36 is connected to the wiring 25. The wiring 37 is connected to the wiring 27. The wiring 38 is connected to the wiring $21\_{i+}2$. However, in the circuit 310_1, the wiring 31 is connected to the wiring 23.

Next, an example of the operation of the circuit 300 will be described.

Figure 16:
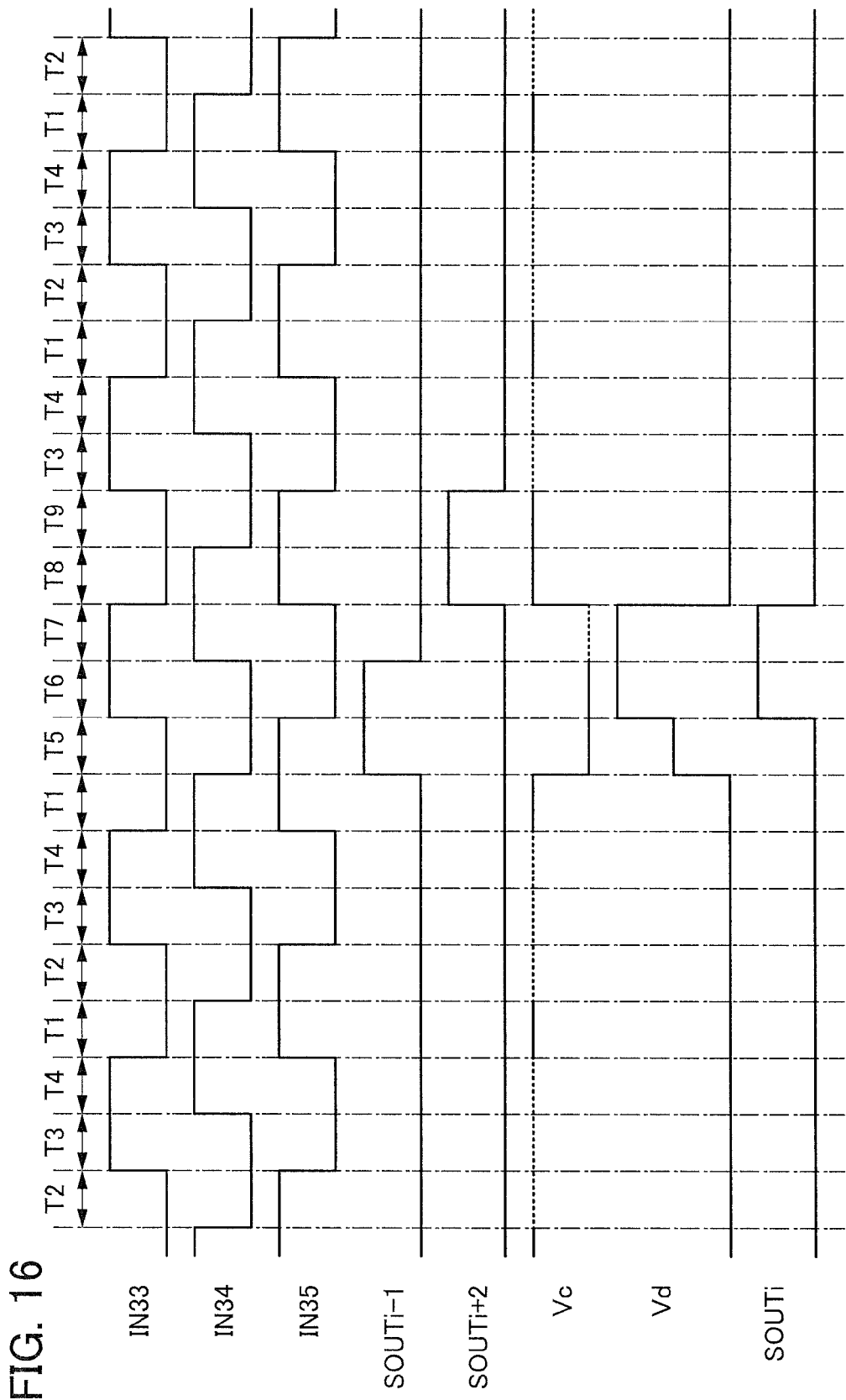
FIG. 16 is an example of the timing chart for describing the operation of the semiconductor device in Embodiment 2.

FIG. 16 shows an example of the timing chart which can be used for the circuit 310_i. The timing chart in FIG. 16 shows a signal IN33, a signal IN34, a signal IN35, the signal SOUTi−1, the signal SOUTi+1, the potential of the node C (potential Vc), the potential of the node D (potential Vd), and the signal SOUTi. In addition, the timing chart in FIG. 16 includes periods T1 to T9. The periods T5 to T9 are provided in order, and the periods T1 to T4 are repeatedly provided in order in other periods than the periods T5 to T9.

First, in the period T1, the signal SOUTi goes low, the signal SOUTi+2 goes low, the signal IN33 goes low, the signal IN34 goes high, and the signal IN35 goes high. Consequently, the transistor 316 is turned off, the transistor 317 is turned on, the transistor 318 is turned on, and the transistor 319 is turned off, so that electrical continuity between the node D and the wiring 36 is established. Then, the potential of the wiring 36 (e.g., the voltage VDD) is supplied to the node D, and thus the potential of the node D increases. Consequently, the transistor 314 is turned on. At that time, the transistor 315 is turned off, so that electrical continuity between the node C and the wiring 37 is established. Then, the potential of the wiring 37 (e.g., the voltage VSS) is supplied to the node C, and thus the potential of the node C becomes approximately VSS. Consequently, the transistor 311 is turned off. At that time, the transistor 312 and the transistor 313 are turned on, so that electrical continuity between the wiring 32 and the wiring 37 is established. Then, the potential of the wiring 37 (e.g., the voltage VSS) is supplied to the wiring 32, and thus the potential of the wiring 32 becomes approximately VSS. Consequently, the signal SOUTi goes low.

Next, in the period T2, the signal IN34 goes low, which is different from in the period T1. Consequently, the transistor 318 is turned off, so that electrical continuity between the wiring 36 and the node D is broken. Then, the node D becomes floating, and the potential of the node D thus maintains the same potential as that in the period Ti.

Next, in the period T3, the signal IN33 goes high and the signal IN35 goes low, which is different from in the period T2. Consequently, the transistor 317 and the transistor 312 are turned off.

Next, in the period T4, the signal IN34 goes high, which is different from in the period T3. Consequently, the transistor 318 is turned on.

Next, in the period T5, the signal SOUTi goes high, the signal SOUTi+2 goes low, the signal IN33 goes low, the signal IN34 goes low, and the signal IN35 goes high. Consequently, the transistor 316 is turned off, the transistor 317 is turned on, the transistor 318 is turned off, and the transistor 319 is turned on, so that electrical continuity between the wiring 37 and the node D is established. Then, the potential of the wiring 37 (the voltage VSS) is supplied to the node D, and thus the potential of the node D becomes approximately VSS. Consequently, the transistor 314 is turned off. At that time, the transistor 315 is turned on, so that electrical continuity between the node C and the wiring 36 is established. Then, the potential of the wiring 36 is supplied to the node C, and the potential of the node C starts to increase. Then, the potential of the node C becomes the sum of the potential of the wiring 32 (VSS) and the threshold voltage of the transistor 311 (Vth311) (VSS+Vth311). Consequently, the transistor 311 is turned on. At that time, the transistor 312 is turned on and the transistor 313 is turned off, so that electrical continuity between the wiring 32 and the wiring 37 and electrical continuity between the wiring 32 and the wiring 33 are established. Then, the potential of the wiring 37 (the voltage VSS) and the potential of the wiring 33 (the signal IN33 at a low level) are supplied to the wiring 32, and thus the potential of the wiring 37 becomes approximately VSS. Consequently, the signal SOUTi goes low. After that, the potential of the node C keeps increasing. Then, the potential of the node C becomes VDD1−Vth315 (Vth315 is the threshold voltage of the transistor 315). Consequently, the transistor 315 is turned off, and the node C becomes floating. Thus, the potential of the node C remains VDD1−Vth315.

Next, in the period T6, the signal SOUTi−1 remains high, the signal SOUTi+2 remains low, the signal IN33 goes high, the signal IN34 remains low, and the signal IN35 goes low. Consequently, the transistor 316 remains off, the transistor 317 is turned off, the transistor 318 remains off, and the transistor 319 remains on, so that electrical continuity between the node D and the wiring 37 remains established. Then, the potential of the wiring 37 (the voltage VSS) keeps being supplied to the node D, and the potential of the node D remains approximately VSS. Consequently, the transistor 314 remains off. At that time, the transistor 315 remains off. Then, the node C becomes floating, so that the potential of the node C remains VDD1−Vth315. Consequently, the transistor 311 remains on. As a result, the transistor 312 and the transistor 313 are turned off, so that electrical continuity between the wiring 32 and the wiring 33 is established. At that time, the signal IN33 goes high, and thus the potential of the wiring 32 starts to increase. At the same time, the potential of the node C increases because of a bootstrap operation. As a result, the potential of the node C increases to VDD1+Vth311+V1 (Vth311 is the threshold voltage of the transistor 311). Consequently, the potential of the wiring 32 increases to VDD1. Thus, the signal SOUTi goes high.

Next, in the period T7, the signal SOUTi−1 goes low, the signal IN34 goes high, which is different from in period T6. Consequently, the transistor 318 is turned on, and the transistor 319 is turned off. Then, the node D becomes floating, and the potential of the node D remains approximately VSS.

Next, in the period T8, the signal SOUTi−1 remains low, the signal SOUTi+2 goes high, the signal IN33 goes low, the signal IN34 remains high, and the signal IN35 goes high, so that the transistor 316 is turned on, the transistor 317 is turned on, the transistor 318 is turned on, and the transistor 319 remains off. Consequently, electrical continuity between the node D and the wiring 36 is established. Then, the potential of the wiring 36 (the voltage VDD1) is supplied to the node D, and thus the potential of the node D increases. Consequently, the transistor 314 is turned on. At that time, the transistor 315 remains off, so that electrical continuity between the node C and the wiring 37 is established. Then, the potential of the wiring 37 (the voltage VSS) is supplied to the node C, and thus the potential of the node C becomes approximately VSS. Consequently, the transistor 311 is turned off. At that time, the transistor 312 and the transistor 313 are turned on, so that electrical continuity between the wiring 32 and the wiring 33 and electrical continuity between the wiring 32 and the wiring 37 are established. Then, the potential of the wiring 37 (the voltage VSS) is supplied to the wiring 32, and thus the potential of the wiring 32 becomes approximately VSS. Thus, the signal SOUTi goes low.

Next, in the period T9, the signal IN34 goes low, which is different from in period T8. Consequently, the transistor 318 is turned off.

The above is the description of an example of the circuit 300.

Note that the gate of the transistor 317 can be connected to the wiring 34, and the gate of the transistor 318 can be connected to the wiring 35.

Note that the transistor 319 can be omitted.

Note that the transistor 312 can be omitted.

Embodiment 3

In this embodiment, examples of a display device and an example of a pixel included in the display device will be described. In particular, examples of a liquid crystal display device and an example of a pixel included in the liquid crystal display device will be described. A driver circuit of the display device in this embodiment can include the semiconductor device described in any of Embodiments 1 and 2.

First, an example of the display device in this embodiment will be described.

Figure 17A:
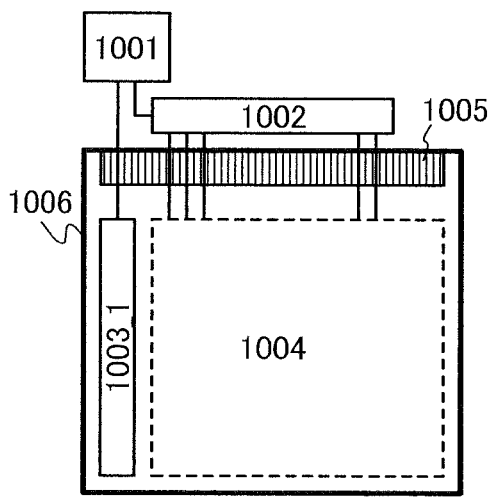
FIGS. 17A to 17D are each an example of the block diagram of a display device in Embodiment 3.

FIG. 17A shows an example of the display device in this embodiment. A display device in FIG. 17A includes a circuit 1001, a circuit 1002, a circuit 1003_1, a pixel portion 1004, and a terminal 1005. A plurality of wirings is drawn from the circuit 1003_1 and provided in the pixel portion 1004. The plurality of wirings serves as gate signal lines (also referred to as scan lines). Alternatively, a plurality of wirings is drawn from the circuit 1002 and provided in the pixel portion 1004. The plurality of wirings serves as video signal lines (also referred to as data lines). A plurality of pixels is provided in accordance with the plurality of wirings that is drawn from the circuit 1003_1 and the plurality of wirings that is drawn from the circuit 1002. However, an example of this embodiment is not limited to this. For example, the pixel portion 1004 can be provided with various other wirings. The wirings can serve as gate signal lines, data lines, power supply lines, capacity lines, or the like.

In the display device in FIG. 17A, the circuit 1003_1 is formed over a substrate 1006 over which the pixel portion 1004 is formed, and the circuit 1001 and the circuit 1002 are formed over a substrate different from the substrate over which the pixel portion 1004 is formed. The drive frequency of the circuit 1003_1 is often lower than that of the circuit 1001 or the circuit 1002. This facilitates the use of a non-single-crystal semiconductor, an amorphous semiconductor, a microcrystalline semiconductor, an oxide semiconductor, an organic semiconductor, or the like for a semiconductor layer of a transistor. Thus, the display device can be made larger. Alternatively, the display device can be manufactured at a low cost.

The circuit 1001 has a function of controlling the timing of supplying a signal, voltage, current, or the like to the circuit 1002 and the circuit 1003_1. Alternatively, the circuit 1001 has a function of controlling the circuit 1002 and the circuit 1003_1. Accordingly, the circuit 1001 serves as a controller, a control circuit, a timing generator, a power supply circuit, a regulator, or the like.

The circuit 1002 has a function of controlling the timing of supplying a video signal to the pixel portion 1004. Alternatively, the circuit 1002 has a function of controlling the luminance or the transmittance of a pixel included in the pixel portion 1004. Accordingly, the circuit 1002 serves as a driver circuit, a source driver circuit, or a signal line driver circuit.

The circuit 1003_1 has a function of controlling the timing of supplying a gate signal to the pixel portion 1004. Alternatively, the circuit 1003_1 has a function of controlling the timing of selecting a pixel. Accordingly, the circuit 1003_1 serves as a gate driver (also referred to as a scan line driver circuit).

Figure 17B:
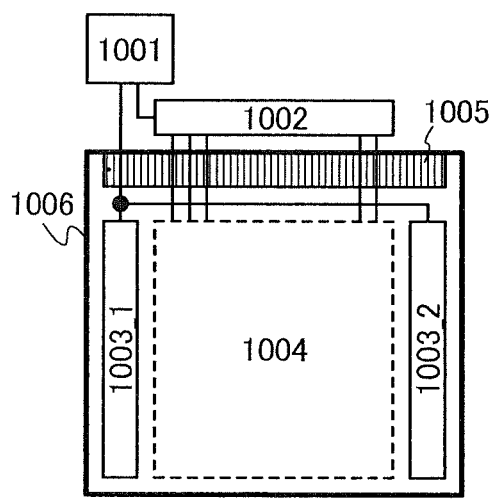
Figure 17C:
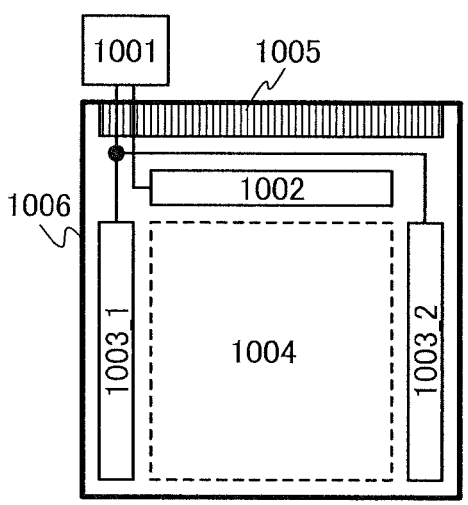

Note that the display device in this embodiment can include a circuit 1003_2 as shown in FIG. 17B. The circuit 1003_2 has a function similar to that of the circuit 1003_1. Further, the circuit 1003_1 and the circuit 10032 drive common wirings, leading to the reduction in load on the circuit 1003_1 and the circuit 10032. However, an example of this embodiment is not limited to this. For example, the circuit 1003_1 can drive odd-numbered gate signal lines and the circuit 1003_2 can drive even-numbered gate signal lines. This can lower the drive frequency of the circuit 1003_1 and the circuit 1003_2. For another example, the display device in this embodiment can include three or more circuits which have a function similar to that of the circuit 1003_1.

Note that in the display device in FIG. 17B, the circuit 1003_1 and the circuit 1003_2 are formed over the substrate 1006 over which the pixel portion 1004 is formed, and the circuit 1001 and the circuit 1002 are formed over the substrate different from the substrate over which the pixel portion 1004 is formed. The drive frequency of the circuit 1003_1 and the circuit 10032 is often lower than that of the circuit 1001 or the circuit 1002. This facilitates the use of a non-single-crystal semiconductor, an amorphous semiconductor, a microcrystalline semiconductor, an oxide semiconductor, an organic semiconductor, or the like for a semiconductor layer of a transistor. Thus, the display device can be made larger. Alternatively, the display device can be manufactured at a low cost.

Note that the circuit 1002, the circuit 1003_1, and the circuit 10032 can be formed over the substrate 1006 over which the pixel portion 1004 is formed, and the circuit 1001 can be formed over a substrate different from the substrate over which the pixel portion 1004 is formed. This reduces the number of external circuits, achieving the improvement in reliability, the reduction in manufacturing cost, or the improvement in yield.

Figure 17D:
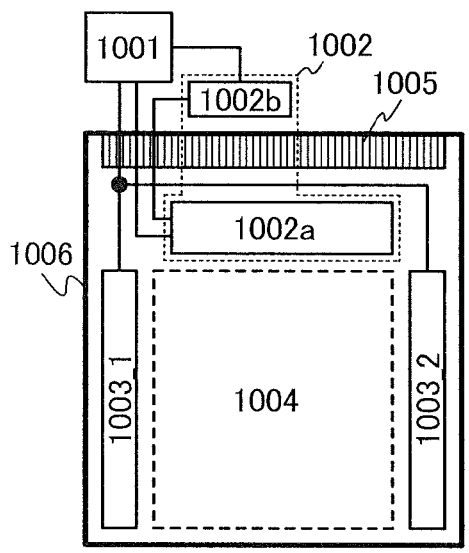

Note that a circuit 1002a which is a part of the circuit 1002, the circuit 1003_1, and the circuit 10032 can be formed over the substrate 1006 over which the pixel portion 1004 is formed, and a circuit 1002b which is another part of the circuit 1002 can be provided over a substrate different from the substrate over which the pixel portion 1004 is formed as shown in FIG. 17D. A circuit whose drive frequency is comparatively low such as a switch, a shift register, and/or a selector can be used as the circuit 1002a. This facilitates the use of a non-single-crystal semiconductor, an amorphous semiconductor, a microcrystalline semiconductor, an oxide semiconductor, an organic semiconductor, or the like for a semiconductor layer of a transistor. Thus, the display device can be made larger. Alternatively, the display device can be manufactured at a low cost.

Note that the semiconductor device in any of Embodiments 1 and 2 can be used as a part of the circuit 1003_1, the circuit 10032, the circuit 1002, and/or the circuit 1002a. This decreases the drive voltage, thereby leading to the reduction in the power consumption.

Next, an example of the pixel included in the pixel portion 1004 will be described.

Figure 17E:
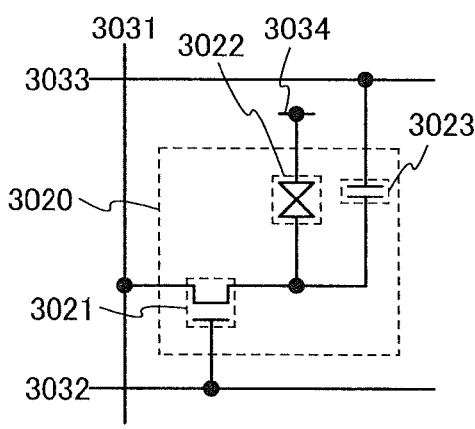
FIG. 17E is an example of the circuit diagram of a pixel in Embodiment 3.

FIG. 17E shows an example of the pixel. A pixel 3020 includes a transistor 3021, a liquid crystal element 3022, and a capacitor 3023. A first terminal of the transistor 3021 is connected to a wiring 3031. A second terminal of the transistor 3021 is connected to one electrode of the liquid crystal element 3022 and one electrode of the capacitor 3023. A gate of the transistor 3021 is connected to a wiring 3032. The other electrode of the liquid crystal element 3022 is connected to an electrode 3034. The other electrode of the capacitor 3023 is connected to a wiring 3033.

A video signal is input from the circuit 1002, which is shown in FIGS. 17A to 17D, to the wiring 3031. Consequently, the wiring 3031 serves as a video signal line (also referred to as a source signal line). A gate signal is input from the circuit 1003_1 and/or the circuit 10032, which are shown in FIGS. 17A to 17D, to the wiring 3032. Therefore, the wiring 3032 serves as a gate signal line. The wiring 3033 and the electrode 3034 are supplied with a constant voltage from the circuit 1001 shown in FIGS. 17A to 17D. Therefore, the wiring 3033 serves as a power supply line or a capacity line. Alternatively, the electrode 3034 serves as a common electrode or a counter electrode. However, an example of this embodiment is not limited to this. For example, the wiring 3031 can be supplied with a precharge voltage. The precharge voltage has approximately the same value as the voltage supplied to the electrode 3034 in many cases. For another example, the wiring 3033 can be supplied with a signal. Accordingly, a voltage applied to the liquid crystal element 3022 can be controlled, so that the amplitude of a video signal can be made small or inversion drive can be realized. For another example, the electrode 3034 can be supplied with a signal. Therefore, frame inversion drive can be realized.

The transistor 3021 has a function of controlling electrical continuity between the wiring 3031 and the one electrode of the liquid crystal element 3022. Alternatively, the transistor 3021 has a function of controlling the timing of when a video signal is written to a pixel. Accordingly, the transistor 3021 serves as a switch. The capacitor 3023 has a function of holding a potential difference between the potential of the one electrode of the liquid crystal element 3022 and the potential of the wiring 3033. Alternatively, the capacitor 3023 has a function of holding a voltage applied to the liquid crystal element 3022 constant. Thus, the capacitor serves as a storage capacitor.

Embodiment 4

In this embodiment, an example of a semiconductor device and an example of the operation of the semiconductor device will be described. In particular, an example of a signal line driver circuit and an example of the operation of the signal line driver circuit will be described.

First, an example of a signal line driver circuit in this embodiment will be described.

Figure 18A:
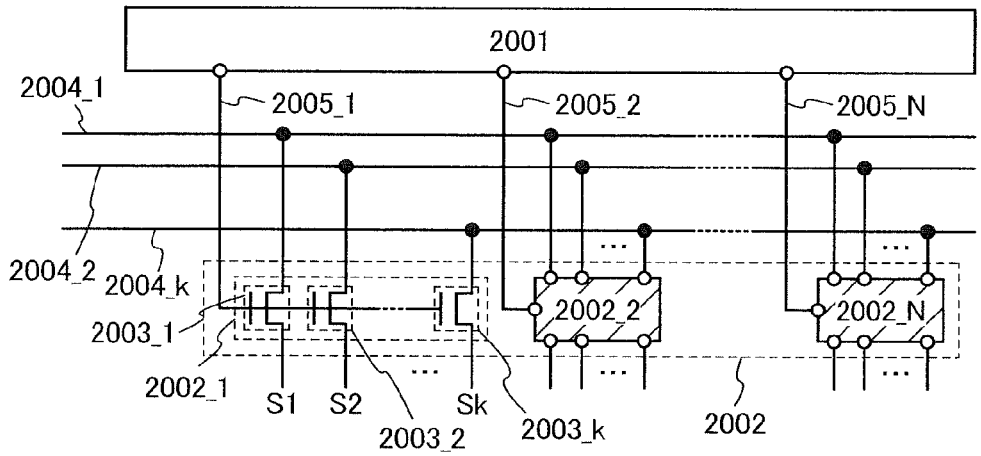
FIG. 18A is an example of the circuit diagram of a semiconductor device in Embodiment 4.

FIG. 18A shows an example of the signal line driver circuit in this embodiment. The signal line driver circuit in FIG. 18A includes a circuit 2001 and a circuit 2002. The circuit 2002 includes a plurality of circuits 2002_1 to 2002_N (N is a natural number). The circuits 2002_1 to 2002_N each include a plurality of transistors 2003_1 to 2003_k (k is a natural number). The connection relation in the signal line driver circuit in this embodiment will be described taking the circuit 2002_1 as an example. First terminals of the transistors 2003_1 to 2003_k are connected to wirings 2004_1 to 2004_k, respectively. The second terminals of the transistors 2003_1 to 2003_k are connected to wirings Si to Sk, respectively. The gates of the transistors 2003_1 to 2003_k are connected to the wiring 2005_1.

Note that the transistors 2003_1 to 2003_k are n-channel transistors. However, an example of this embodiment is not limited to this; for example, all of the transistors 2003_1 to 2003_k can be p-channel transistors.

The circuit 2001 has a function of controlling the timing of sequentially outputting high-level signals to wirings 2005_1 to 2005_N. Alternatively, the circuit 2001 has a function of sequentially selecting the circuits 2002_1 to 2002_N. Thus, the circuit 2001 serves as a shift register. However, an example of this embodiment is not limited to this. For example, the circuit 2001 can output high-level signals to the wirings 2005_1 to 2005_N in different orders. Alternatively, the circuits 2002_1 to 2002_N can be selected in different orders. Thus, the circuit 2001 can function as a decoder.

The circuit 2002_1 has a function of controlling the timing of when electrical continuity between the wirings 2004_1 to 2004_k and the wirings S1 to Sk is established. Alternatively, the circuit 2001_1 has a function of supplying the potentials of the wirings 2004_1 to 2004_k to the wirings S1 to Sk. Thus, the circuit 2002_1 can function as a selector. Note that each of the circuits 20022 to 2002_N can have a function that is similar to the function of the circuit 2002_1.

Note that each of the circuits 2002_2 to 2002_N has a similar function to that of the circuit 2002_1.

Each of the transistors 2003_1 to 2003_N has a function of controlling the timing of when electrical continuity between the wirings 2004_1 to 2004_k and the wirings S1 to Sk is established. Alternatively, each of the transistors 2003_1 to 2003_N has a function of controlling the timing of supplying the potentials of the wirings 2004_1 to 2004_k to the wirings S1 to Sk. For example, the transistor 2003_1 has a function of controlling the timing of when electrical continuity between the wiring 2004_1 and the wiring S1 is established. Alternatively, the transistor 2003_1 has a function of controlling the timing of supplying the potentials of the wiring 2004_1 to the wiring Si. Thus, each of the transistors 2003_1 to 2003_N can function as a switch.

Note that different signals are supplied to the wirings 2004_1 to 2004_k in many cases. The signals are analog signals, in particular, corresponding to image data (also referred to as image signals) in many cases. Thus, the signals can function as video signals. Accordingly, the wirings 2004_1 to 2004_k can function as signal lines. However, an example of this embodiment is not limited to this. For example, the signals can be digital signals, analog voltage, or analog current in some pixel structures.

Next, an example of the operation of the signal line driver circuit in FIG. 18A will be described.

Figure 18B:
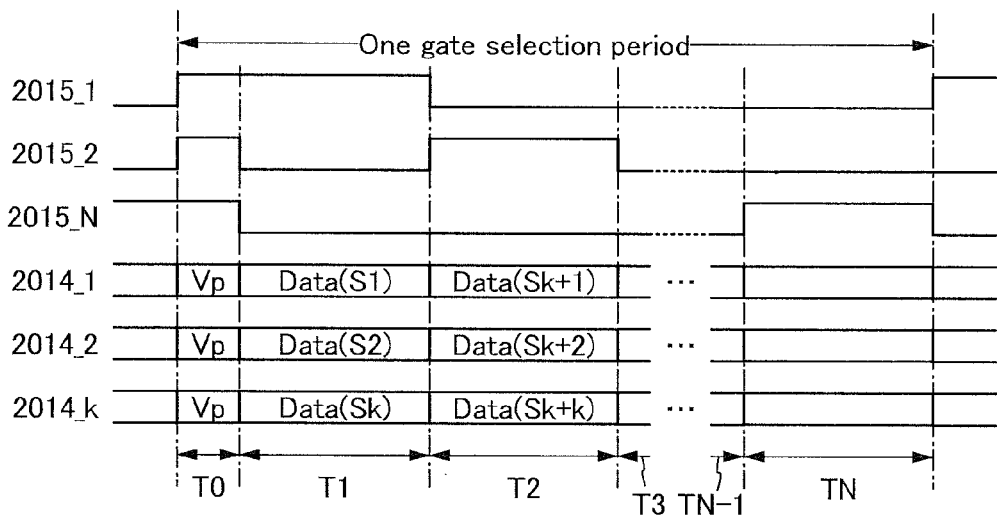
FIG. 18B is an example of the timing chart for describing the operation of the semiconductor device in Embodiment 4.

FIG. 18B shows an example of the timing chart which can be used for the signal line driver circuit in this embodiment. The timing chart in FIG. 18B shows examples of signals 2015_1 to 2015_N and signals 2014_1 to 2014_k. The signals 2015_1 to 2015_N are examples of output signals in the circuit 2001. The signals 2014_1 to 2014_k are examples of signals that are input to the wirings 2004_1 to 2004_k. Note that one operation period of the signal line driver circuit corresponds to one gate selection period of the display device. One gate selection period is divided into a period T0 and T1 to TN. The period T0 is a period for concurrently applying precharge voltage to pixels in a selected row and serves as a precharge period. Each of the periods T1 to TN is a period during which video signals are written to the pixels in the selected row and serves as a write period.

First, during the period T0, the circuit 2001 supplies high-level signals to the wirings 2005_1 to 2005_N. Then, in the circuit 2002_1, for example, the transistors 2003_1 to 2003_k are turned on so that electrical continuity between the wirings 2004_1 to 2004_k and the wirings Si to Sk is established. In this case, precharge voltage Vp is supplied to the wirings 2004_1 to 2004_k. Thus, the precharge voltage Vp is output to the wirings S1 to Sk through the transistors 2003_1 to 2003_k. Accordingly, the precharge voltage Vp is written to the pixels in the selected row, so that the pixels in the selected row are precharged.

During the periods T1 to TN, the circuit 2001 sequentially outputs high-level signals to the wirings 2005_1 to 2005_N. For example, during the period T1, the circuit 2001 outputs a high-level signal to the wirings 2005_1. Then, the transistors 2003_1 to 2003_k are turned on, so that electrical continuity between the wirings 2004_1 to 2004_k and the wirings Si to Sk is established. In this case, Data (Si) to Data (Sk) are input to the wirings 2004_1 to 2004_k, respectively. The Data (S1) to Data (Sk) are input to pixels that are in a selected row and in a first to k-th columns through the transistors 2003_1 to 2003_k, respectively. Thus, during the periods T1 to TN, video signals are sequentially written to the pixels in the selected row by k columns.

As described above, video signals are input to pixels of a plurality of columns at a time, and thus the number of video signals or the number of wirings can be reduced. Therefore, the number of connections to an external circuit can be reduced, achieving the improvement in yield, the improvement in reliability, the reduction in the number of components, and/or the reduction in cost. Alternatively, video signals are input to pixels of a plurality of columns at a time, and thus write time can be extended. This prevents the video signals from being inadequately written to the pixels, so that visual quality can be improved.

Note that the increase in k can decrease the number of connections to the external circuit. However, if k is too large, the time to input signals to pixels is shortened. Therefore, it is preferable that k≤6. It is more preferable that k≤3. It is much more preferable that k=2. However, an example of this embodiment is not limited to this.

In particular, in the case where the number of color elements of a pixel is n (n is a natural number), it is preferable that k=n or k=n×d (d is a natural number). For example, in the case where the color element of the pixel is divided into three colors: red (R), green (G), and blue (B), it is preferable that k=3 or k=3×d. However, an example of this embodiment is not limited to this. For example, in the case where the pixel is divided into m (m is a natural number) pieces of sub-pixels, k=m or k=m×d is preferable. For example, in the case where the pixel is divided into two sub-pixels, k=2 is preferable. Alternatively, in the case where the number of color elements of the pixel is n, it is preferable that k=m×n or k=m×n×d. However, an example of this embodiment is not limited to this.

Note that all of the signal line driver circuits in this embodiment can be formed over the substrate over which the pixel portion is formed, and all of the signal line driver circuits in this embodiment can be formed over a substrate (e.g., a silicon substrate or SOI substrate) different from the substrate over which the pixel portion is formed. Alternatively, a part of the signal line driver circuits in this embodiment (e.g., the circuit 2002) can be formed over the substrate over which the pixel portion is formed, and another part of the signal line driver circuits in this embodiment (e.g., the circuit 2001) can be formed over a substrate different from the substrate over which the pixel portion is formed.

Figure 18C:
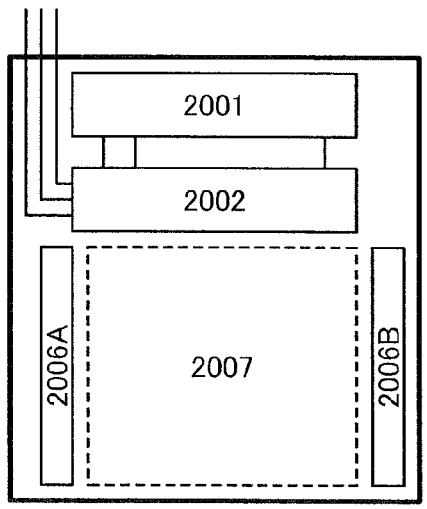
FIGS. 18C and 18D are each an example of the block diagram of a display in Embodiment 4.

FIG. 18C shows an example of the structure in which the circuit 2001 and the circuit 2002 are formed over the substrate over which the pixel portion 2007 is formed. In this structure, the number of connections between the substrate over which the pixel portion is formed and an external circuit can be reduced, achieving the improvement in yield, the improvement in reliability, the reduction in the number of components, or the reduction in cost. In particular, by also forming a scan line driver circuit 2006A and a scan line driver circuit 2006B over the substrate over which the pixel portion 2007 is formed, the number of connections to the external circuit can be further reduced.

Figure 18D:
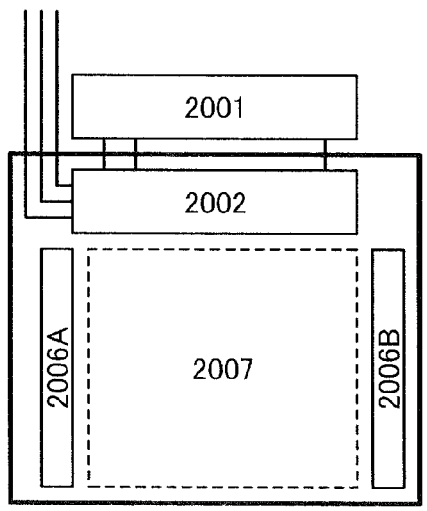

FIG. 18D shows an example of the structure in which the circuit 2002 is formed over the substrate over which the pixel portion 2007 is formed, and the circuit 2001 is formed over a substrate different from the substrate over which the pixel portion 2007 is formed. In this case also, the number of connections between the substrate over which the pixel portion is formed and the external circuit can be reduced, achieving the improvement in yield, the improvement in reliability, the reduction in the number of components, or the reduction in cost. Alternatively, the number of circuits which are formed over the substrate over which the pixel portion 2007 is formed is reduced, and thus the size of a frame can be reduced.

Note that the semiconductor device in Embodiments 1 and 2 can be used for the circuit 2001. Consequently, the drive voltage can be decreased and thus, the power consumption can be reduced. Alternatively, since all of the transistors can be n-channel transistors, the number of steps can be reduced.

Thus, the improvement in yield, the reduction in manufacturing cost, and the improvement in reliability can be achieved.

Embodiment 5

In this embodiment, an example of the structure of a semiconductor device will be described. The structure of a transistor, in particular, will be described.

First, the structure of a transistor in this embodiment will be described.

Figure 19A:
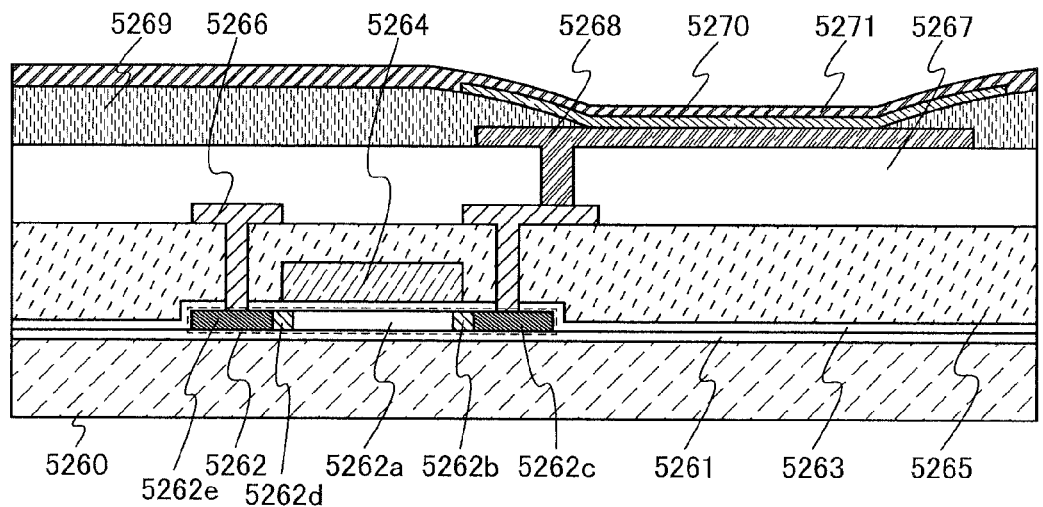
FIGS. 19A to 19C are each an example of the cross-sectional view of a semiconductor device in Embodiment 5.

FIG. 19A shows an example of a top-gate transistor and an example of a display element formed over the top-gate transistor. A transistor in FIG. 19A includes a substrate 5260; an insulating layer 5261; a semiconductor layer 5262 including a region 5262a, a region 5262b, a region 5262c, a region 5262d, and a region 5262e; an insulating layer 5263; a conductive layer 5264; an insulating layer 5265 including openings; and a conductive layer 5266. The insulating layer 5261 is formed over the substrate 5260. The semiconductor layer 5262 is formed over the insulating layer 5261. The insulating layer 5263 is formed so as to cover the semiconductor layer 5262. The conductive layer 5264 is formed over the semiconductor layer 5262 and the insulating layer 5263. The insulating layer 5265 is formed over the insulating layer 5263 and the conductive layer 5264. The conductive layer 5266 is formed over the insulating layer 5265 and in the openings formed in the insulating layer 5265. Thus, the top-gate transistor is formed.

Figure 19B:
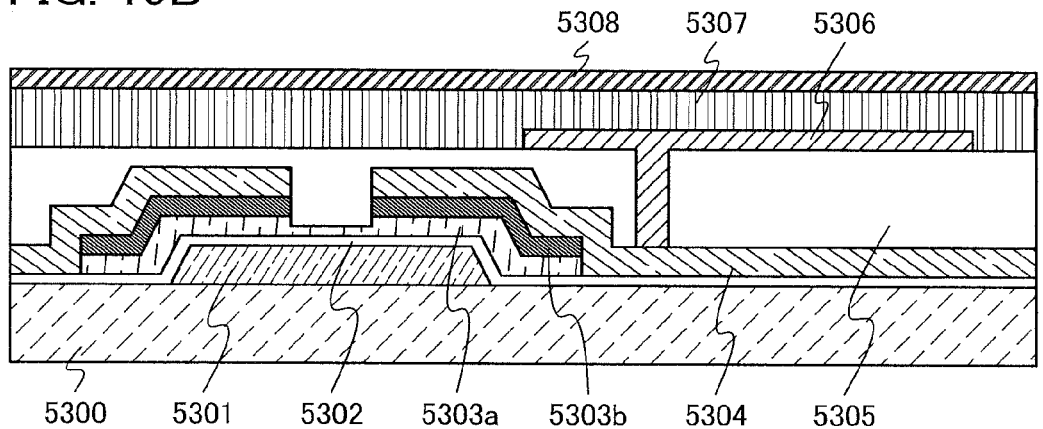

FIG. 19B shows an example of a bottom-gate transistor and an example of a display element formed over the bottom-gate transistor. A transistor in FIG. 19B includes a substrate 5300, a conductive layer 5301, an insulating layer 5302, a semiconductor layer 5303a, a semiconductor layer 5303b, a conductive layer 5304, an insulating layer 5305 including an opening, and a conductive layer 5306. The conductive layer 5301 is formed over the substrate 5300. The insulating layer 5302 is formed so as to cover the conductive layer 5301. The semiconductor layer 5303a is formed over the conductive layer 5301 and the insulating layer 5302. The semiconductor layer 5303b is formed over the semiconductor layer 5303a. The conductive layer 5304 is formed over the semiconductor layer 5303b and the insulating layer 5302. The insulating layer 5305 is formed over the insulating layer 5302 and the conductive layer 5304. The conductive layer 5306 is formed over the insulating layer 5305 and in the opening formed in the insulating layer 5305. Thus, the bottom-gate transistor is formed.

Figure 19C:
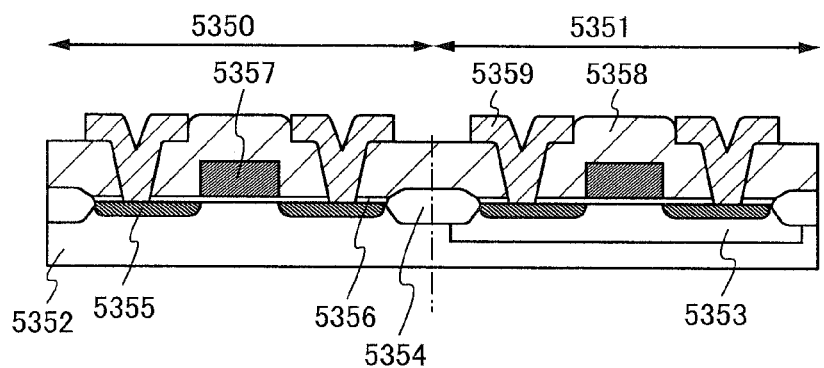

FIG. 19C shows an example of a transistor formed over a semiconductor substrate. A transistor in FIG. 19C includes a semiconductor substrate 5352 including a region 5353 and a region 5355; an insulating layer 5356; an insulating layer 5354; a conductive layer 5357; an insulating layer 5358 including openings; and a conductive layer 5359. The insulating layer 5356 is formed over the semiconductor substrate 5352. The insulating layer 5354 is formed over the semiconductor substrate 5352. The conductive layer 5357 is formed over the insulating layer 5356. The insulating layer 5358 is formed over the insulating layer 5354, the insulating layer 5356, and the conductive layer 5357. The conductive layer 5359 is formed over the insulating layer 5358 and in the openings formed in the insulating layer 5358. Thus, the transistor is formed in each of a region 5350 and a region 5351.

Note that in the case of any of the transistors in FIGS. 19A to 19C, an insulating layer 5267 including an opening, a conductive layer 5268, an insulating layer 5269 including an opening, a light-emitting layer 5270, and a conductive layer 5271 can be formed over the transistor, as shown in FIG. 19A.

The insulating layer 5267 is formed over the conductive layer 5266 and the insulating layer 5265. The conductive layer 5268 is formed over the insulating layer 5267 and in the opening formed in the insulating layer 5267. The insulating layer 5269 is formed over the insulating layer 5267 and the conductive layer 5268. The light-emitting layer 5270 is formed over the insulating layer 5269 and in the opening formed in the insulating layer 5269. The conductive layer 5271 is formed over the insulating layer 5269 and the light-emitting layer 5270.

Note that in the case of any of the transistors in FIGS. 19A to 19C, a liquid crystal layer 5307 and a conductive layer 5308 can be formed over the transistor as shown in FIG. 19B. The liquid crystal layer 5307 is formed over the insulating layer 5305 and the conductive layer 5306. The conductive layer 5308 is formed over the liquid crystal layer 5307.

Note that various components other than the layers in FIG. 19A to 19C can be formed. For example, an insulating layer which serves as an alignment film and/or an insulating layer which serves as a protruding portion can be formed over the insulating layer 5305 and the conductive layer 5306. For another example, an insulating layer which serves as a projection, a color filter, and/or a black matrix can be formed over the conductive layer 5308. For another example, an insulating layer which serves as an alignment film can be formed below the conductive layer 5308.

Note that each of the region 5262c and the region 5262e is a region to which an impurity is added and serves as a source region or a drain region. Each of the region 5262b and the region 5262d is a region to which a lower concentration of an impurity than that added to the region 5262c or the region 5262e and serves as an LDD (lightly doped drain) region. The region 5262a is a region to which an impurity is not added and serves as a channel region. However, one example of this embodiment is not limited to this. For example, an impurity can be added to the region 5262a. Thus, it is possible to improve the characteristics of the transistor and control the threshold voltage. However, the concentration of the impurity added to the region 5262a is preferably lower than the concentration of an impurity added to the region 5262b, the region 5262c, the region 5262d, or the region 5262e. For another example, the region 5262c or the region 5262e can be omitted. Alternatively, only an n-channel transistor can be provided with the region 5262c or the region 5262e.

Note that the semiconductor layer 5303b is a semiconductor layer to which phosphorus or the like is added as an impurity element and has n-type conductivity. Note that when an oxide semiconductor or a compound semiconductor is used for the semiconductor layer 5303a, the semiconductor layer 5303b can be omitted.

Note that a single crystal silicon substrate having n-type or p-type conductivity, for example, can be used as a semiconductor substrate (e.g., the semiconductor substrate 5352). In addition, the region 5353 is a region, to which an impurity has been added, in the semiconductor substrate 5352 and serves as a well. For example, when the semiconductor substrate 5352 has p-type conductivity, the region 5353 has n-type conductivity. On the other hand, for example, when the semiconductor substrate 5352 has n-type conductivity, the region 5353 has p-type conductivity. The region 5355 is a region in the semiconductor substrate 5352, to which region an impurity has been added, and serves as a source region or a drain region. Note that an LDD region can be formed in the semiconductor substrate 5352.

Next, an example of the function of each layer will be described.

The insulating layer 5261 serves as a foundation film. The insulating layer 5354 serves as a device isolation layer (e.g., a field oxide). Each of the insulating layer 5263, the insulating layer 5302, and the insulating layer 5356 serves as a gate insulating film. Each of the conductive layer 5264, the conductive layer 5301, and the conductive layer 5357 can serve as a gate electrode. Each of the insulating layer 5265, the insulating layer 5267, the insulating layer 5305, and the insulating layer 5358 serves as an interlayer or a planarizing film. Each of the conductive layer 5266, the conductive layer 5304, and the conductive layer 5359 serves as a wiring, an electrode of a transistor, an electrode of a capacitor, or the like. Each of the conductive layer 5268 and the conductive layer 5306 serves as a pixel electrode, a reflective electrode, or the like. The insulating layer 5269 serves as a partition. Each of the conductive layer 5271 and the conductive layer 5308 serves as a counter electrode, a common electrode, or the like. However, one example of this embodiment is not limited to this.

Next, the material, structure, characteristics of each layer and the like will be described.

Examples of the substrate (e.g., the substrate 5260 or the substrate 5300) include a semiconductor substrate (e.g., a single crystal substrate or a silicon substrate), an SOI substrate, a glass substrate, a quartz substrate, a plastic substrate, a metal substrate, a stainless steel substrate, a substrate containing stainless steel foil, a tungsten substrate, a substrate containing tungsten foil, a flexible substrate, a bonding film, paper containing a fibrous material, and a base film. Examples of the material for the glass substrate include a barium borosilicate glass, an aluminoborosilicate, and soda lime. Examples of the material for the flexible substrate include a flexible synthetic resin such as plastics typified by polyethylene terephthalate (PET), polyethylene naphthalate (PEN), and polyether sulfone (PES), and a flexible synthetic resin such as acrylic. Examples of the material for the bonding film include polypropylene, polyester, vinyl, polyvinyl fluoride, and polyvinyl chloride. Examples of the material for the base film include polyester, polyamide, polyimide, inorganic vapor deposition film, and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Note that it is possible to form a transistor over a substrate and then transpose the transistor to another substrate. Examples of the another substrate include, in addition to the above-described substrates, a paper substrate, a cellophane substrate, a stone substrate, a wood substrate, a cloth substrate (a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. The use of these substrates provides transistors with excellent properties, transistors which consume low power, devices with high durability, high heat resistance, light weight, or small thickness.

Note that all the circuits needed to realize a predetermined function can be formed over the same substrate (e.g., a glass substrate, a plastic substrate, a single crystal substrate, or an SOI substrate). This achieves cost reduction by the reduced number of components or the improvement in reliability by the reduced number of connection points to circuit components.

Note that it is possible to form not all the circuits needed to realize the predetermined function over the same substrate.

That is, a part of the circuits needed to realize the predetermined function can be formed over a substrate and another part of the circuits needed to realize the predetermined function can be formed over another substrate. For example, a part of the circuits needed to realize the predetermined function can be formed over a glass substrate and a part of the circuits needed to realize the predetermined function can be formed over a single crystal substrate (or an SOI substrate). Then, a single crystal substrate over which a part of the circuits needed to realize the predetermined function (such a substrate is also referred to as an IC chip) can be connected to a glass substrate by COG (chip on glass), and an IC chip can be provided over the glass substrate. Alternatively, an IC chip can be connected to a glass substrate using TAB (tape automated bonding), COF (chip on film), SMT (surface mount technology), a printed circuit board, or the like.

For example, the insulating layers (e.g., the insulating layer 5261, the insulating layer 5263, the insulating layer 5265, the insulating layer 5267, the insulating layer 5269, the insulating layer 5305, the insulating layer 5356, and the insulating layer 5358) each have a single-layer or multilayer structure of a film containing oxygen or nitrogen (e.g., silicon oxide (SiOx), silicon nitride (SiNx), silicon oxynitride (SiOxNy) (x>y>0), and silicon nitride oxide (SiNxOy) (x>y>0)), a film containing carbon (e.g., DLC (diamond-like carbon)), an organic material (e.g., siloxane resin, an epoxy, polyimide, polyamide, polyvinylphenol, benzocyclobutene, acrylic, or the like), or the like. However, one example of this embodiment is not limited to this.

Note that when the insulating layer has a two-layer structure, a silicon nitride film and a silicon oxide film are provided as a first insulating layer and a second insulating layer, respectively. When the insulating layer has a three-layer structure, a silicon oxide film, a silicon nitride film, and a silicon oxide film are provided as a first insulating layer, a second insulating layer, and a third insulating layer, respectively.

Examples of the material of the semiconductor layers (e.g., the semiconductor layer 5262, the semiconductor layer 5303a, and the semiconductor layer 5303b) include a non-single-crystal semiconductor (e.g., amorphous silicon, polycrystalline silicon, or microcrystalline silicon), a single crystal semiconductor, a compound semiconductor or an oxide semiconductor (e.g., ZnO, InGaZnO, SiGe, GaAs, IZO (indium zinc oxide), ITO (indium tin oxide), SnO, TiO, or AlZn-SnO (AZTO)), an organic semiconductor, and a carbon nanotube.

Note that using a catalyst (e.g., nickel) when manufacturing polycrystalline silicon or microcrystalline silicon further improves crystallinity and enables the manufacture of thin film transistors having excellent electric characteristics. It is thus possible to form a gate driver circuit (e.g., a scan line driver circuit), a source driver circuit (e.g., a signal line driver circuit), a part of the source driver circuit (e.g., a switch for dividing a video signal), a signal processing circuit (e.g., a signal generating circuit, a gamma correction circuit, or a DA converter circuit), or the like, over the same substrate. When microcrystalline silicon is manufactured by a catalyst (e.g., nickel), in particular, it is possible to improve crystallinity by only heat treatment without laser irradiation. Therefore, variations in the crystallinity of silicon can be reduced, leading to display of images with improved image quality. Note that it is possible to manufacture polycrystalline silicon or microcrystalline silicon without a catalyst (e.g., nickel).

Note that although preferably, crystallinity of silicon is improved to polycrystal, microcrystal, or the like in the whole panel, the present invention is not limited to this. It is acceptable that the crystallinity of silicon is improved only in part of the panel. Selective improvement in crystallinity can be achieved by selective laser irradiation or the like. For example, only the region of a circuit that needs to operate at high speed, such as the region of a peripheral circuit other than pixels, the region of a gate driver circuit and a source driver circuit, a part of the source driver circuit (e.g., an analog switch), and the like can be irradiated with laser beam. On the other hand, the need for a pixel region to operate at high speed is not considerable, and a pixel circuit can thus operate without any problems even if the crystallinity is not improved. This makes the region small whose crystallinity should be improved, thereby shortening the manufacturing process. Thus, throughput can be increased and manufacturing cost can be reduced. Alternatively, the manufacture needs the small number of manufacturing apparatuses, so that manufacturing cost can be reduced.

For example, each of the conductive layers (e.g., the conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359) is a single-layer film or a multilayer film. Examples of the material for the single-layer film include the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), gallium (Ga), indium (In), tin (Sn), zirconium (Zr), and cerium (Ce); an element selected from the above group; and a compound containing one or more elements selected from the above group. Other examples of the material for the single-layer film include a nanotube material (e.g., a carbon nanotube, an organic nanotube, an inorganic nanotube, or a metal nanotube), a film containing a polymeric material, and conductive plastic (e.g., polyethylene dioxythiophene (PEDOT)). Note that the signel-layer film can contain phosphorus (P), boron (B), arsenic (As), and/or oxygen (O).

Note that examples of the compound include a compound containing one or more elements selected from the above group (e.g., an alloy), a compound of nitrogen with one or more of elements selected from the above group (e.g., a nitride film), and a compound of silicon with one or more of elements selected from the above group (e.g., a silicide film). Examples of the alloy include indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—W), aluminum-zirconium (Al—Zr), aluminum titanium (Al—Ti), aluminum-cerium (Al—Ce), magnesium-silver (Mg—Ag), molybdenum-niobium (Mo—Nb), molybdenum-tungsten (Mo—W), and molybdenum-tantalum (Mo—Ta). Examples of the nitride film include titanium nitride, tantalum nitride, and molybdenum nitride. Examples of the silicide film include tungsten silicide, titanium silicide, nickel silicide, aluminum silicon, and molybdenum silicon.

Examples of the light-emitting layer (e.g., the light-emitting layer 5270) include an organic EL element, and an inorganic EL element. Examples of the organic EL element include a single-layer or multilayer structure of a hole injection layer using a hole injection material, a hole transport layer using a hole transport material, a light-emitting layer using a light-emitting material, an electron transport layer using an electron transport material, an electron injection layer using an electron injection material, and a layer formed by mixing a plurality of materials selected from these materials.

An example of the liquid crystal layer 5307 is an element which controls transmission or non-transmission of light by optical modulation action of liquid crystals. The element can be formed using a pair of electrodes and a liquid crystal layer. Note that the optical modulation action of liquid crystals is controlled by an electric filed applied to the liquid crystal (including a lateral electric field, a vertical electric field and a diagonal electric field). Specifically, examples of the liquid crystal element include a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a PDLC (polymer dispersed liquid crystal), a ferroelectric liquid crystal, an anti-ferroelectric liquid crystal, a main chain type liquid crystal, a side chain type polymer liquid crystal, a plasma addressed liquid crystal (PALC), a banana-shaped liquid crystal, a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, a guest-host mode, and a blue-phase mode.

Note that each layer included in the above transistor can be formed using an inkjet method or a printing method. Thus, the transistor can be manufactured at room temperature, manufactured in a low vacuum, or manufactured to be over a large substrate. The transistor thus can be manufactured without a mask (reticle), a layout of the transistor can be changed easily. Alternatively, since the transistor can be formed without use of a resist, material cost is reduced and the number of steps can be reduced. Further, since a film can be formed where needed, a material is not wasted as compared to a manufacturing method by which etching is performed after the film is formed over the entire surface, so that cost can be reduced.

The above is the description of one example of the structure of the transistor in this embodiment. However, the structure of the transistor is not limited to the above structure; the transistor can have various other structures.

For example, a MOS transistor, a junction transistor, a bipolar transistor, or the like can be used as the transistor. By using a MOS transistor, in particular, the size of the transistor can be reduced. By using a bipolar transistor, in particular, a large amount of current can flow. Thus, a circuit can be operated at high speed.

For another example, the transistor can have gate electrodes above and below a channel. A structure where the gate electrodes are provided above and below the channel gives a circuit structure where a plurality of transistors are connected in parallel. As a result, a channel region is increased, thereby increasing the current value. Alternatively, because a structure where the gate electrodes are provided above and below the channel causes a depletion layer to easily occur, a sub-threshold swing (an S value) can be reduced.

For another example, the transistor can have the structure where a gate electrode is provided above a channel region, the structure where a gate electrode is provided below a channel region, a staggered structure, an inverted staggered structure, the structure where a channel region is divided into a plurality of regions, the structure where channel regions are connected in parallel or in series, or the like.

For another example, the transistor can have the structure where the source electrode or the drain electrode overlaps with the channel region (or part thereof). The structure where the source electrode or the drain electrode overlaps with the channel region (or part thereof) prevents unstable operation due to electric charge accumulated in part of the channel region.

The transistor in this embodiment can be used for the semiconductor device or the display device in any of Embodiments 1 to 4.

Embodiment 6

An example of a cross-sectional structure of a display device will be described in this embodiment.

Figure 20A:
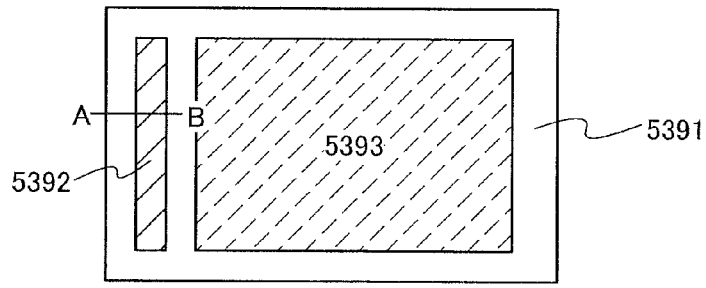
FIG. 20A is an example of the top view of a display device in Embodiment 6.

FIG. 20A shows an example of the top view of a display device. A driver circuit 5392 and a pixel portion 5393 are formed over a substrate 5391. Examples of the driver circuit 5392 include a scan line driver circuit, a signal line driver circuit, and the like.

Figure 20B:
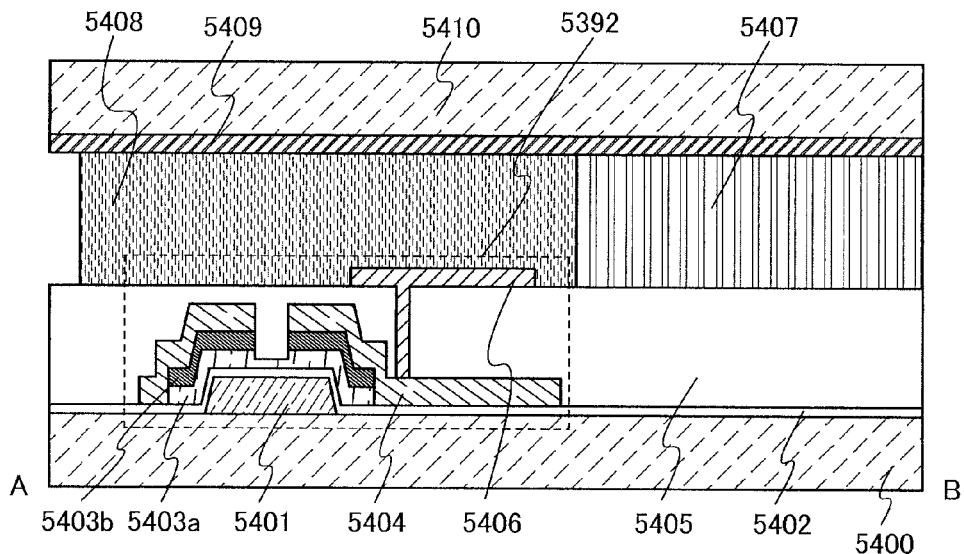
FIGS. 20B and 20C are each an example of the cross-sectional view of the display device in Embodiment 6.

FIG. 20B shows an example of a section A-B of a display device in FIG. 20A. The display device includes a substrate 5400, a conductive layer 5401, an insulating layer 5402, a semiconductor layer 5403a, a semiconductor layer 5403b, a conductive layer 5404, an insulating layer 5405, a conductive layer 5406, an insulating layer 5408, a liquid crystal layer 5407, a conductive layer 5409, and a substrate 5410. The conductive layer 5401 is formed over the substrate 5400. The insulating layer 5402 is formed so as to cover the conductive layer 5401. The semiconductor layer 5403a is formed over the conductive layer 5401 and the insulating layer 5402. The semiconductor layer 5403b is formed over the semiconductor layer 5403a. The conductive layer 5404 is formed over the semiconductor layer 5403b and the insulating layer 5402. The insulating layer 5405 is formed over the insulating layer 5402 and the conductive layer 5404 and has an opening. The conductive layer 5406 is formed over the insulating layer 5405 and in the openings formed in the insulating layer 5405. The liquid crystal layer 5407 is formed over the insulating layer 5405. The insulating layer 5408 is formed over the insulating layer 5405 and the conductive layer 5406. The conductive layer 5409 is formed over the liquid crystal layer 5407 and the insulating layer 5405.

The conductive layer 5401 serves as a gate electrode. The insulating layer 5402 can serve as a gate insulating film. The conductive layer 5404 can serve as a wiring, an electrode of a transistor, an electrode of a capacitor, or the like. The insulating layer 5405 can serve as an interlayer or a planarizing film. The conductive layer 5406 can serve as a wiring, a pixel electrode, or a reflecting electrode. The insulating layer 5408 can serve as a sealant. The conductive layer 5409 can serve as a counter electrode or a common electrode.

Here, parasitic capacitance can exist between the driver circuit 5392 and the conductive layer 5409. Accordingly, an output signal from the driver circuit 5392 or the potential of each node can be distorted or delayed. This increases power consumption. However, the insulating layer 5408, which can serve as a sealant, formed over the driver circuit 5392 as shown in FIG. 20B can reduce parasitic capacitance between the driver circuit 5392 and the conductive layer 5409. This is because the dielectric constant of the sealant is often lower than the dielectric constant of the liquid crystal layer. Therefore, distortion or delay of the output signal from the driver circuit 5392 or the potential of each node can be reduced. This reduces the power consumption.

Figure 20C:
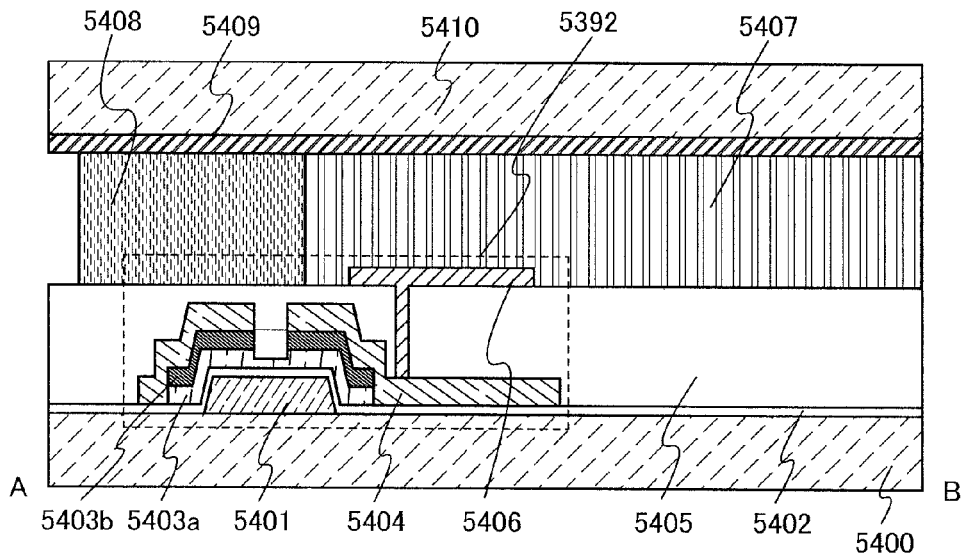

Note that as shown in FIG. 20C, the insulating layer 5408 which can serve as a sealant can be formed over a part of the driver circuit 5392. Even in such a case also, parasitic capacitance between the driver circuit 5392 and the conductive layer 5409 can be reduced, and thus distortion or delay of the output signal from the driver circuit 5392 or distortion or delay of the potential of each node can be reduced.

Note that a display element is not limited to a liquid crystal element; a variety of display elements such as an EL element and an electrophoretic element can be used.

Note that the structure of the display device in this embodiment can be applied to the semiconductor device or display device in Embodiments 1 to 5. For example, in the case where a non-single-crystal semiconductor, a microcrystalline semiconductor, an organic semiconductor, an oxide semiconductor, or the like is used for a semiconductor layer of a transistor, the channel width of the transistor is often large. However, by reducing parasitic capacitance of the driver circuit as in this embodiment, the channel width of the transistor can be made small. This reduces a layout area, so that the frame of the display device can be made small. Alternatively, the display device can have higher definition.

Embodiment 7

In this embodiment, an example of a semiconductor device and an example of a manufacturing process of the semiconductor device will be described. In particular, an example of the manufacturing process of a transistor and an example of the manufacturing process of a capacitor will be described. In particular, a manufacturing process where an oxide semiconductor is used for a semiconductor layer will be described.

Figure 21A:
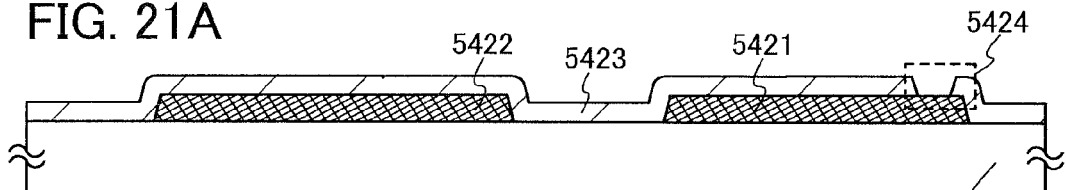
FIGS. 21A to 21E are each an example of the view showing a manufacturing process of a semiconductor device in Embodiment 7.
Figure 21B:
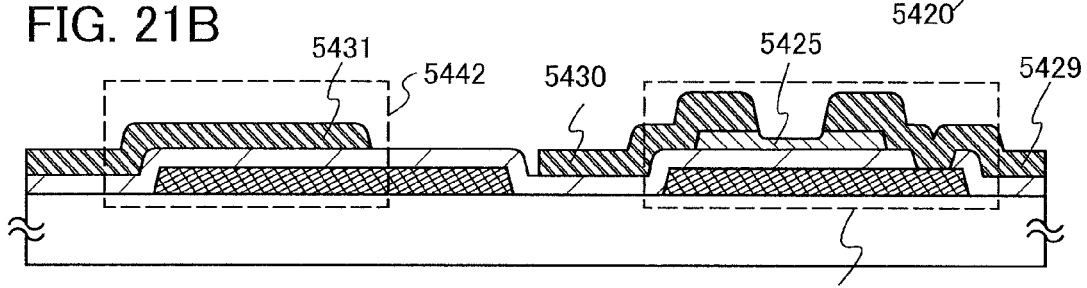
Figure 21C:
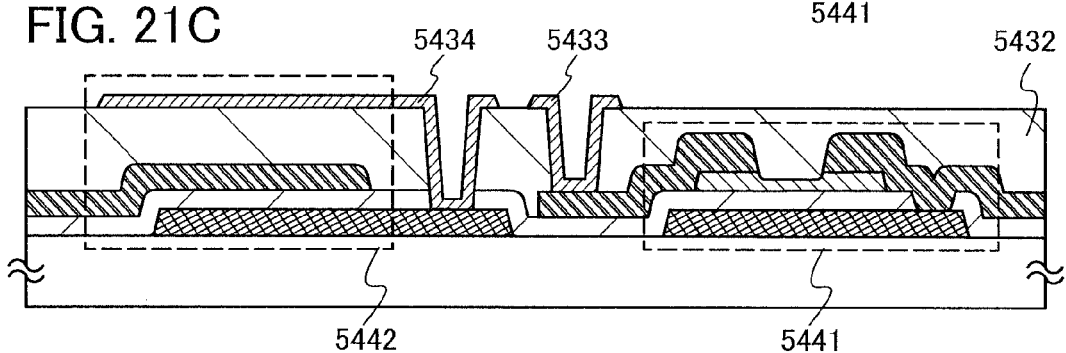

FIGS. 21A to 21C show an example of the manufacturing process of a transistor and a capacitor. A transistor 5441 is an inverted staggered thin film transistor. In the transistor 5441, a wiring is provided over an oxide semiconductor layer with a source electrode or a drain electrode therebetween.

First, a first conductive layer is formed over the entire surface of a substrate 5420 by sputtering. Next, the first conductive layer is selectively etched with the use of a resist mask formed through a photolithography process using a first photomask, forming a conductive layer 5421 and a conductive layer 5422. The conductive layer 5421 can serve as a gate electrode. The conductive layer 5422 can serve as one of electrodes of the capacitor. Note that an example of this embodiment is not limited to this; each of the conductive layers 5421 and 5422 can include a portion serving as a wiring, a gate electrode, or an electrode of the capacitor. After that, the resist mask is removed.

Next, an insulating layer 5423 is formed by plasma-enhanced CVD or sputtering. The insulating layer 5423 can serve as a gate insulating layer and is formed so as to cover the conductive layers 5421 and 5422. Note that the thickness of the insulating layer 5423 is often 50 to 250 nm.

Next, the insulating layer 5423 is selectively etched with the use of a resist mask formed through a photolithography process using a second photomask, so that a contact hole 5424 which reaches the conductive layer 5421 is formed. Then, the resist mask is removed. Note that an example of this embodiment is not limited to this; the contact hole 5424 can be omitted. Alternatively, the contact hole 5424 can be formed after an oxide semiconductor layer is formed. A cross-sectional view of the steps so far corresponds to FIG. 21A.

Next, an oxide semiconductor layer is formed over the entire surface by sputtering. Note that an example of this embodiment is not limited to this; it is possible to form the oxide semiconductor layer by sputtering and to form a buffer layer (e.g., an n$^+$ layer) thereover. Note that the thickness of the oxide semiconductor layer is often 5 to 200 nm.

Next, the oxide semiconductor layer is selectively etched using a third photomask. After that, the resist mask is removed.

Next, a second conductive layer is formed over the entire surface by sputtering. Then, the second conductive layer is selectively etched with the use of a resist mask formed through a photolithography process using a fourth photomask, so that a conductive layer 5429, a conductive layer 5430, and a conductive layer 5431 are formed. The conductive layer 5429 is connected to the conductive layer 5421 through the contact hole 5424. The conductive layers 5429 and 5430 can serve as the source electrode and the drain electrode. The conductive layer 5431 can serve as the other of the electrodes of the capacitor. Note that this embodiment is not limited to this; each of the conductive layers 5429, 5430, and 5431 can include a portion serving as a wiring, the source electrode, the drain electrode, or the electrode of the capacitor. A cross-sectional view of the steps so far corresponds to FIG. 21B.

Next, heat treatment is performed at 200 to 600° C. in an air atmosphere or a nitrogen atmosphere. This heat treatment leads to rearrangement of an In—Ga—Zn—O based non-single-crystal layer at an atomic level. In this manner, through heat treatment (the heat treatment can be annealing with light), strain which inhibits carrier movement is released. Note that there is no particular limitation on the timing of when the heat treatment is performed, and the heat treatment can be performed at different timings after the oxide semiconductor layer is formed.

Next, an insulating layer 5432 is formed over the entire surface. The insulating layer 5432 can be either single-layer or multilayer. For example, in the case where an organic insulating layer is used as the insulating layer 5432, the organic insulating layer is formed in such a manner that a composition which is a material for the organic insulating layer is applied and subjected to heat treatment at 200 to 600° C. in an air atmosphere or a nitrogen atmosphere. By forming the organic insulating layer that is in contact with the oxide semiconductor layer in this manner, a thin film transistor which has high reliability in terms of electric characteristics can be made. Note that in the case where an organic insulating layer is used as the insulating layer 5432, a silicon nitride film or a silicon oxide film can be provided below the organic insulating layer.

Next, a third conductive layer is formed over the entire surface. Then, the third conductive layer is selectively etched with the use of a resist mask formed through a photolithography process using a fifth photomask, so that a conductive layer 5433 and a conductive layer 5434 are formed. A cross-sectional view of the steps so far corresponds to FIG. 21C. Each of the conductive layers 5433 and 5434 can serve as a wiring, a pixel electrode, a reflecting electrode, a light-transmitting electrode, or the electrode of the capacitor. In particular, since the conductive layer 5434 is connected to the conductive layer 5422, the conductive layer 5434 can serve as the electrode of the capacitor 5442. Note that an example of this embodiment is not limited to this; the conductive layers 5433 and 5434 can have the function of connecting the first conductive layer to the second conductive layer to each other. For example, by connecting the conductive layers 5433 and 5434 to each other, the conductive layer 5422 and the conductive layer 5430 can be connected to each other with the third conductive layer (the conductive layers 5433 and 5434) therebetween.

The transistor 5441 and the capacitor 5442 can be manufactured through the above steps. The transistor in this embodiment can be used for the semiconductor device or display device in Embodiments 1 to 8.

Figure 21D:
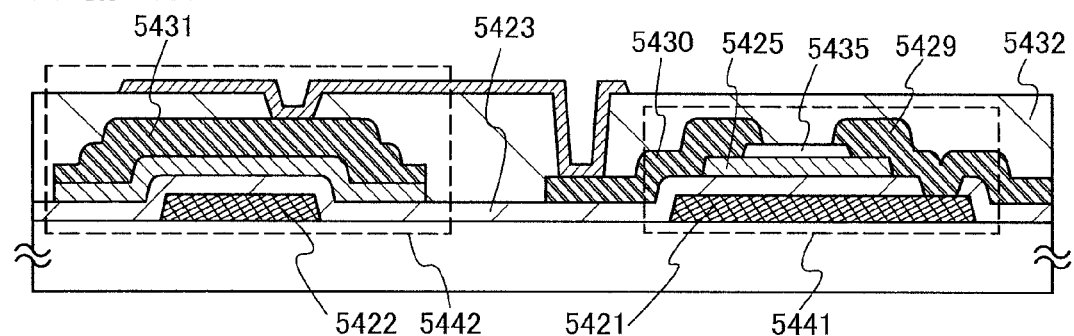

Note that as shown in FIG. 21D, an insulating layer 5435 can be formed over the oxide semiconductor layer 5425.

Figure 21E:
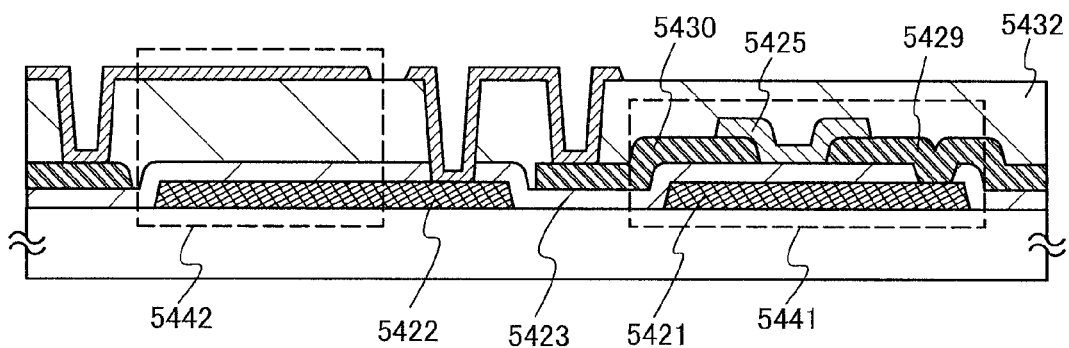

Note that as shown in FIG. 21E, the oxide semiconductor layer 5425 can be formed after the second conductive layer is patterned.

Note that for the substrate, the insulating film, the conductive film, and the semiconductor layer in this embodiment, the materials described in the other embodiments or the materials described in this specification can be used.

Embodiment 8

In this embodiment, examples of an electronic appliance are described.

FIGS. 22A to 22H and FIGS. 23A to 23D show electronic appliances. These electronic appliances can each include a housing 5000, a display portion 5001, a speaker 5003, an LED lamp 5004, operation keys 5005 (including a power switch or an operation switch), a connection terminal 5006, a sensor 5007 (a sensor having the function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 22A:
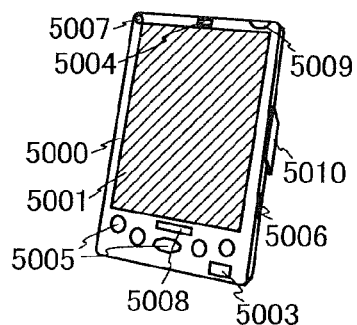
FIGS. 22A to 22H are each an example of the view showing an electronic appliance in Embodiment 8.
Figure 22B:
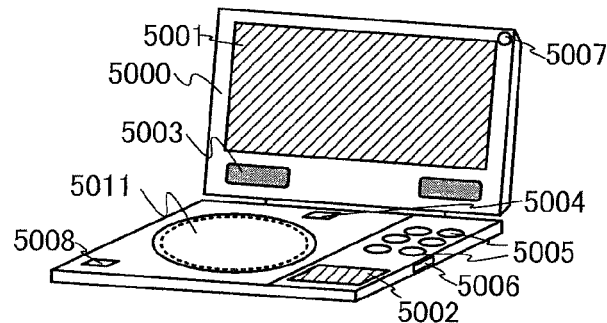
Figure 22C:
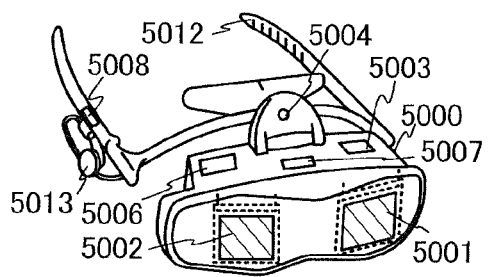
Figure 22D:
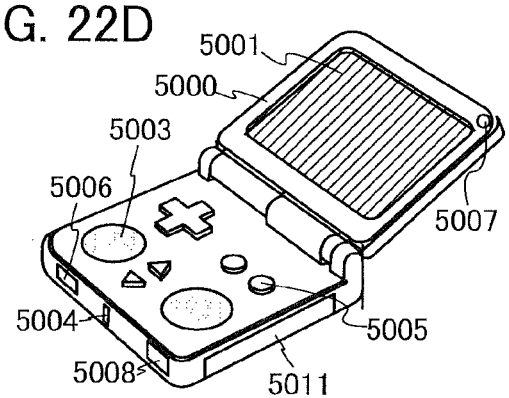
Figure 22E:
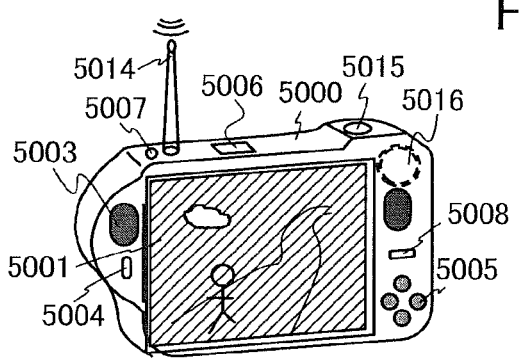
Figure 22F:
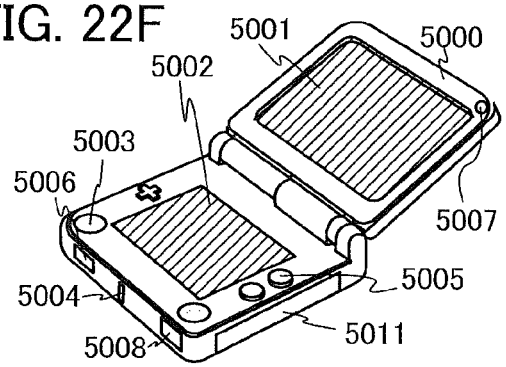
Figure 22G:
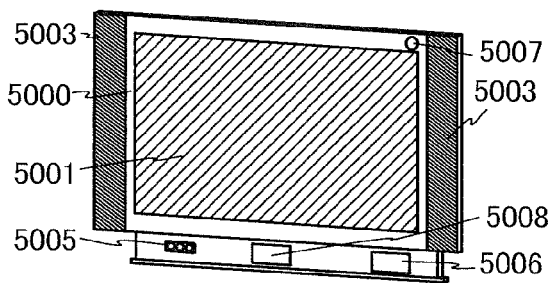
Figure 22H:
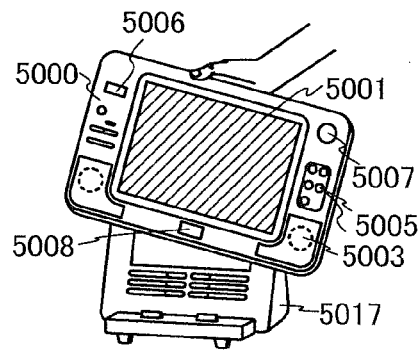
Figure 23A:
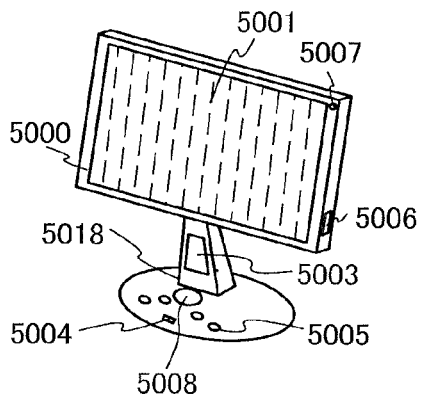
FIGS. 23A to 23H are each an example of the diagram showing an electronic appliance in Embodiment 8.
Figure 23B:
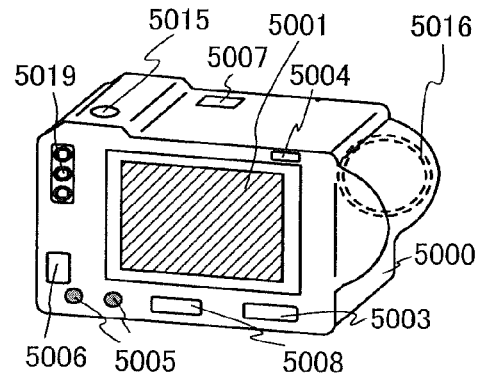
Figure 23C:
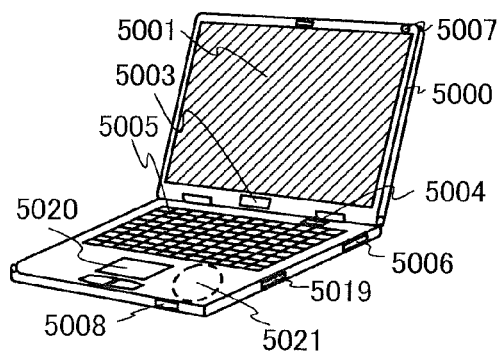
Figure 23D:
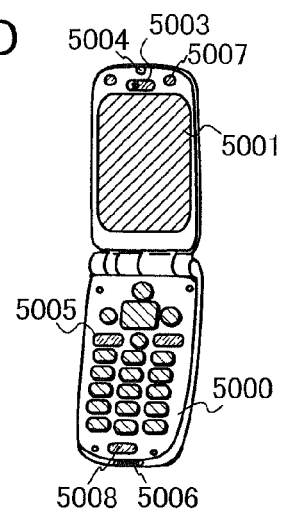

FIG. 22A shows a mobile computer, which can include a switch 5009, an infrared port 5010, and the like in addition to the above objects. FIG. 22B shows a portable image reproducing device provided with a memory medium (e.g., a DVD reproducing device) that can include a second display portion 5002, a memory medium reading portion 5011, and the like in addition to the above objects. FIG. 22C shows a goggle-type display that can include the second display portion 5002, a support portion 5012, an earphone 5013, and the like in addition to the above objects. FIG. 22D shows a portable game machine that can include the memory medium reading portion 5011 and the like in addition to the above objects. FIG. 22E shows a digital camera with a television receiver function which can include an antenna 5014, a shutter button 5015, an image receiving portion 5016, and the like in addition to the above objects. FIG. 22F shows a portable game console that can include the second display portion 5002, the memory medium reading portion 5011, and the like in addition to the above objects. FIG. 22G shows a television receiver that can include a tuner, an image processing portion, and the like in addition to the above objects. FIG. 22H shows a portable television receiver that can include a charger 5017 capable of transmitting and receiving signals and the like in addition to the above objects. FIG. 23A shows a display that can include a support 5018 and the like in addition to the above objects. FIG. 23B shows a camera that can include an external connection port 5019, a shutter button 5015, an image receiving portion 5016, and the like in addition to the above objects. FIG. 23C shows a computer that can include a pointing device 5020, the external connection port 5019, a reader/writer 5021, and the like in addition to the above objects. FIG. 23D shows a mobile phone that can include a transmitter, a receiver, a tuner of one-segment (1 seg digital TV broadcasts) partial reception service for mobile phones and mobile terminals, and the like in addition to the above objects.

The electronic appliances shown in FIGS. 22A to 22H and FIGS. 23A to 23D can have a variety of functions, for example, the function of displaying a lot of information (e.g., a still image, a moving image, and a text image) on a display portion; a touch panel function; the function of displaying a calendar, date, time, and the like; the function of controlling processing with a lot of software (programs); a wireless communication function; the function of being connected to a variety of computer networks with a wireless communication function; the function of transmitting and receiving a lot of data with a wireless communication function; the function of reading a program or data stored in a memory medium and displaying the program or data on a display portion. Further, the electronic appliance including a plurality of display portions can have the function of displaying image information mainly on one display portion while displaying text information on another display portion, the function of displaying a three-dimensional image by displaying images where parallax is considered on a plurality of display portions, or the like. Furthermore, the electronic appliance including an image receiving portion can have the function of photographing a still image, the function of photographing a moving image, the function of automatically or manually correcting a photographed image, the function of storing a photographed image in a memory medium (an external memory medium or a memory medium incorporated in the camera), the function of displaying a photographed image on the display portion, or the like. Note that functions that can be provided for the electronic appliances shown in FIGS. 22A to 22H and FIGS. 23A to 23D are not limited them, and the electronic appliances can have a variety of functions.

The electronic appliances in this embodiment each include a display portion for displaying some kind of information. The use of the semiconductor device which is described or display device in Embodiments 1 to 9 as the display portion reduces manufacturing cost and improves reliability or yield.

Next, example applications for the semiconductor device will be described.

Figure 23E:
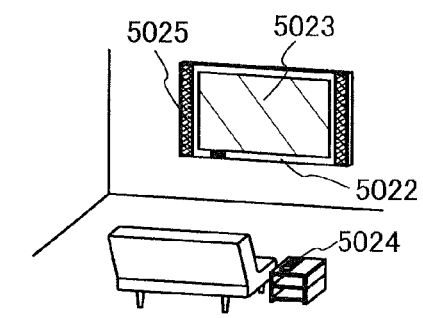

FIG. 23E shows an example in which a semiconductor device is incorporated in a building structure. FIG. 23E shows a housing 5022, a display portion 5023, a remote controller 5024 which is an operating portion, a speaker 5025, and the like. The semiconductor device is incorporated in the building structure so as to be hung on the wall; the semiconductor device can be provided without a large space.

Figure 23F:
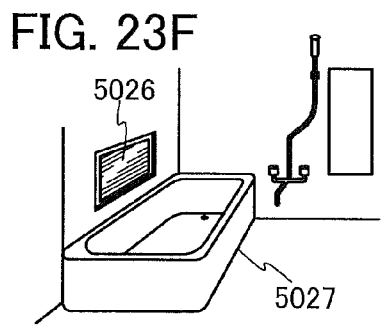

FIG. 23F shows another example in which a semiconductor device is incorporated in a building structure. A display panel 5026 is incorporated in a prefabricated bath unit 5027, so that a bather can view the display panel 5026.

Note that although in this embodiment, the wall and the prefabricated bath are given as examples of the building structure, this embodiment is not limited to this. The semiconductor devices can be provided in a variety of building structures.

Next, examples in which semiconductor devices are incorporated in moving objects will be described.

Figure 23G:
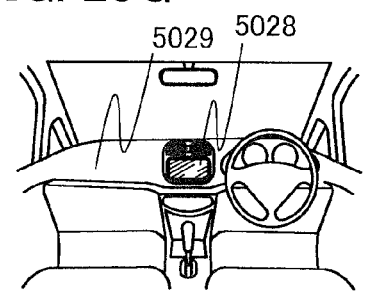

FIG. 23G shows an example in which a semiconductor device is incorporated in a car. A display panel 5028 is incorporated in a car body 5029 of the car and can display information related to the operation of the car or information input from inside or outside of the car on demand. Note that the display panel 5028 can have a navigation function.

Figure 23H:
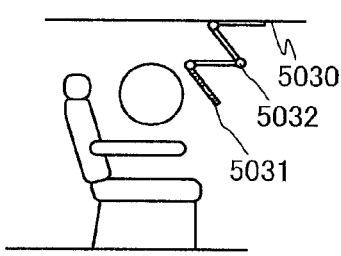

FIG. 23H shows an example in which a semiconductor device is incorporated in a passenger airplane. FIG. 23H shows a usage pattern when a display panel 5031 is provided to a ceiling 5030 which is above a seat of the passenger airplane. The display panel 5031 is incorporated in the ceiling 5030 through a hinge portion 5032, and a passenger can view the display panel 5031 by stretching of the hinge portion 5032. The display panel 5031 has a function of displaying information by the operation of the passenger.

Note that although bodies of a car and an airplane are shown as examples of moving objects in this embodiment, this embodiment is not limited thereto. The semiconductor devices can be provided to a variety of objects such as two-wheeled vehicles, four-wheeled vehicles (including cars, buses, and the like), trains (including monorails, railroads, and the like), and vessels.

This application is based on Japanese Patent Application serial no. 2009-214848 filed with Japan Patent Office on Sep. 16, 2009, the entire contents of which are hereby incorporated by reference.

What is claimed is:

1. A semiconductor device comprising:
   a first transistor;
   a second transistor;
   a third transistor;
   a fourth transistor;
   a fifth transistor; and
   a sixth transistor,
   wherein a first terminal of the first transistor is electrically connected to a first wiring, and a second terminal of the first transistor is electrically connected to a second wiring,
   wherein a first terminal of the second transistor is electrically connected to a third wiring, and a second terminal of the second transistor is electrically connected to the second wiring,
   wherein a first terminal of the third transistor is electrically connected to the first wiring or a ninth wiring, a second terminal of the third transistor is electrically connected to a gate of the first transistor, and a gate of the third transistor is electrically connected to a fourth wiring,
   wherein a first terminal of the fourth transistor is electrically connected to a seventh wiring, a second terminal of the fourth transistor is electrically connected to the gate of the first transistor, and a gate of the fourth transistor is electrically connected to a gate of the second transistor,
   wherein a first terminal of the fifth transistor is electrically connected to a fifth wiring, a second terminal of the fifth transistor is electrically connected to the gate of the second transistor, and a gate of the fifth transistor is electrically connected to a sixth wiring, and
   wherein a first terminal of the sixth transistor is electrically connected to an eighth wiring, a second terminal of the sixth transistor is electrically connected to the gate of the second transistor, and a gate of the sixth transistor is electrically connected to the fourth wiring.

2. A semiconductor device comprising:
   a first transistor;
   a second transistor;
   a third transistor;
   a fourth transistor;
   a fifth transistor; and
   a sixth transistor,
   wherein a first terminal of the first transistor is electrically connected to a first wiring, and a second terminal of the first transistor is electrically connected to a second wiring,
   wherein a first terminal of the second transistor is electrically connected to a third wiring, and a second terminal of the second transistor is electrically connected to the second wiring,
   wherein a first terminal of the third transistor is electrically connected to a gate of the third transistor, a second terminal of the third transistor is electrically connected to a gate of the first transistor, and the gate of the third transistor is electrically connected to a fourth wiring,
   wherein a first terminal of the fourth transistor is electrically connected to the third wiring, a second terminal of the fourth transistor is electrically connected to the gate of the first transistor, and a gate of the fourth transistor is electrically connected to a gate of the second transistor,
   wherein a first terminal of the fifth transistor is electrically connected to a fifth wiring, a second terminal of the fifth transistor is electrically connected to the gate of the second transistor, and a gate of the fifth transistor is electrically connected to the second terminal of the fifth transistor, and
   wherein a first terminal of the sixth transistor is electrically connected to the third wiring, a second terminal of the sixth transistor is electrically connected to the gate of the second transistor, and a gate of the sixth transistor is electrically connected to the fourth wiring.

3. A semiconductor device comprising:
   a first transistor;
   a second transistor;
   a third transistor;
   a fourth transistor;
   a fifth transistor; and
   a sixth transistor,
   wherein a first terminal of the first transistor is electrically connected to a first wiring, and a second terminal of the first transistor is electrically connected to a second wiring,
   wherein a first terminal of the second transistor is electrically connected to a third wiring, and a second terminal of the second transistor is electrically connected to the second wiring,
   wherein a first terminal of the third transistor is electrically connected to a gate of the third transistor, a second terminal of the third transistor is electrically connected to a gate of the first transistor, and the gate of the third transistor is electrically connected to a fourth wiring,
   wherein a first terminal of the fourth transistor is electrically connected to the third wiring, a second terminal of the fourth transistor is electrically connected to the gate of the first transistor, and a gate of the fourth transistor is electrically connected to a gate of the second transistor,
   wherein a first terminal of the fifth transistor is electrically connected to the first wiring, a second terminal of the fifth transistor is electrically connected to the gate of the second transistor, and a gate of the fifth transistor is electrically connected to a sixth wiring, and
   wherein a first terminal of the sixth transistor is electrically connected to the third wiring, a second terminal of the sixth transistor is electrically connected to the gate of the second transistor, and a gate of the sixth transistor is electrically connected to the fourth wiring.

4. A semiconductor device comprising:
   a first transistor;
   a second transistor;
   a third transistor;
   a fourth transistor;
   a fifth transistor; and
   a sixth transistor,
   wherein a first terminal of the first transistor is electrically connected to a first wiring, and a second terminal of the first transistor is electrically connected to a second wiring, wherein a first terminal of the second transistor is electrically connected to a third wiring, and a second terminal of the second transistor is electrically connected to the second wiring, wherein a first terminal of the third transistor is electrically connected to a gate of the third transistor, a second terminal of the third transistor is electrically connected to a gate of the first transistor, and the gate of the third transistor is electrically connected to a fourth wiring, wherein a first terminal of the fourth transistor is electrically connected to the third wiring, a second terminal of the fourth transistor is electrically connected to the gate of the first transistor, and a gate of the fourth transistor is electrically connected to a gate of the second transistor, wherein a first terminal of the fifth transistor is electrically connected to a fifth wiring, a second terminal of the fifth transistor is electrically connected to the gate of the second transistor, and a gate of the fifth transistor is electrically connected to the fifth wiring, wherein a first terminal of the sixth transistor is electrically connected to the third wiring, a second terminal of the sixth transistor is electrically connected to the gate of the second transistor, and a gate of the sixth transistor is electrically connected to the fourth wiring, wherein a channel width of the first transistor is larger than a channel width of the third transistor, wherein a channel width of the first transistor is larger than a channel width of the fourth transistor, wherein a channel width of the first transistor is larger than a channel width of the fifth transistor, and wherein a channel width of the first transistor is larger than a channel width of the sixth transistor.

5. A semiconductor device comprising:
a first transistor;
a second transistor;
a third transistor;
a fourth transistor;
a fifth transistor; and
a sixth transistor, wherein a first terminal of the first transistor is electrically connected to a first wiring, and a second terminal of the first transistor is electrically connected to a second wiring, wherein a first terminal of the second transistor is electrically connected to a third wiring, and a second terminal of the second transistor is electrically connected to the second wiring, wherein a first terminal of the third transistor is electrically connected to a gate of the third transistor, a second terminal of the third transistor is electrically connected to a gate of the first transistor, and the gate of the third transistor is electrically connected to a fourth wiring, wherein a first terminal of the fourth transistor is electrically connected to the third wiring, a second terminal of the fourth transistor is electrically connected to the gate of the first transistor, and a gate of the fourth transistor is electrically connected to a gate of the second transistor, wherein a first terminal of the fifth transistor is electrically connected to a fifth wiring, a second terminal of the fifth transistor is electrically connected to the gate of the second transistor, and a gate of the fifth transistor is electrically connected to the first wiring, and wherein a first terminal of the sixth transistor is electrically connected to the third wiring, a second terminal of the sixth transistor is electrically connected to the gate of the second transistor, and a gate of the sixth transistor is electrically connected to the fourth wiring.

6. A semiconductor device comprising:
a capacitor;
a first transistor;
a second transistor;
a third transistor;
a fourth transistor;
a fifth transistor; and
a sixth transistor, wherein a first terminal of the first transistor is electrically connected to a first wiring, and a second terminal of the first transistor is electrically connected to a second wiring, wherein a first terminal of the second transistor is electrically connected to a third wiring, and a second terminal of the second transistor is electrically connected to the second wiring, wherein a first terminal of the third transistor is electrically connected to the first wiring, a second terminal of the third transistor is electrically connected to a gate of the first transistor, and a gate of the third transistor is electrically connected to a fourth wiring, wherein a first terminal of the fourth transistor is electrically connected to the third wiring, a second terminal of the fourth transistor is electrically connected to the gate of the first transistor, and a gate of the fourth transistor is electrically connected to a gate of the second transistor, wherein a first terminal of the fifth transistor is electrically connected to a fifth wiring, a second terminal of the fifth transistor is electrically connected to the gate of the second transistor, and a gate of the fifth transistor is electrically connected to any one of the first wiring, the fifth wiring, and a sixth wiring, and wherein a first terminal of the sixth transistor is electrically connected to the third wiring, a second terminal of the sixth transistor is electrically connected to the gate of the second transistor, and a gate of the sixth transistor is electrically connected to the fourth wiring, wherein the capacitor is electrically connected to the gate of the second transistor and one of the first wiring, the fifth wiring, and the sixth wiring.

7. A semiconductor device comprising:
a capacitor;
a first transistor;
a second transistor;
a third transistor;
a fourth transistor;
a fifth transistor; and
a sixth transistor, wherein a first terminal of the first transistor is electrically connected to a first wiring, and a second terminal of the first transistor is electrically connected to a second wiring, wherein a first terminal of the second transistor is electrically connected to a third wiring, and a second terminal of the second transistor is electrically connected to the second wiring, wherein a first terminal of the third transistor is electrically connected to a seventh wiring or a gate of the third transistor, a second terminal of the third transistor is electrically connected to a gate of the first transistor, and the gate of the third transistor is electrically connected to a fourth wiring, wherein a first terminal of the fourth transistor is electrically connected to the third wiring, a second terminal of the fourth transistor is electrically connected to the gate of the first transistor, and a gate of the fourth transistor is electrically connected to a gate of the second transistor, wherein a first terminal of the fifth transistor is electrically connected to a fifth wiring, a second terminal of the fifth transistor is electrically connected to the gate of the second transistor, and a gate of the fifth transistor is electrically connected to a sixth wiring, and wherein a first terminal of the sixth transistor is electrically connected to the third wiring, a second terminal of the sixth transistor is electrically connected to the gate of the second transistor, and a gate of the sixth transistor is electrically connected to the fourth wiring, wherein the capacitor is electrically connected to the gate of the second transistor and one of the first wiring, the fifth wiring, and the sixth wiring.

8. A semiconductor device comprising:
a capacitor;
a first transistor;
a second transistor;
a third transistor;
a fourth transistor;
a fifth transistor; and
a sixth transistor,
wherein a first terminal of the first transistor is electrically connected to a first wiring, and a second terminal of the first transistor is electrically connected to a second wiring, wherein a first terminal of the second transistor is electrically connected to a third wiring, and a second terminal of the second transistor is electrically connected to the second wiring, wherein a first terminal of the third transistor is electrically connected to a fourth wiring, a second terminal of the third transistor is electrically connected to a gate of the first transistor, and a gate of the third transistor is electrically connected to a fifth wiring, wherein a first terminal of the fourth transistor is electrically connected to the third wiring, a second terminal of the fourth transistor is electrically connected to the gate of the first transistor, and a gate of the fourth transistor is electrically connected to a gate of the second transistor, wherein a first terminal of the fifth transistor is electrically connected to the fifth wiring, a second terminal of the fifth transistor is electrically connected to the gate of the second transistor, and a gate of the fifth transistor is electrically connected to a sixth wiring, and wherein a first terminal of the sixth transistor is electrically connected to the third wiring, a second terminal of the sixth transistor is electrically connected to the gate of the second transistor, and a gate of the sixth transistor is electrically connected to the fourth wiring, wherein the capacitor is electrically connected to the gate of the second transistor and one of the first wiring, the fifth wiring, and the sixth wiring.

9. The semiconductor device according to claim 1,
wherein a first signal is input to the fourth wiring,
wherein a second signal is output from the second wiring, and
wherein an amplitude voltage of the second signal is higher than an amplitude voltage of the first signal.

10. The semiconductor device according to claim 9,
wherein the first signal is a digital signal,
wherein the second signal is a digital signal,
wherein the second signal is high when the first signal is high, and
wherein the second signal is low when the first signal is low.

11. The semiconductor device according to claim 2,
wherein a first signal is input to the fourth wiring,
wherein a second signal is output from the second wiring, and
wherein an amplitude voltage of the second signal is higher than an amplitude voltage of the first signal.

12. The semiconductor device according to claim 11,
wherein the first signal is a digital signal,
wherein the second signal is a digital signal,
wherein the second signal is high when the first signal is high, and
wherein the second signal is low when the first signal is low.

13. The semiconductor device according to claim 3,
wherein a first signal is input to the fourth wiring,
wherein a second signal is output from the second wiring, and
wherein an amplitude voltage of the second signal is higher than an amplitude voltage of the first signal.

14. The semiconductor device according to claim 13,
wherein the first signal is a digital signal,
wherein the second signal is a digital signal,
wherein the second signal is high when the first signal is high, and
wherein the second signal is low when the first signal is low.

15. The semiconductor device according to claim 4,
wherein a first signal is input to the fourth wiring,
wherein a second signal is output from the second wiring, and
wherein an amplitude voltage of the second signal is higher than an amplitude voltage of the first signal.

16. The semiconductor device according to claim 15,
wherein the first signal is a digital signal,
wherein the second signal is a digital signal,
wherein the second signal is high when the first signal is high, and
wherein the second signal is low when the first signal is low.

17. The semiconductor device according to claim 5,
wherein a first signal is input to the fourth wiring,
wherein a second signal is output from the second wiring, and
wherein an amplitude voltage of the second signal is higher than an amplitude voltage of the first signal.

18. The semiconductor device according to claim 17,
wherein the first signal is a digital signal,
wherein the second signal is a digital signal,
wherein the second signal is high when the first signal is high, and
wherein the second signal is low when the first signal is low.

19. The semiconductor device according to claim 6,
wherein a first signal is input to the fourth wiring,
wherein a second signal is output from the second wiring, and
wherein an amplitude voltage of the second signal is higher than an amplitude voltage of the first signal.

20. The semiconductor device according to claim 19,
wherein the first signal is a digital signal,
wherein the second signal is a digital signal,
wherein the second signal is high when the first signal is high, and
wherein the second signal is low when the first signal is low.

21. The semiconductor device according to claim 7,
wherein a first signal is input to the fourth wiring,
wherein a second signal is output from the second wiring, and wherein an amplitude voltage of the second signal is higher than an amplitude voltage of the first signal.

22. The semiconductor device according to claim 21,
wherein the first signal is a digital signal,
wherein the second signal is a digital signal,
wherein the second signal is high when the first signal is high, and
wherein the second signal is low when the first signal is low.

23. The semiconductor device according to claim 8,
wherein a first signal is input to the fourth wiring,
wherein a second signal is output from the second wiring, and
wherein an amplitude voltage of the second signal is higher than an amplitude voltage of the first signal.

24. The semiconductor device according to claim 23,
wherein the first signal is a digital signal,
wherein the second signal is a digital signal,
wherein the second signal is high when the first signal is high, and
wherein the second signal is low when the first signal is low.

25. The semiconductor device according to claim 1, wherein the fourth wiring is electrically connected to a shift register circuit.

26. The semiconductor device according to claim 2, wherein the fourth wiring is electrically connected to a shift register circuit.

27. The semiconductor device according to claim 3, wherein the fourth wiring is electrically connected to a shift register circuit.

28. The semiconductor device according to claim 4, wherein the fourth wiring is electrically connected to a shift register circuit.

29. The semiconductor device according to claim 5, wherein the fourth wiring is electrically connected to a shift register circuit.

30. The semiconductor device according to claim 6, wherein the fourth wiring is electrically connected to a shift register circuit.

31. The semiconductor device according to claim 7, wherein the fourth wiring is electrically connected to a shift register circuit.

32. The semiconductor device according to claim 8, wherein the fourth wiring is electrically connected to a shift register circuit.

33. The semiconductor device according to claim 1, wherein the first to sixth transistors are transistors comprising an oxide semiconductor.

34. The semiconductor device according to claim 2, wherein the first to sixth transistors are transistors comprising an oxide semiconductor.

35. The semiconductor device according to claim 3, wherein the first to sixth transistors are transistors comprising an oxide semiconductor.

36. The semiconductor device according to claim 4, wherein the first to sixth transistors are transistors comprising an oxide semiconductor.

37. The semiconductor device according to claim 5, wherein the first to sixth transistors are transistors comprising an oxide semiconductor.

38. The semiconductor device according to claim 6, wherein the first to sixth transistors are transistors comprising an oxide semiconductor.

39. The semiconductor device according to claim 7, wherein the first to sixth transistors are transistors comprising an oxide semiconductor.

40. The semiconductor device according to claim 8, wherein the first to sixth transistors are transistors comprising an oxide semiconductor.

41. The semiconductor device according to claim 1, wherein the first to sixth transistors are transistors comprising a material selected from the group consisting of InGaZnO, SiGe, GaAs, IZO, ITO, SnO, TiO, and AlZnSnO.

42. The semiconductor device according to claim 2, wherein the first to sixth transistors are transistors comprising a material selected from the group consisting of InGaZnO, SiGe, GaAs, IZO, ITO, SnO, TiO, and AlZnSnO.

43. The semiconductor device according to claim 3, wherein the first to sixth transistors are transistors comprising a material selected from the group consisting of InGaZnO, SiGe, GaAs, IZO, ITO, SnO, TiO, and AlZnSnO.

44. The semiconductor device according to claim 4, wherein the first to sixth transistors are transistors comprising a material selected from the group consisting of InGaZnO, SiGe, GaAs, IZO, ITO, SnO, TiO, and AlZnSnO.

45. The semiconductor device according to claim 5, wherein the first to sixth transistors are transistors comprising a material selected from the group consisting of InGaZnO, SiGe, GaAs, IZO, ITO, SnO, TiO, and AlZnSnO.

46. The semiconductor device according to claim 6, wherein the first to sixth transistors are transistors comprising a material selected from the group consisting of InGaZnO, SiGe, GaAs, IZO, ITO, SnO, TiO, and AlZnSnO.

47. The semiconductor device according to claim 7, wherein the first to sixth transistors are transistors comprising a material selected from the group consisting of InGaZnO, SiGe, GaAs, IZO, ITO, SnO, TiO, and AlZnSnO.

48. The semiconductor device according to claim 8, wherein the first to sixth transistors are transistors comprising a material selected from the group consisting of InGaZnO, SiGe, GaAs, IZO, ITO, SnO, TiO, and AlZnSnO.

49. An electronic appliance comprising the semiconductor device according to claim 1.

50. An electronic appliance comprising the semiconductor device according to claim 2.

51. An electronic appliance comprising the semiconductor device according to claim 3.

52. An electronic appliance comprising the semiconductor device according to claim 4.

53. An electronic appliance comprising the semiconductor device according to claim 5.

54. An electronic appliance comprising the semiconductor device according to claim 6.

55. An electronic appliance comprising the semiconductor device according to claim 7.

56. An electronic appliance comprising the semiconductor device according to claim 8.

* * * * *